(12) United States Patent
Baek

(10) Patent No.: US 11,678,485 B2
(45) Date of Patent: Jun. 13, 2023

(54) VERTICAL MEMORY DEVICES

(71) Applicant: SAMSUNG ELECTRONICS CO., LTD., Suwon-si (KR)

(72) Inventor: Seok-Cheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 8 days.

(21) Appl. No.: 16/747,192

(22) Filed: Jan. 20, 2020

(65) Prior Publication Data

US 2020/0303411 A1  Sep. 24, 2020

(30) Foreign Application Priority Data

Mar. 19, 2019  (KR) .................. 10-2019-0031397

(51) Int. Cl.

| | | |
|---|---|---|
| *H01L 29/788* | (2006.01) | |
| *G11C 16/04* | (2006.01) | |
| *H01L 27/11582* | (2017.01) | |
| *H01L 23/522* | (2006.01) | |
| *H01L 23/528* | (2006.01) | |
| *H01L 21/027* | (2006.01) | |
| *H01L 21/311* | (2006.01) | |
| *H01L 21/28* | (2006.01) | |
| *H01L 21/3105* | (2006.01) | |

(Continued)

(52) U.S. Cl.
CPC .... *H01L 27/11582* (2013.01); *H01L 23/5226* (2013.01); *H01L 23/5283* (2013.01); *H01L 21/0273* (2013.01); *H01L 21/02636* (2013.01); *H01L 21/31053* (2013.01); *H01L 21/31144* (2013.01); *H01L 29/40117* (2019.08); *H01L 29/66545* (2013.01)

(58) Field of Classification Search
CPC ......... H01L 27/11582; H01L 27/11575; H01L 27/11573

See application file for complete search history.

(56) References Cited

U.S. PATENT DOCUMENTS 8,325,527 B2  12/2012  Jin et al.
8,530,350 B2  9/2013  Freeman et al.
(Continued)

FOREIGN PATENT DOCUMENTS

KR  10-2017-0046892  5/2017

*Primary Examiner* — Anthony Ho
*Assistant Examiner* — David J Goodwin
(74) *Attorney, Agent, or Firm* — F. Chau & Associates, LLC

(57) ABSTRACT

A vertical memory device, including: a substrate including a cell array region and an extension region; gate electrodes stacked on each other with a plurality of levels, wherein each of the gate electrodes includes a pad, and wherein the pads disposed on the gate electrodes form at least one staircase structure on the extension region of the substrate; a channel extending in a first direction on the cell array region of the substrate through at least one of the gate electrodes; and dummy gate electrode groups disposed on the extension region of the substrate, wherein the dummy gate electrode groups includes dummy gate electrodes, wherein each of the dummy gate electrodes are spaced apart from a corresponding gate electrode among the gate electrodes stacked at a same level, wherein the dummy gate electrode groups are spaced apart from each other in a second direction.

20 Claims, 47 Drawing Sheets

(51) Int. Cl.
*H01L 21/02* (2006.01)
*H01L 29/66* (2006.01)

(56) References Cited

U.S. PATENT DOCUMENTS

| | | |
|---|---|---|
| 8,822,285 B2 * | 9/2014 | Hwang ............. H01L 27/11551 |
| | | 438/257 |
| 8,867,280 B2 | 10/2014 | Park et al. |
| 8,890,233 B2 | 11/2014 | Hung et al. |
| 9,224,747 B2 | 12/2015 | Mizutani et al. |
| 9,455,268 B2 | 9/2016 | Oh et al. |
| 9,478,546 B2 | 10/2016 | Yang |
| 2013/0161821 A1 * | 6/2013 | Hwang ............. H01L 27/11556 |
| | | 257/E21.585 |
| 2014/0162420 A1 * | 6/2014 | Oh .................... H01L 27/11582 |
| | | 438/270 |
| 2017/0033117 A1 * | 2/2017 | Lee ....................... H01L 23/528 |
| 2017/0200676 A1 * | 7/2017 | Jeong ................ H01L 27/11556 |

\* cited by examiner

FIG. 1
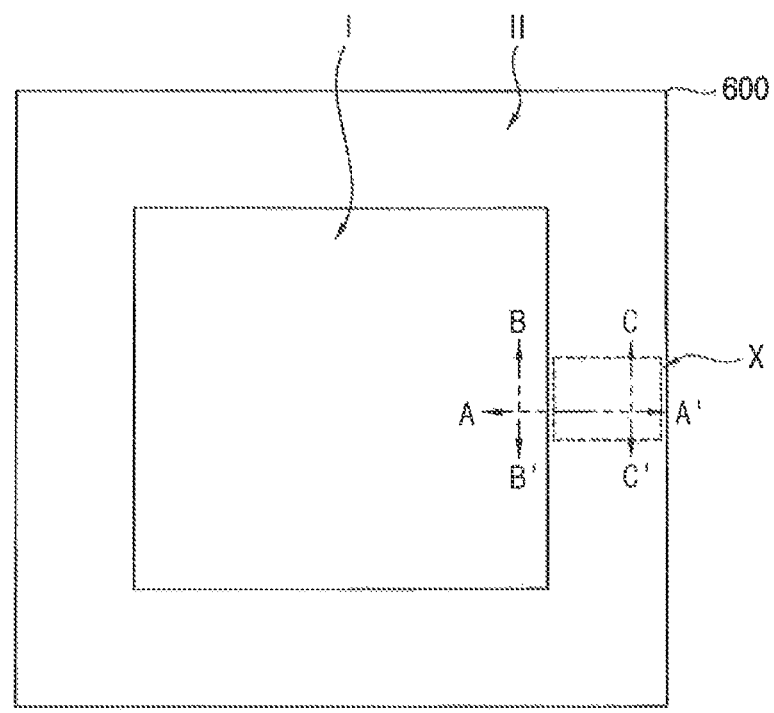
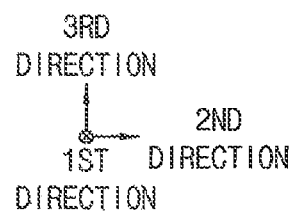

FIG. 18
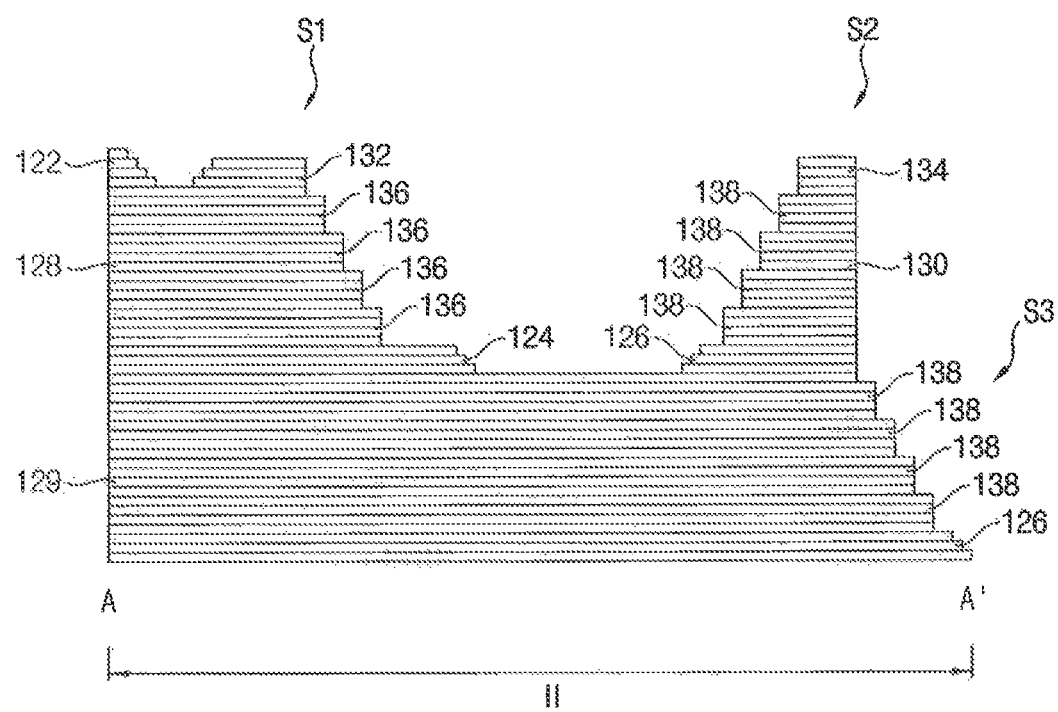
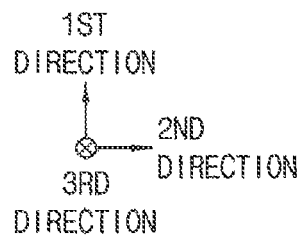

VERTICAL MEMORY DEVICES

CROSS-REFERENCE TO RELATED APPLICATION

This application claims priority under 35 U.S.C, § 119 to Korean Patent Application No. 10-2019-0031397, filed on Mar. 19, 2019 in the Korean Intellectual Property Office (KIPO), the disclosure of which is incorporated by reference herein in its entirety.

TECHNICAL FIELD

Exemplary embodiments of the present inventive concepts relate to vertical memory devices.

DISCUSSION OF THE RELATED ART

Typically, when a VNAND flash memory device is manufactured, alter sacrificial layers and insulation layers are repeatedly stacked in an alternating manner, an etching process may be performed using a photoresist pattern as an etching mask to form a mold having a staircase structure in an extension region in which contact plugs connected to upper wirings are formed, and a trimming process, in which the area of the photoresist pattern is reduced, may be repeatedly performed in the etching process. As the steps included in the staircase structure of the mold increases, the photoresist pattern may be thick, and the process time and cost may increase according to the repetition of the trimming process.

SUMMARY

According to an exemplary embodiment of the present inventive concept, a vertical memory device, including: a substrate including a cell array region and an extension region at least partially surrounding the cell array region; a plurality of gate electrodes stacked on each other with a plurality of levels, wherein the levels are disposed in a first direction substantially perpendicular to an upper surface of the substrate, wherein each of the gate electrodes extend in a second direction substantially parallel to the upper surface of the substrate on the cell array region and the extension region of the substrate, wherein each of the plurality of gate electrodes includes a pad disposed at an end portion thereof in the second direction, and wherein the pads disposed on the gate electrodes form at least one staircase structure on the extension region of the substrate; a channel extending in the first direction on the cell array region of the substrate through at least one of the gate electrodes; and dummy gate electrode groups disposed on the extension region of the substrate, wherein the dummy gate electrode groups include dummy gate electrodes, wherein each of the dummy gate electrodes are spaced apart from a corresponding gate electrode among the plurality of gate electrodes stacked at a same level, wherein the dummy gate electrode groups are spaced apart from each other in the second direction.

A vertical memory device, including: a substrate including a cell array region and an extension region at least partially surrounding the cell array region; a plurality of gate electrodes stacked on each other with a plurality of levels, wherein the levels are disposed in a first direction substantially perpendicular to an upper surface of the substrate, wherein each of the gate electrodes extend in a second direction substantially parallel to the upper surface of the substrate on the cell array region and the extension region of the substrate, wherein each of the plurality of gate electrodes includes a pad disposed at an end portion thereof in the second direction, and the pads disposed on the gate electrodes to form at least one staircase shape on the extension region of the substrate; a channel extending in the first direction on the cell array region of the substrate through at least one of the gate electrodes; and a plurality of dummy gate electrodes disposed on the extension region of the substrate, wherein the dummy gate electrodes are spaced apart from corresponding first gate electrodes of the plurality of gate electrodes, respectively, stacked at the same level, and wherein the dummy gate electrodes are stacked to form a staircase shape symmetrical with a staircase shape formed by the pads of the first gate electrodes corresponding to the dummy gate electrodes with respect to a line extending between both staircase shapes and in a third direction crossing the second direction.

A vertical memory device, including: a substrate including a first region and a second region at least partially surrounding the first region; a plurality of gate electrodes stacked on each other with a plurality of levels, wherein the levels are disposed in a first direction substantially perpendicular to an upper surface of the substrate, wherein each of the plurality of gate electrodes extend in a second direction substantially parallel to the upper surface of the substrate on the first region and the second region of the substrate, wherein each of the plurality of gate electrodes includes a pad disposed at an end portion thereof in the second direction, and the pads disposed on the plurality of gate electrodes to form at least one staircase shape on the second region of the substrate; a channel extending in the first direction on the first region of the substrate through at least one of the gate electrodes; a plurality of dummy gate electrode groups disposed on the second region of the substrate, wherein the dummy gate electrode groups include dummy gate electrodes, wherein each dummy gate electrode is spaced apart from a corresponding gate electrode, among the plurality of gate electrodes, stacked at the same level; and contact plugs contacting upper portions of the plurality of gate electrodes, respectively, wherein no contact plug contacts an upper portion of any of the dummy gate electrodes.

BRIEF DESCRIPTION OF THE DRAWINGS

The above and other features of the present inventive concept will become more apparent by describing in detail exemplary embodiments thereof, with reference to the accompanying drawings, in which:

FIGS. 1 to 34 are plan views, cross-sectional views, and perspective views illustrating a method of manufacturing a vertical memory device in accordance with an exemplary embodiment of the present inventive concept. Particularly, FIGS. 1 and 24 are the plan views, FIGS. 2, 4, 17-23 and 25-33 are the cross-sectional views, and FIGS. 3, 5-16 and 34 are the perspective views illustrating a method of manufacturing a vertical memory device in accordance with an exemplary embodiment of the present inventive concept. FIG. 24 is a plan view of a region X of FIG. 1, FIGS. 18-23 and 25 are cross-sectional views illustrating a vertical profile of staircase structures of the region X of FIG. 1, and FIGS. 3, 5-16 and 34 are perspective views of the region X of FIG. 1, FIGS. 4, 17-23, 25-28, 30 and 33 are cross-sectional views taken along a line A-A' of FIG. 1, FIGS. 29 and 31-32 are cross-sectional views taken along a line B-B' of FIG. 1, and FIG. 2 is a cross-sectional view taken along a line C-C' of FIG. 1.

DETAILED DESCRIPTION OF THE EMBODIMENTS

Hereinafter, exemplary embodiments of the present inventive concept will be explained in detail with reference to the accompanying drawings.

Hereinafter, a direction substantially perpendicular to an upper surface of a substrate may be a first direction, and two directions substantially parallel to the upper surface of the substrate and crossing each other may be second and third directions, respectively. For example, the second and third directions may be substantially perpendicular to each other.

Referring to FIG. 1, a substrate 600 may include a first region I and a second region II at least partially surrounding the first region I.

For example, the substrate 600 may include silicon, germanium, silicon-germanium or a III-V compound such as GaP, GaAs, GaSb, etc. In an exemplary embodiment of the present inventive concept, the substrate 600 may be a silicon-on-insulator (SOI) substrate or a germanium-on-insulator (GOI) substrate. In an exemplary embodiment of the present inventive concept, the first region I of the substrate 600 may be a cell array region in which memory cells may be formed, and the second region II of the substrate 600 may be a staircase region in which contact plugs connected to the memory cells may be formed. The second region II may be extended from or connected to the first region I in each of the second and third directions, and thus may be referred to as an extension region (or connection region).

In an exemplary embodiment of the present inventive concept, the vertical memory device may have a cell over periphery (COP) structure. For example, circuit patterns for driving memory cells may not be formed on the periphery of the memory cells, but may be formed under the memory cells. Thus, a circuit pattern region and a cell array region may be vertically stacked on the substrate 600, and the circuit patterns may be also referred to as lower circuit patterns. However, the present inventive concept may not be limited thereto, and even if the vertical memory device has a COP structure, the substrate 600 may further include a peripheral circuit region at least partially surrounding the second region II in which at least some of the circuit patterns may be formed.

The region X shown in FIG. 1 is a portion of the second region II of the substrate 600. In an exemplary embodiment of the present inventive concept, a plurality of region X's may be disposed in the third direction.

Figure 2:
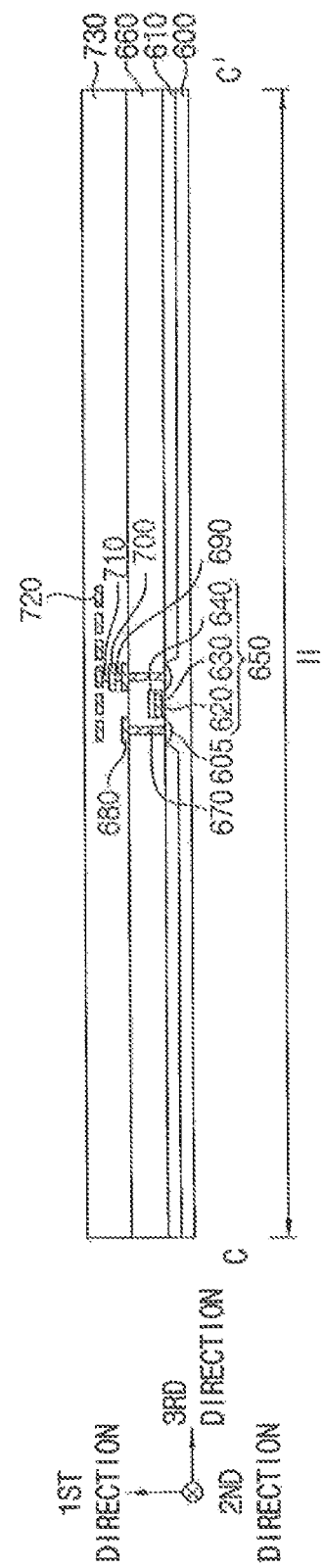

Referring to FIG. 2, circuit patterns may be formed on the substrate 600, and first and second lower insulating interlayers 660 and 730 may be formed on the substrate 600 to cover the circuit patterns.

The substrate 600 may include a field region on which an isolation pattern 610 may be formed, and an active region on which no isolation pattern may be formed. The isolation pattern 610 may be formed by, e.g., a shallow trench isolation (STI) process, and may include an oxide, e.g., silicon oxide.

The circuit patterns may include transistors, lower contact plugs, lower wirings, lower vias, etc. For example, a transistor including a lower gate structure 650 on the substrate 600 and a first impurity region 605 at an upper portion of the substrate 600 and adjacent to the active region, which may be formed in the substrate, of the transistor. The first impurity region 605 may be formed adjacent to the lower gate structure 650. The lower gate structure 650 may include a lower gate insulation pattern 620, a lower gate electrode 630, and a lower gate mask 640 sequentially stacked.

The first lower insulating interlayer 660 may be formed on the substrate 600 and may cover the transistor, and a lower contact plug 670 may extend through the first lower insulating interlayer 660 to contact the first impurity region 605 or the lower gate electrode 630. A first lower wiring 680 may be formed on the first lower insulating interlayer 660 to contact an upper surface of the lower contact plug 670. A first lower via 690, a second lower wiring 700, a second lower via 710 and a third lower wiring 720 may be sequentially stacked on the first lower wiring 680. In an exemplary embodiment of the present inventive concept, a plurality of third lower wirings 720 may be arranged in the third direction. The second lower insulating interlayer 730 may be formed on the first lower insulating interlayer 660 to cover the first to third lower wirings 680, 700 and 720 and the first and second lower vias 690 and 710.

Hereinafter, the circuit patterns on the substrate 600 will not be shown in the figures for clarity.

Figure 3:
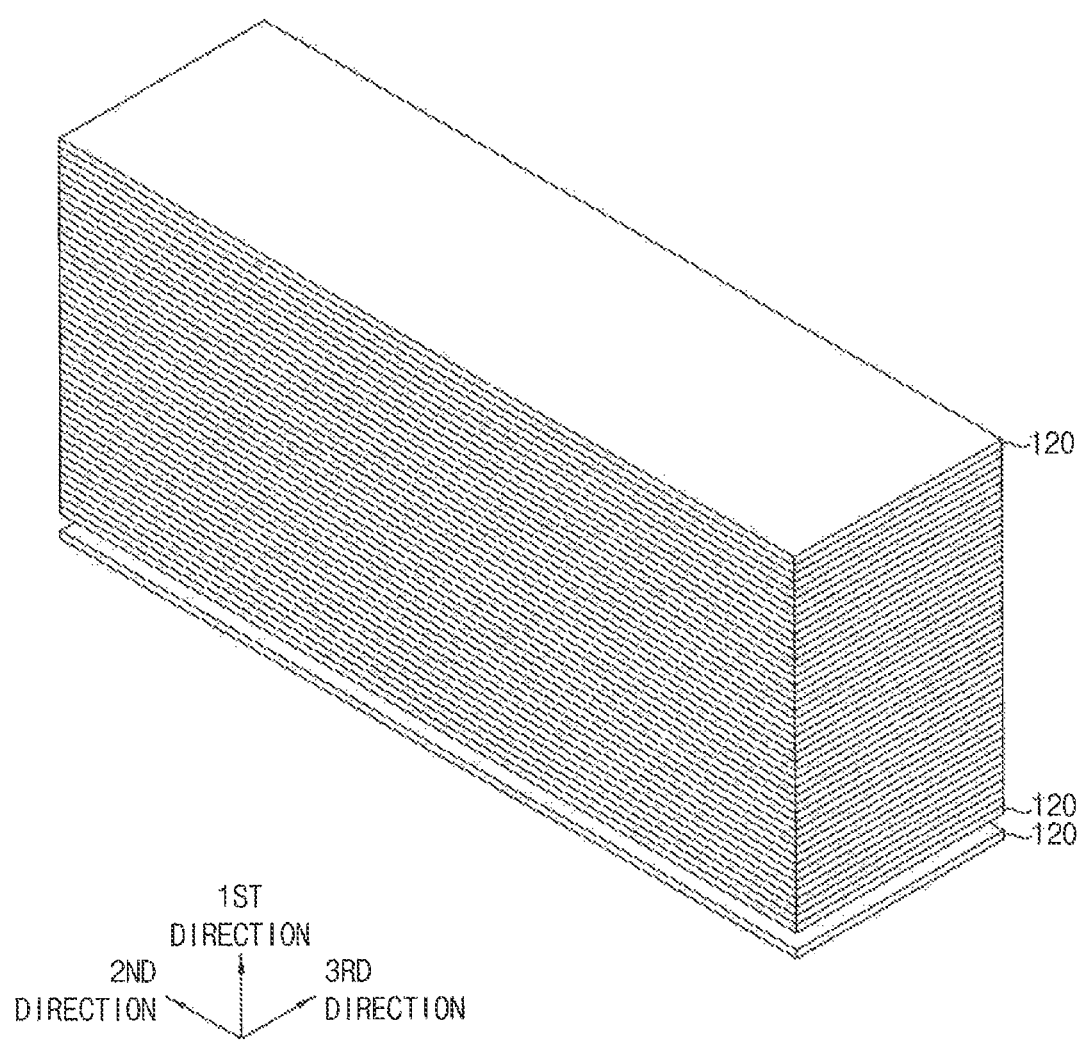
Figure 4:
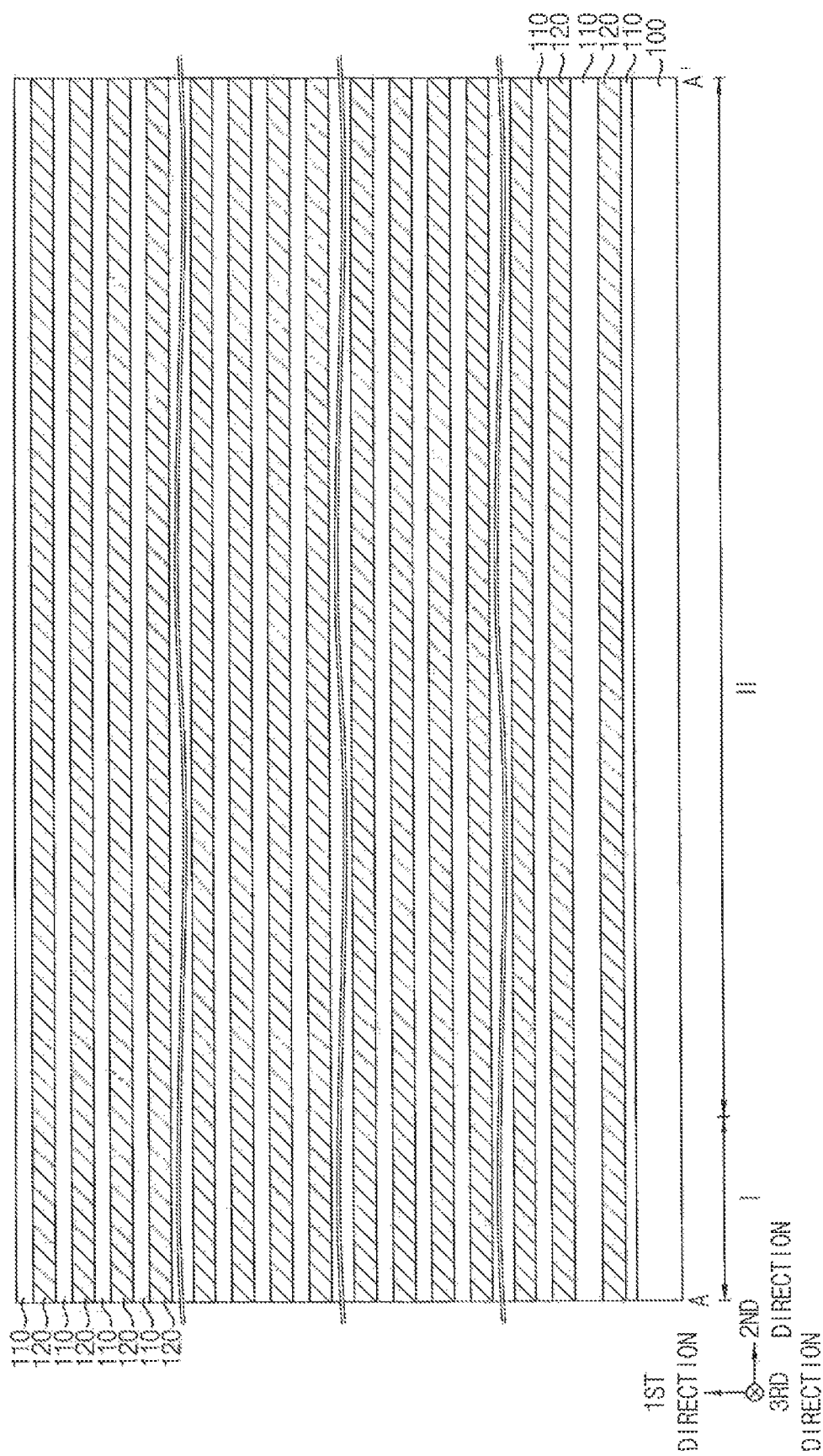

Referring to FIGS. 3 and 4, a base pattern 100 may be formed on the second lower insulating interlayer 730, and an insulation layer 110 and a sacrificial layer 120 may be alternately and repeatedly formed on the base pattern 100.

For example, the base pattern 100 may include a semiconductor material, e.g., silicon. For example, the insulation layer 110 may include an oxide, e.g., silicon oxide, and the sacrificial layer 120 may include a material having an etching selectivity with respect to the insulation layer 110, e.g., a nitride such as silicon nitride.

For the purpose of having clarity in the drawings, no insulation layers 110 will be shown, but only the sacrificial layers 120 will be shown in all perspective views including FIG. 3 and hereinafter. Etching processes on the sacrificial layers 120 may be performed not only the sacrificial layers 120 but also the insulation layers 110 each of which may form a pair with one of the sacrificial layers 120 between the pair of insulation layers 110, and for the convenience of explanation, when the etching processes are described with reference to the perspective views, the insulation layers 110 might not be explained.

Figure 5:
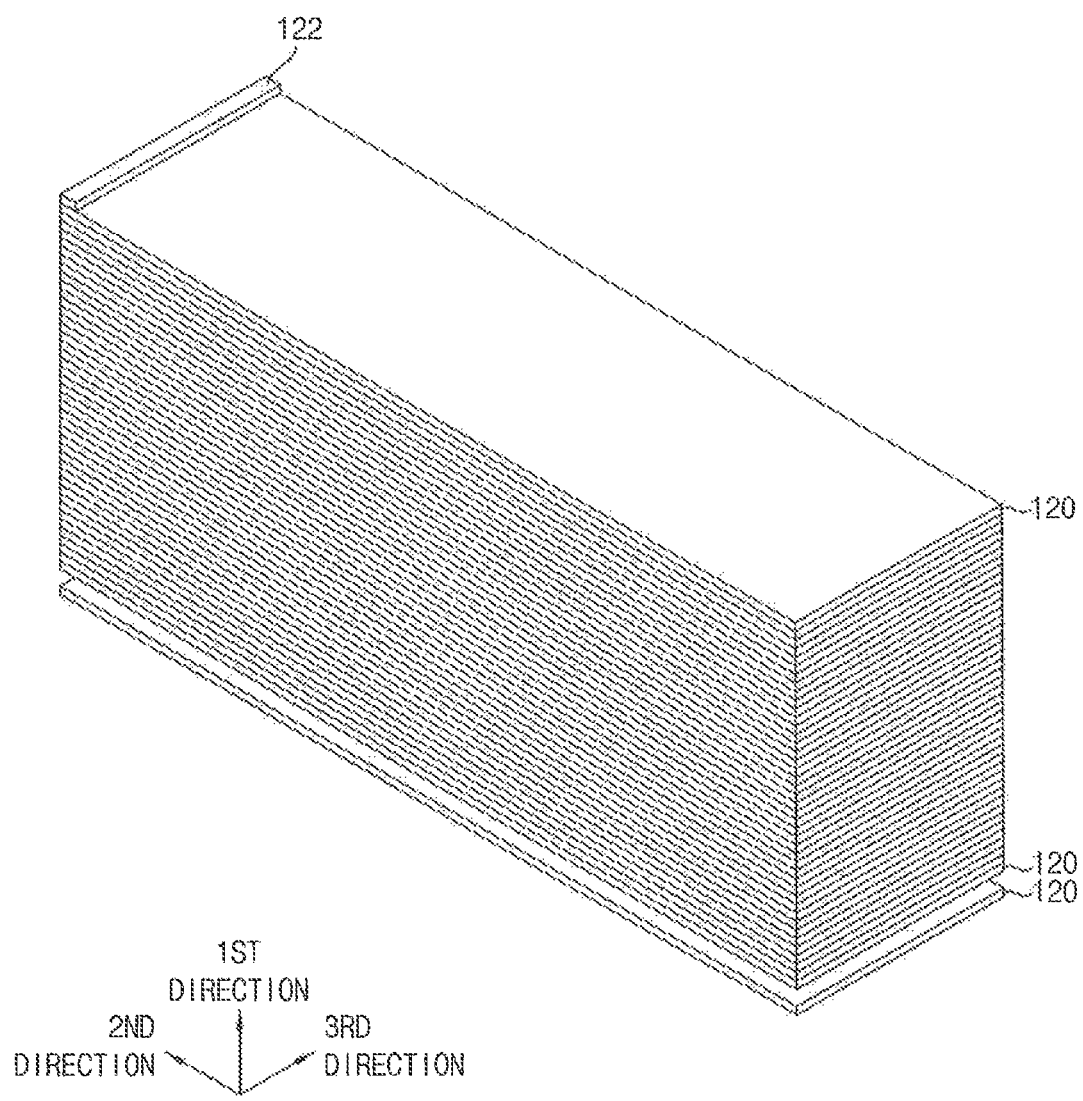

Referring to FIG. 5, a first photoresist pattern may be formed on an uppermost one of the sacrificial layers 120 to cover the first region I and an edge portion of the second region II adjacent thereto, and the uppermost one of the sacrificial layers 120 may be etched using the first photoresist pattern as an etching mask to form a first sacrificial pattern 122 having a frame shape (or, e.g., an annular shape) in a plan view surrounding the uppermost one of the sacrificial layers 120 on the first region I of the substrate 600.

However, FIG. 5 shows only a portion of the second region II of the substrate 600, i.e., the region X, and thus only a portion of the first sacrificial pattern 122 having a frame shape is shown. In other words, a portion of the first sacrificial pattern 122 having a bar shape extending in the third direction is shown. Hereinafter, instead of entire shapes of various sacrificial patterns on the second region II of the substrate 600 that may be formed by etching the sacrificial layers 120, only shapes of various sacrificial patterns in the region X will be described. During the formation of a mold, the portion of the sacrificial layer 120 on the first region I of the substrate 600 may be covered such that it might not to be etched, and thus may not to be described.

After forming the first sacrificial pattern 122, the first photoresist pattern may be removed by, e.g., an ashing process and/or a stripping process.

Figure 6:
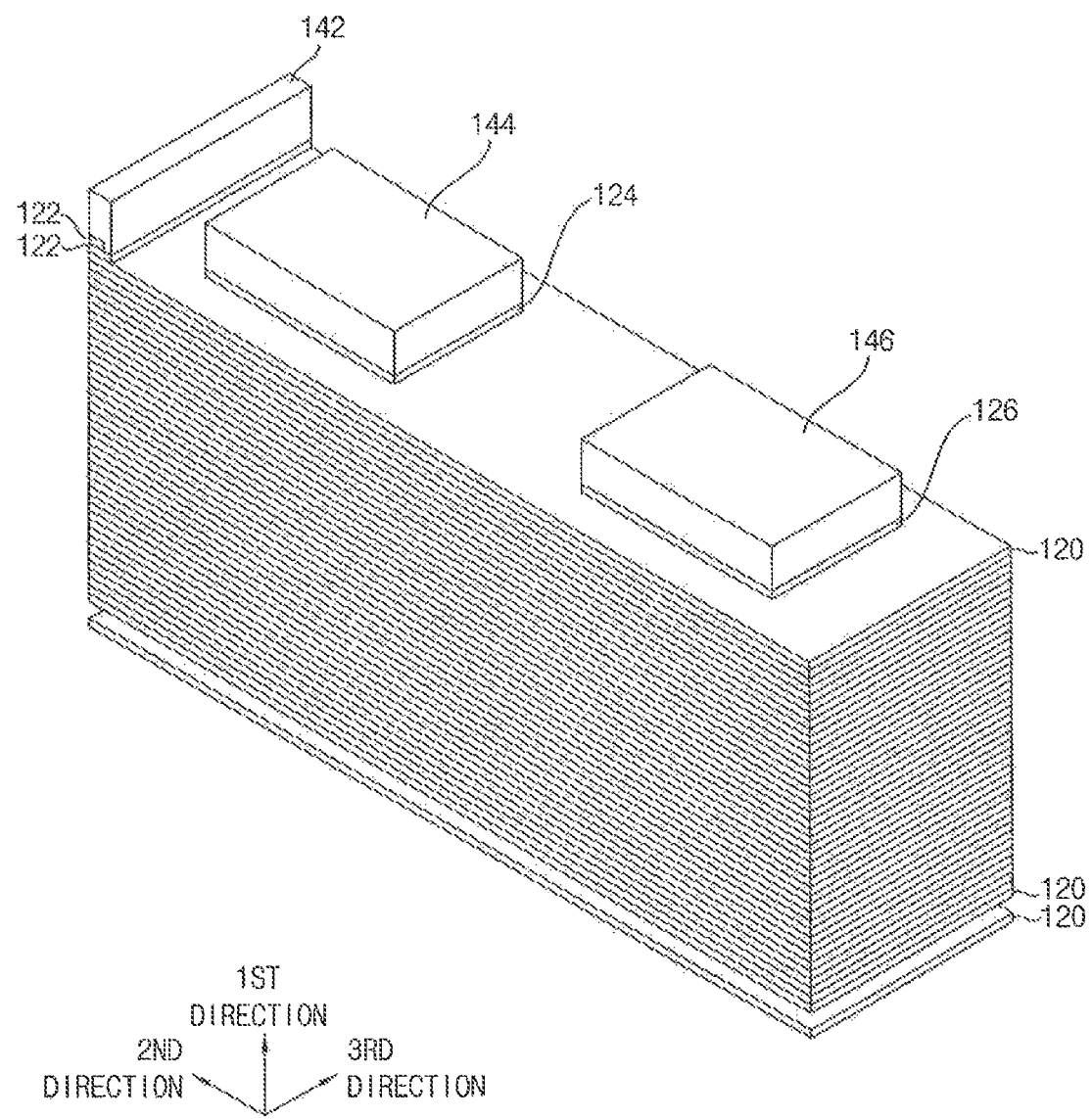

Referring to FIG. 6, a second photoresist pattern 142 may cover the first sacrificial pattern 122 and may have a length in the second direction greater than that of the first sacrificial pattern 122. A third photoresist pattern 144 may cover a portion of the sacrificial layer 120 in the region X and may have a rectangular shape in a plan view, which may be spaced apart from the second photoresist pattern 142 in the second direction. A fourth photoresist pattern 146 may cover a portion of the sacrificial layer 120 in the region X and may have a rectangular shape in a plan view, which may be spaced apart from the third photoresist pattern 144 in the second direction. In addition, the second photoresist pattern 142, the third photoresist pattern 144, and the fourth photoresist pattern 146 may be formed on one of the sacrificial layers 120 at a second level from the uppermost level (hereinafter, an n-th level from the uppermost level will be simply referred to as an n-th level), and the one of the sacrificial layers 120 at the second level may be etched using the second to fourth photoresist patterns 142, 144 and 146 as an etching mask.

Thus, the first sacrificial pattern 122 may be fumed at the second level to have a length in the second direction greater than that of the first sacrificial pattern 122 at the first level. In addition, a second sacrificial pattern. 124, which may have a rectangular shape in a plan view, may be formed at the second level to be spaced apart from the first sacrificial pattern 122 in the second direction, and a third sacrificial pattern 126, which may have a rectangular shape in a plan view, may be formed at the second level to be spaced apart from the second sacrificial pattern 124 in the second direction. In an exemplary embodiment of the present inventive concept, a plurality of second sacrificial patterns 124 may be formed to be spaced apart from each other in the third direction, and a plurality of third sacrificial patterns 126 may be formed to be spaced apart from each other in the third direction. FIG. 6 shows one of the plurality of second sacrificial patterns 124 and one of the plurality of third sacrificial patterns 126.

Figure 7:
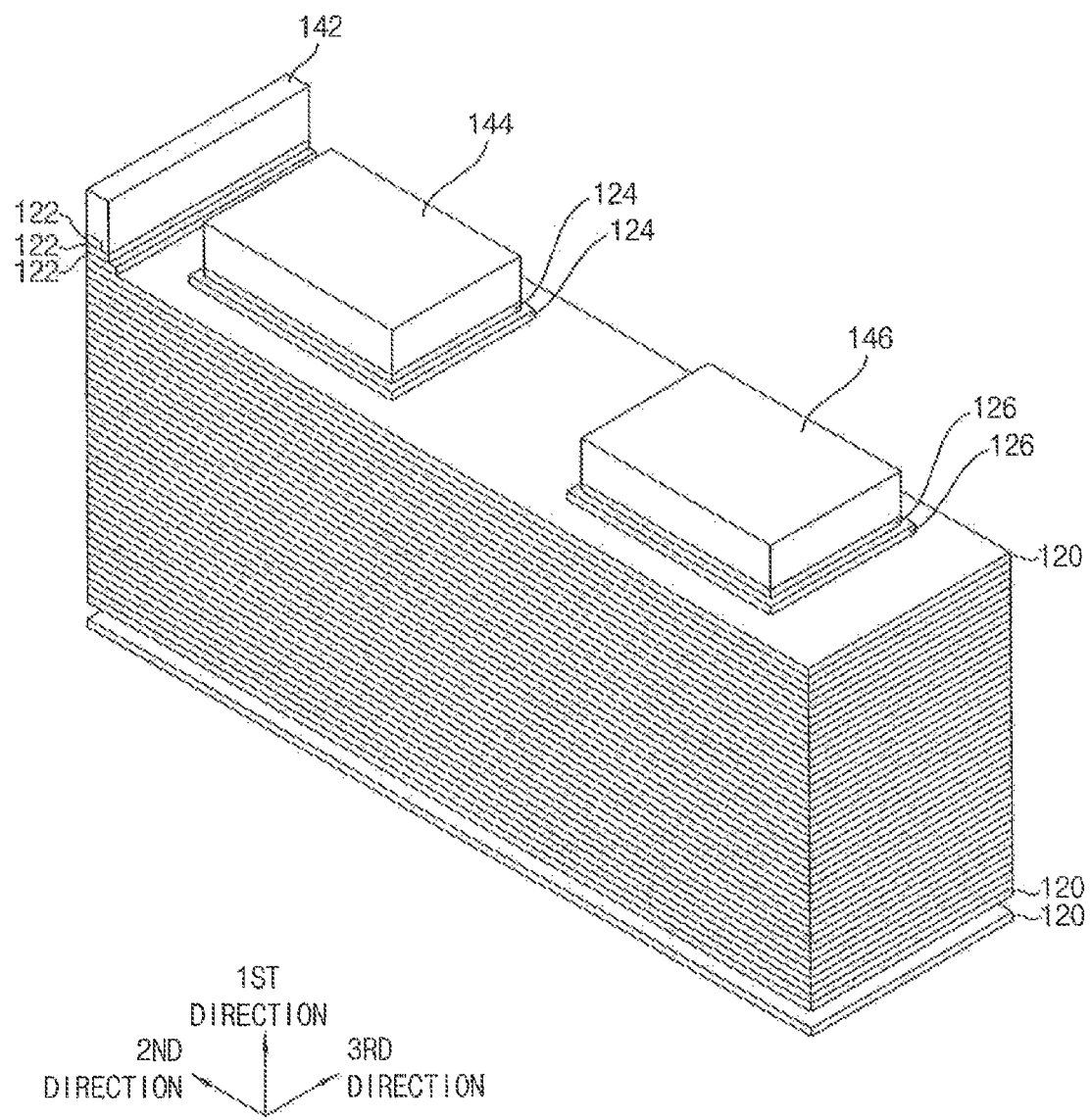

Referring to FIG. 7, a first trimming process in which areas of the second to fourth photoresist patterns 142, 144 and 146 are reduced may be performed, and the first to third sacrificial patterns 122, 124 and 126 and one of the sacrificial layers 120 at a third level may be etched using the reduced second to tour :h photoresist patterns 142, 144 and 146 as an etching mask.

Thus, a length in the second direction of the first sacrificial pattern 122 at the second level may be reduced, and the first sacrificial pattern 122 may be formed at the third level. For example, the length in the second direction of the first sacrificial pattern 122 at the second level may be less than the length of the first sacrificial pattern 122 at the third level. Areas of the second and third sacrificial patterns 124 and 126 at the second level may be reduced, and the second and third sacrificial patterns 124 and 126 may be formed at the third level. For example, the areas of the second and third sacrificial patterns 124 and 126 at the second level may be less than the areas of the second and third sacrificial pattern 124 and 126 at the third level.

In an exemplary embodiment of the present inventive concept, the first trimming process may be performed by an exposure process on the second to fourth photoresist patterns 142, 144 and 146 and a developing process on unexposed portions of the second to fourth photoresist patterns 142, 144 and 146.

Figure 8:
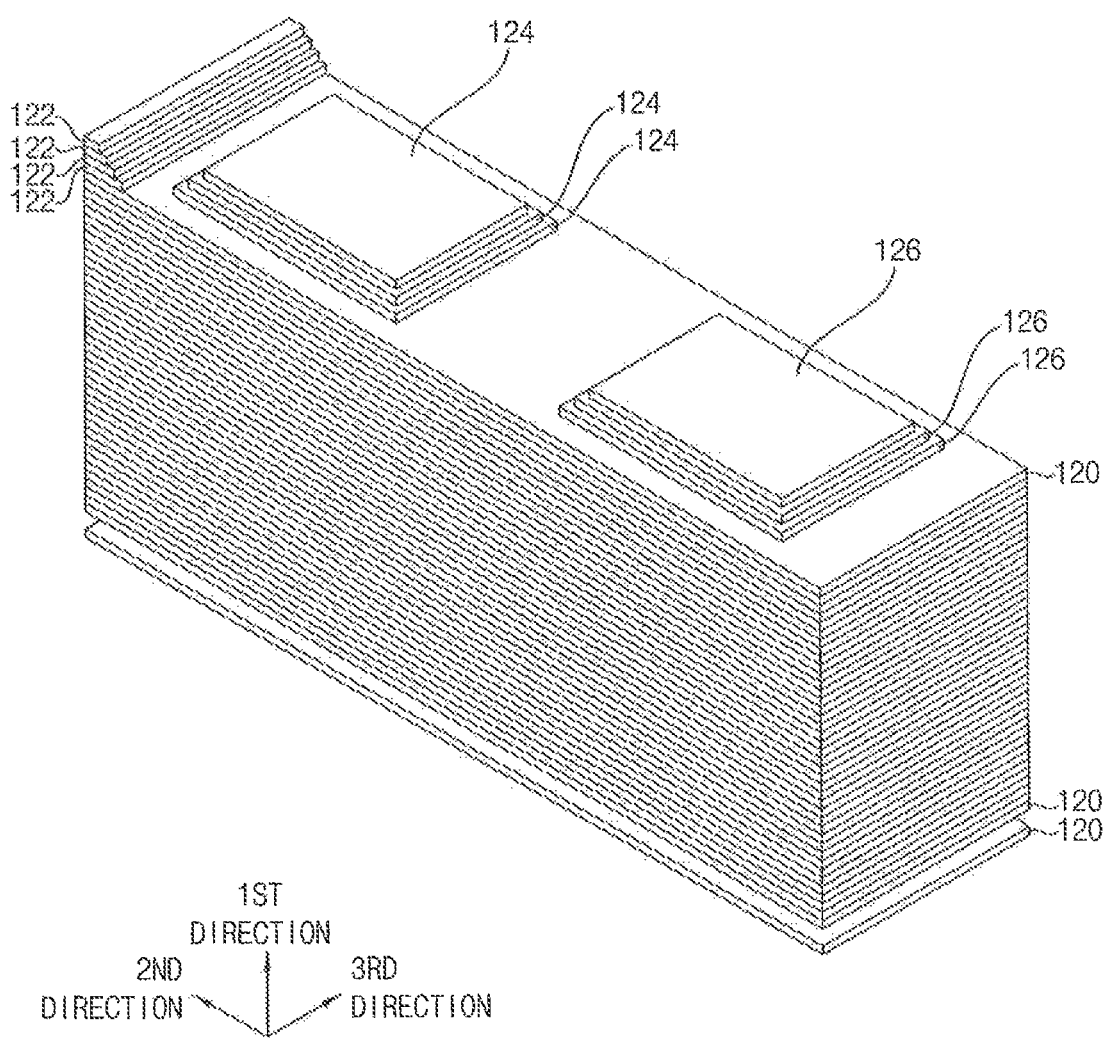

Referring to FIG. 8, a second trimming process may be performed.

For example, after reducing the areas of the second to fourth photoresist patterns 142, 144 and 146, the first to third sacrificial patterns 12.2, 124 and 12.6 and one of the sacrificial layers 120 at a fourth level may be etched using the reduced second to fourth photoresist patterns 142, 144 and 146 as an etching mask.

Thus, lengths in the second direction of the first sacrificial patterns 122 at the second and third levels may be reduced, and the first sacrificial pattern 122 may be formed at the fourth level. For example, the length in the second direction of the first sacrificial pattern 122 at the third level may be less than the length of the first sacrificial pattern 122 at the fourth level. Additionally, areas of the second and third sacrificial patterns 124 and 126 at the second and third levels may be reduced, and the second and third sacrificial patterns 124 and 126 may be formed at the fourth level. The second to fourth photoresist patterns 142, 144 and 146 may be removed. For example, the areas of the second and third sacrificial patterns 124 and 126 at the third level may be less than the areas of the second and third sacrificial pattern 124 and 126 at the fourth level.

Accordingly, the first sacrificial patterns 122 may be stacked at four levels, respectively, to form a staircase shape on one of the sacrificial layers 12.0 at a fifth level. The second sacrificial patterns 124 may be stacked at three levels, respectively, to form a staircase shape to be spaced apart from the first sacrificial patterns 122 on the one of the sacrificial layers 120 at the fifth level. The third sacrificial patterns 126 may be stacked at three levels, respectively, to form a staircase shape to be spaced apart from the second sacrificial patterns 124 on the one of the sacrificial layers 120 at the fifth level. However, the present inventive concept may not be limited thereto, and each of the first to third sacrificial patterns 122, 124 and 126 may be stacked with more or less than the above number of levels.

For example, up to now, the etching process has been performed three times using the second to fourth photoresist patterns 142, 144 and 146 as an etching mask (and thus, the trimming process has been performed twice) to form the first to third sacrificial patterns 122, 124 and 126 at four, three and three levels, respectively, however, the present inventive concept might not be limited thereto, and the etching process and the trimming process may be performed more or less times, respectively, than the above number of times.

Figure 9:
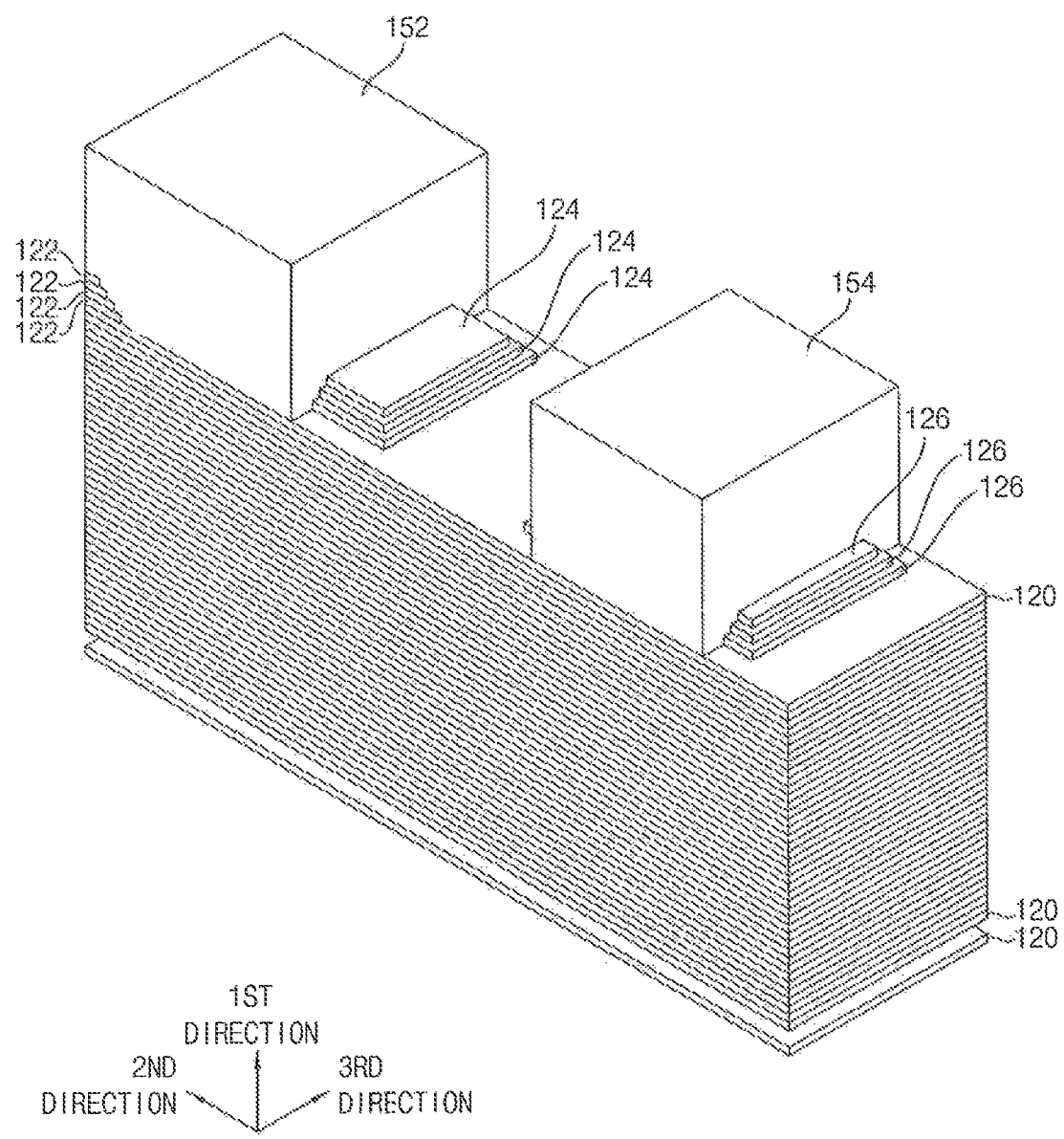

Referring to FIG. 9, a fifth photoresist pattern 152 covering the first sacrificial patterns 122 and portions of the second sacrificial patterns 124 adjacent thereto, and a sixth photoresist pattern 154 covering portions of the third sacrificial patterns 126 may be formed on the sacrificial layer 120 at the fifth level.

In an exemplary embodiment of the present inventive concept, in a plan view, each of the fifth and six photoresist patterns 152 and 154 may have a bar shape or a rectangular shape extending in the third direction. For example, the sixth photoresist pattern 154 may cover a central portion of each of the third sacrificial patterns 126 in the second direction, and may expose end portions or edge portions of each of the third sacrificial patterns 126 extending in the third direction. For example, the sixth photoresist pattern 154 may have a length in the second direction that is less than the lengths of the third sacrificial patterns 126.

Figure 10:
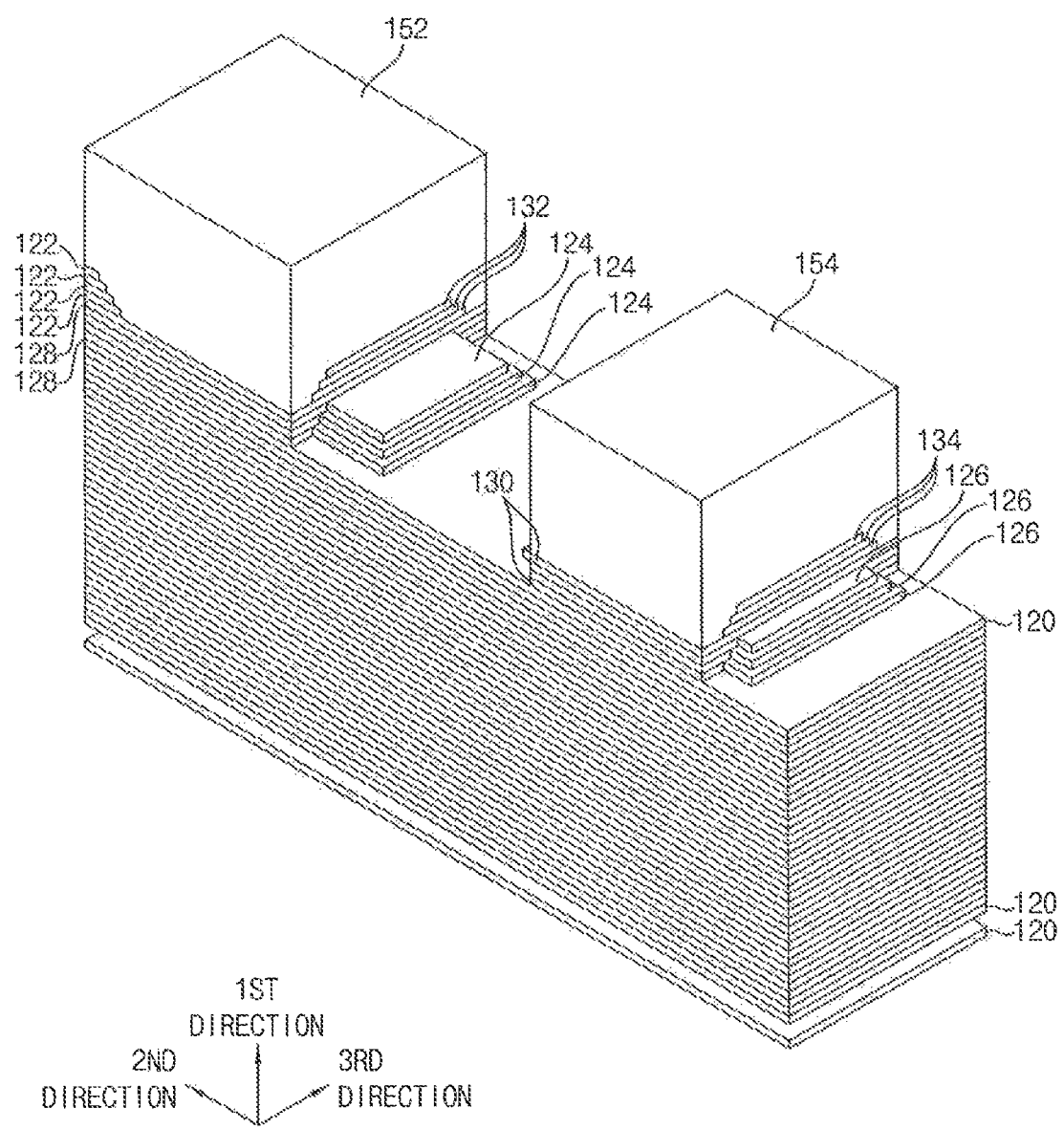

Referring to FIG. 10, the second and third sacrificial patterns 124 and 126 and the sacrificial layers 120 from fifth to eighth levels, respectively, may be etched using the fifth and sixth photoresist patterns 152 and 154 as an etching mask.

Thus, fourth sacrificial patterns 128 having a length in the second direction greater than those of the first sacrificial patterns 122 may be formed from the fifth to eighth levels, respectively, and fifth sacrificial patterns 130 having a length in the second direction less than those of third sacrificial patterns 126 may be formed from the fifth to eighth levels, respectively. Portions of the second sacrificial patterns 124 not covered by the fifth photoresist pattern 152 may be moved, through an etching process, from the second to fourth levels to the sixth to eighth levels, respectively, and portions of the third sacrificial patterns 126 not covered by the sixth photoresist pattern 154 may be moved, through an etching process from the second to fourth levels to the sixth to eighth levels, respectively. For example, portions of the second sacrificial patterns 124 exposed by the fifth photoresist pattern 152 may be etched and sacrificial layers 120 at levels sixth to eighth may be etched to form the second sacrificial patterns 124 at levels sixth to eighth, and portions of the third sacrificial patterns 126 exposed by the sixth photoresist pattern 154 may be etched and sacrificial layers 120 at levels sixth to eighth may be etched to from the third sacrificial patterns 126 at levels sixth to eighth. Portions of the second sacrificial patterns 124 (e.g., at the second to forth levels) covered by the fifth photoresist pattern 152 that remain may be transformed into sixth sacrificial patterns 132, respectively, on one of the fourth sacrificial patterns 128 at the fifth level, and portions of the third sacrificial patterns 126 (e.g., at the second to forth levels) covered by the sixth photoresist pattern 154 that remain may be transformed into seventh sacrificial patterns 134, respectively, on one of the fifth sacrificial patterns 130 at the fifth level.

Up to now, the sacrificial layers 120 at four levels (e.g., four layers of sacrificial layers 120), respectively, have been etched by an etching process using the fifth and sixth photoresist patterns 152 and 154 as an etching mask, however, the present inventive concept is not be limited thereto, and the sacrificial layers 120 at levels of more or less than the above number may be etched. In an exemplary embodiment of the present inventive concept, the sacrificial layers 120 have been etched at levels of more than the number of the levels of each of the second and third sacrificial patterns 124 and 126 are formed. For example, each of the second and third sacrificial patterns 124 and 126 is formed at three levels, e.g., from the second to fourth levels, and thus the sacrificial layers 120 at four levels, e.g., from the fifth to eighth levels, may be etched by the etching process.

Figure 11:
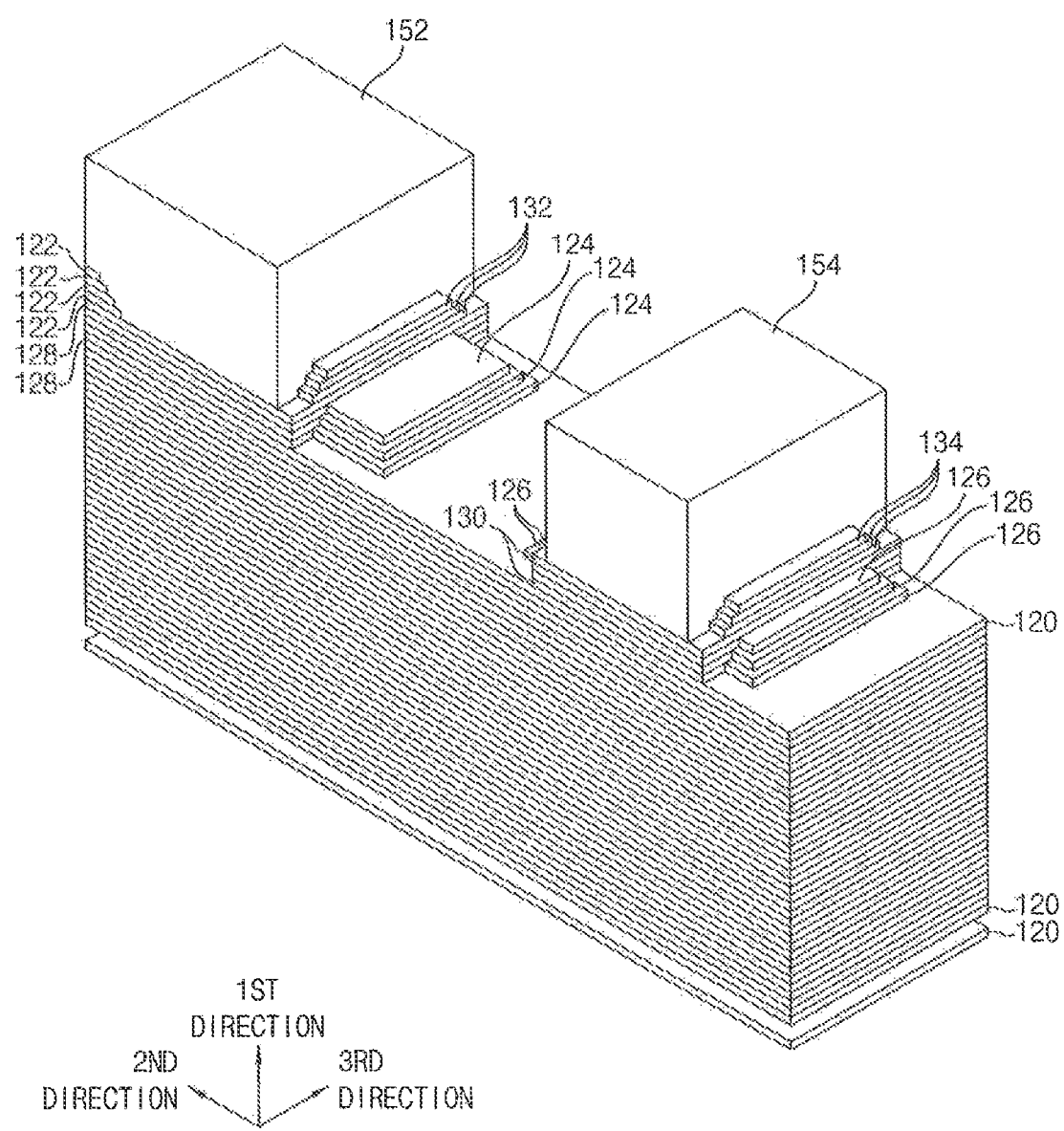

Referring to FIG. 11, a third trimming process in which areas of the fifth and sixth photoresist patterns 152 and 154 are reduced may be performed so that portions of the sixth and seventh sacrificial patterns 132 and 134 may be exposed.

In an exemplary embodiment of the present inventive concept, the fifth photoresist pattern 152 may expose an end portion of the sixth sacrificial pattern 132 distal from the first sacrificial patterns 122 in the second direction, and the sixth photoresist pattern 154 may expose opposite end portions of the seventh sacrificial pattern 134 in the second direction.

Figure 12:
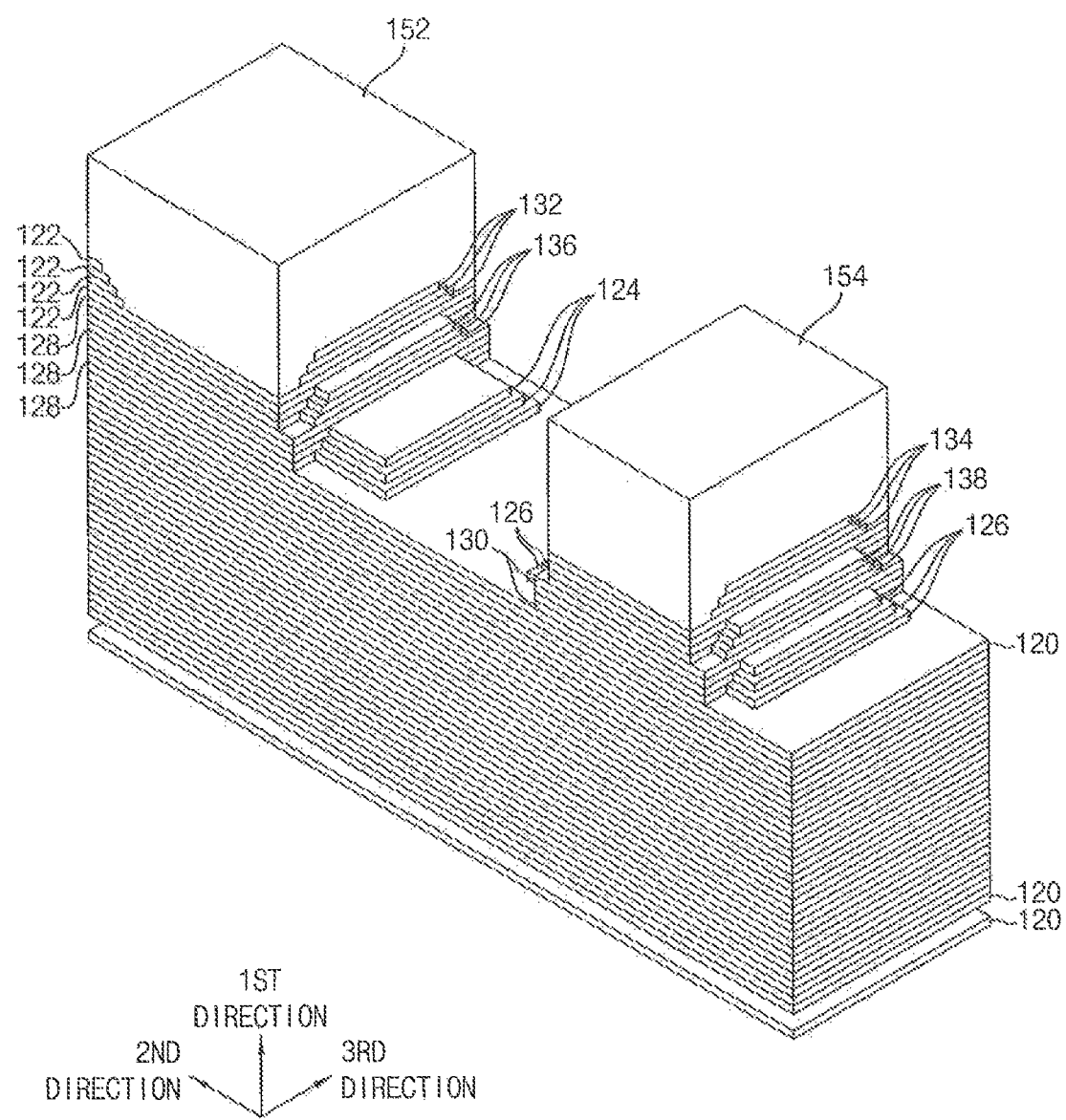

Referring to FIG. 12, the exposed sixth and seventh sacrificial patterns 132 and 134, the second to fifth sacrificial patterns 124, 126, 128 and 130, and the sacrificial layers 120 from ninth to twelfth levels, respectively, may be etched using the fifth and sixth photoresist patterns 152 and 154 as an etching mask.

Thus, the fourth sacrificial patterns 128 from the fifth to eighth levels, respectively, may be reduced to have a length smaller than prior to the etching process, and fourth sacrificial patterns 128 may be formed from the ninth to twelfth levels, respectively, to have a length greater than that of the fourth sacrificial patterns 128 from the fifth to eighth levels. The exposed portions of the sixth sacrificial patterns 132 may be moved, through the etching process, from the second to fourth levels to the sixth to eighth levels, respectively, which may be referred to as eighth sacrificial patterns 136, respectively, hereinafter. For example, the exposed portions of the sixth sacrificial patterns 132 exposed by the fifth photoresist pattern 152 may be etched and the second sacrificial patterns 124 at levels sixth to eighth may be etched to form the eighth sacrificial patterns 136 at levels sixth to eighth. Portions of the second sacrificial patterns 124 not covered by the fifth photoresist pattern 152 may be moved from the sixth to eighth levels to the tenth to twelfth levels, respectively through the etching process. For example, portions of the second sacrificial patterns 124 exposed by the fifth photoresist pattern 152 may be etched and sacrificial layers 120 at levels tenth to twelfth may be etched to form the second sacrificial patterns 124 at levels tenth to twelfth.

Likewise, the fifth sacrificial patterns 130 from the fifth to eighth levels, respectively, may be reduced to have a length smaller than prior to the etching process, and the fifth sacrificial patterns 130 may be formed from the ninth to twelfth levels, respectively, to have a length greater than that of the fifth sacrificial patterns 130 from the fifth to eighth levels. The exposed portions of the seventh sacrificial patterns 134 may be moved, through the etching process, from the second to fourth levels to the sixth to eighth levels, respectively, which may be referred to as ninth sacrificial patterns 138, respectively, hereinafter. For example, the exposed portions of the seventh sacrificial patterns 134 exposed by the sixth photoresist pattern 154 may be etched and the third sacrificial patterns 126 at levels sixth to eighth may be etched to form the ninth sacrificial patterns 138 at levels sixth to eighth. Portions of the third sacrificial patterns 126 not covered by the sixth photoresist pattern 154 may be moved from the sixth to eighth levels to the tenth to twelfth levels, respectively through the etching process. For example, portions of the third sacrificial patterns 126 exposed by the sixth photoresist pattern 154 may be etched and sacrificial layers 120 at levels tenth to twelfth may be etched to form the third sacrificial patterns 126 at levels tenth to twelfth.

Figure 13:
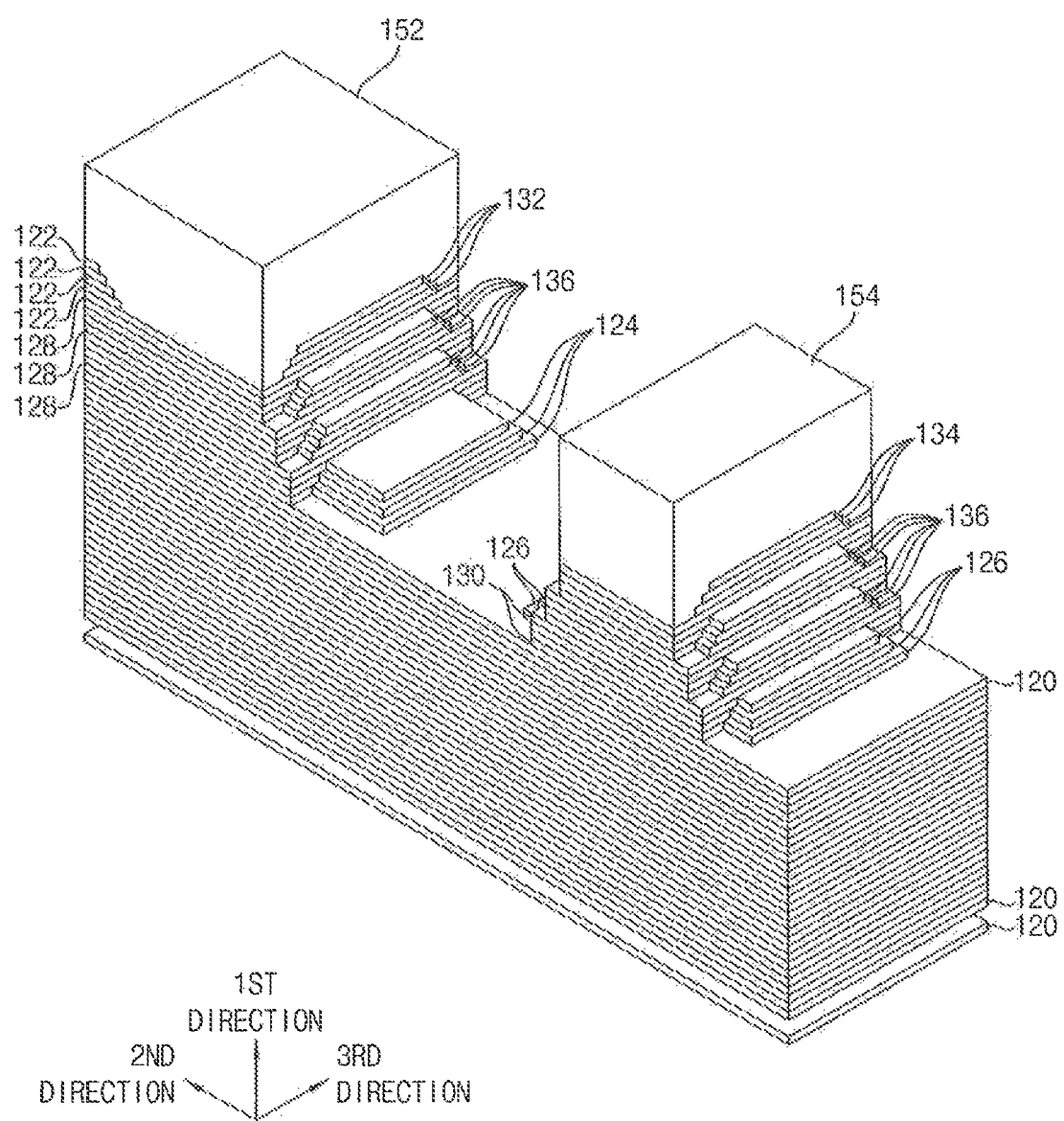

Referring to FIG 13, processes substantially the same as or similar to those illustrated with reference to FIGS. 11 and 12 may be repeatedly performed.

For example, a fourth trimming process in which areas of the fifth and sixth photoresist patterns 152 and 154 are reduced may be performed so that portions of the sixth and seventh sacrificial patterns 132 and 134 may be exposed, and the exposed sixth and seventh sacrificial patterns 132 and 134, the eighth and ninth sacrificial patterns 136 and 138, the second to fifth sacrificial patterns 124, 12.6, 128 and 130, and the sacrificial layers 120 from thirteenth to sixteenth levels, respectively, may be etched using the fifth and sixth photoresist patterns 152 and 154 as an etching mask.

Thus, the fourth sacrificial patterns 128 from the fifth to eighth levels, respectively, and from the ninth to twelfth levels, respectively, may be reduced to have a length smaller than prior to this etching process (e.g., smaller than that of the fourth sacrificial patterns 128 in FIG. 12), and fourth sacrificial patterns 128 may be formed from the thirteenth to sixteenth levels, respectively, to have a length greater than that of the fourth sacrificial patterns 128 from the fifth to twelfth levels. The exposed portions of the sixth sacrificial patterns 132 may be moved, through the etching process, from the second to fourth levels to the sixth to eighth levels, respectively, to form the eighth sacrificial patterns 136, and the eighth sacrificial patterns 136 from the sixth to eighth levels may be moved, through the etching process, to the tenth to twelfth levels, respectively. Portions of the second sacrificial patterns 124 not covered by the fifth photoresist pattern 152 may be moved from the tenth to twelfth levels to fourteenth to sixteenth levels, respectively, through the etching process.

Likewise, the fifth sacrificial patterns 130 from the fifth to eighth levels and from the ninth to twelfth levels, respectively, may be reduced to have a length smaller than prior to this etching process, and the fifth sacrificial patterns 130 may be further formed from the thirteenth to sixteenth levels, respectively, to have a length greater than that of the fifth sacrificial patterns 130 from the fifth to twelfth levels. The exposed portions of the seventh sacrificial patterns 134 may be moved, through this etching process, from the second to fourth levels to the sixth to eighth levels, respectively, to form the ninth sacrificial patterns 138, and the ninth sacrificial patterns 138 from the sixth to eighth levels may be moved, through this etching process, to the tenth to twelfth levels, respectively. Portions of the third sacrificial patterns 126 not covered by the sixth photoresist pattern 154 may be moved from the tenth to twelfth levels to fourteenth to sixteenth, respectively, through this etching process.

Figure 14:
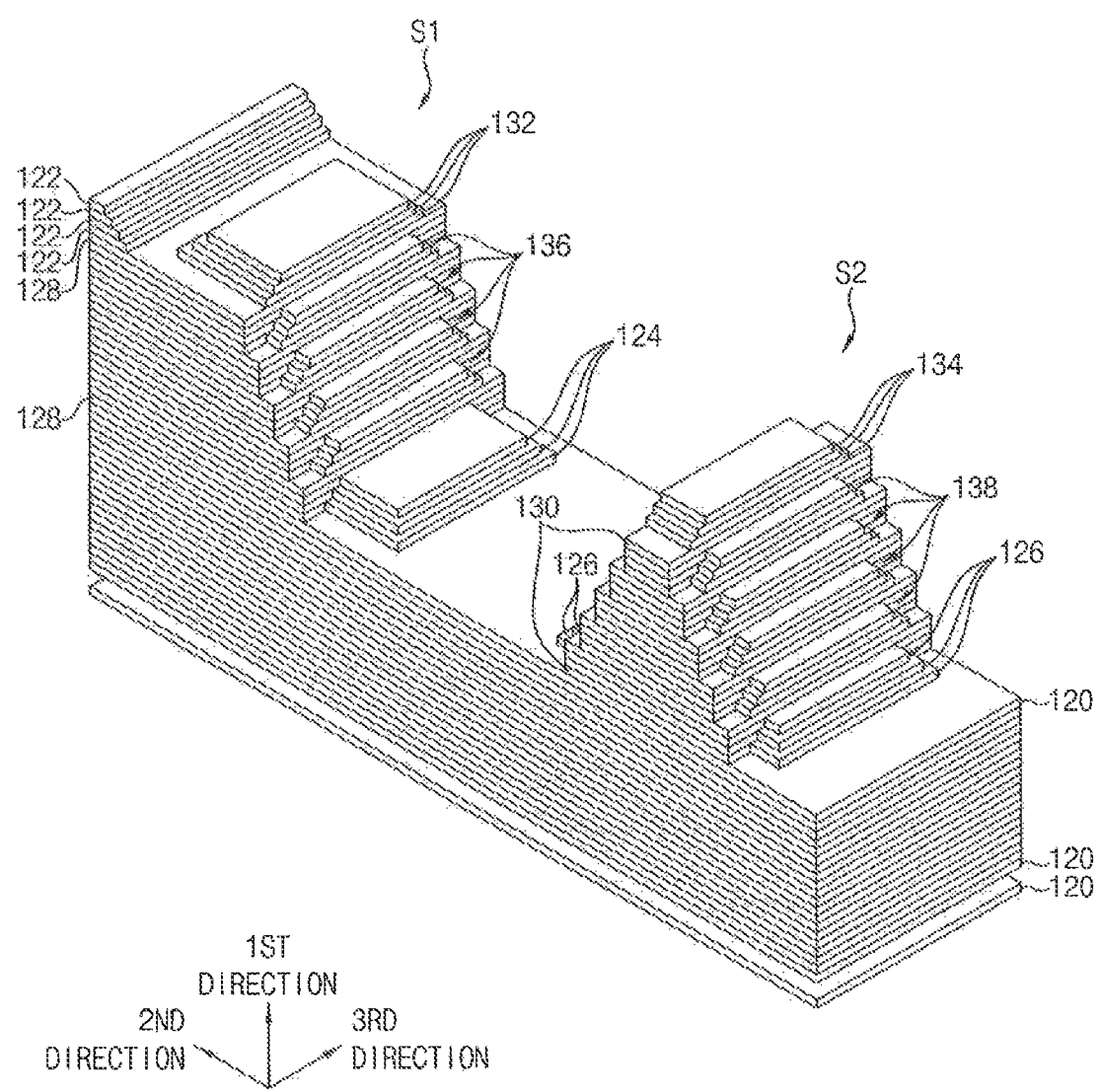

Referring to FIG. 14, processes substantially the same as or similar to those illustrated with reference to FIG. 13 may be performed once again or additional times. Hereinafter, the processes illustrated with reference to FIG. 13 will be performed twice again, however, present the inventive concept is not be limited thereto.

A fifth trimming process in which areas of the fifth and sixth photoresist patterns 152 and 154 are reduced may be performed so that portions of the sixth and seventh sacrificial patterns 132 and 134 may be exposed, and the exposed sixth and seventh sacrificial patterns 132 and 134, the eighth and ninth sacrificial patterns 136 and 138, the second to fifth sacrificial patterns 124, 126, 128 and 130, and the sacrificial layers 120 from seventeenth to twentieth levels, respectively, may be etched using the fifth and sixth photoresist patterns 152 and 154 as an etching mask.

A sixth trimming process in which areas of the fifth and sixth photoresist patterns 152 and 154 are reduced may be performed so that portions of the sixth and seventh sacrificial patterns 132 and 134 may be exposed, and the exposed sixth and seventh sacrificial patterns 132 and 134, the eighth and ninth sacrificial patterns 136 and 138, the second to fifth sacrificial patterns 124, 126, 128 and 130, and the sacrificial layers 1.20 from twenty-first to twenty-fourth levels, respectively, may be etched using the fifth and sixth photoresist patterns 152 and 154 as an etching mask.

The fifth and sixth photoresist patterns 152 and 154 may be removed.

Thus, the first sacrificial patterns 122 may be stacked from the first to fourth levels, respectively, to form staircase shape in the second direction. The sixth sacrificial patterns 132 may be stacked from the second to fourth levels, respectively, to form a staircase shape in each of the second and third directions to be spaced apart from the first sacrificial patterns 122. The fourth sacrificial patterns 128 may be stacked from the fifth to twenty-fourth levels, respectively, to form a staircase shape in the second direction. The eighth sacrificial patterns 136 may be stacked from the sixth to eighth, from the tenth to twelfth, from the fourteenth to sixteenth, and from the eighteenth to twentieth levels, respectively, to form a staircase shape in the third direction. The second sacrificial patterns 124 may be stacked from the twenty-second to twenty-fourth levels, respectively, to form a staircase shape in each of the second and third directions. Hereinafter, the above stacked structures altogether may be referred to as a first staircase structure S1.

Additionally, a second staircase structure S2 may be formed to be spaced apart from the first staircase structure S1 in the second direction. For example, in the second staircase structure 52, the seventh sacrificial patterns 134 may be stacked from the second to fourth levels, respectively, to form a staircase shape in the third direction. The fifth sacrificial patterns 130 may be stacked from the fifth to twenty-fourth levels, respectively, to form a staircase shape in the second direction. The ninth sacrificial patterns 138 may be stacked from the sixth to eighth, from the tenth to twelfth, from the fourteenth to sixteenth, and from the eighteenth to twentieth levels, respectively, to form a staircase shape in the third direction. The third sacrificial patterns 126 may be stacked from the twenty-second to twenty-fourth levels, respectively, to form a staircase shape in the third direction.

Accordingly, the first and second staircase structures S1 and S2 have been formed; however, the present inventive concept is not be limited thereto, and other staircase structures substantially the same or similar to the second staircase structure S2 may be formed to be spaced apart from each other, which will be explained later with reference to FIGS. 24 and 25.

Figure 15:
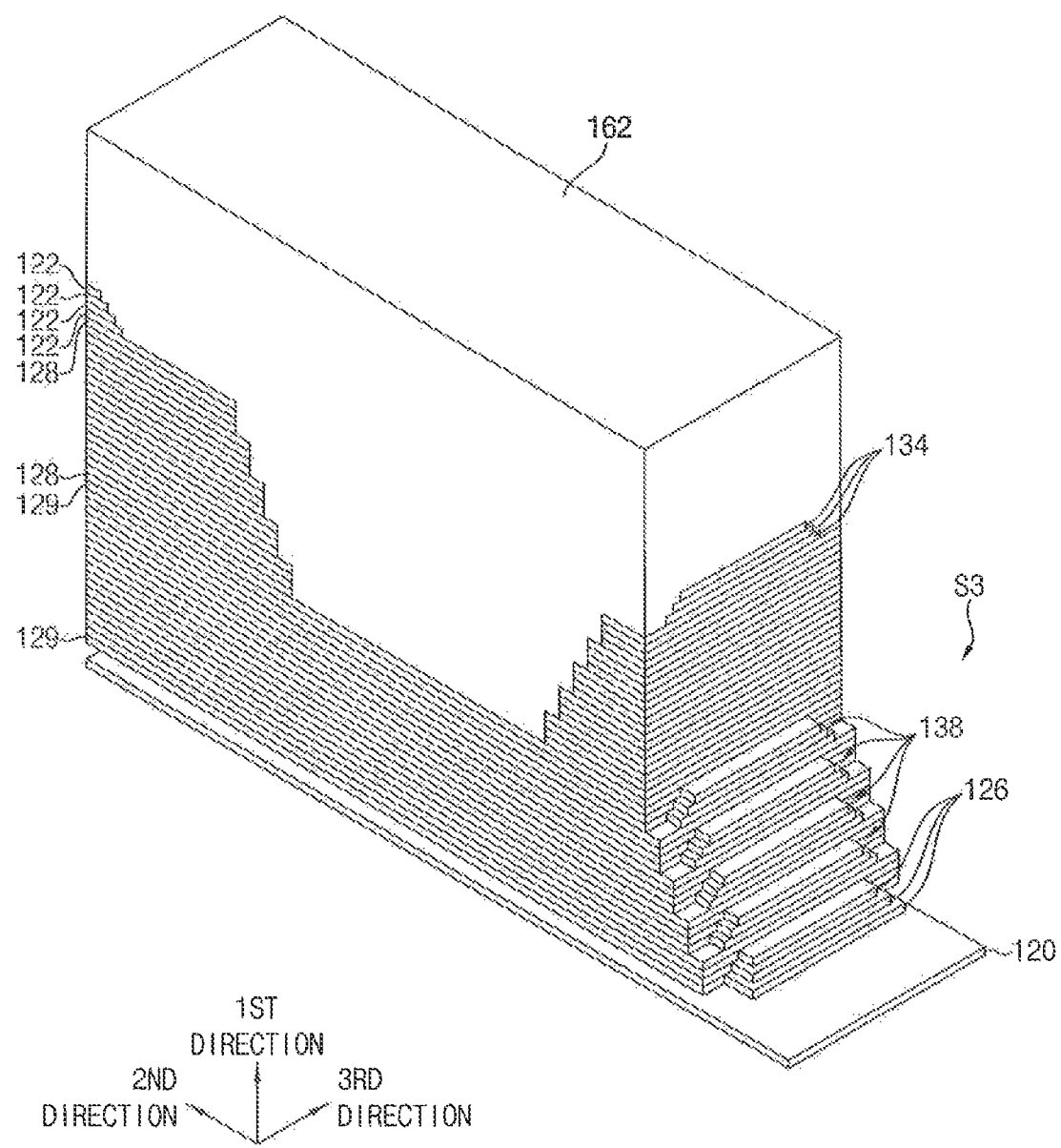

Referring to FIG. 15, a seventh photoresist pattern 162 may be formed on one of the sacrificial layers 120 at the twenty-fifth level to cover the first staircase structure S1, a portion of the second staircase structure S2 adjacent thereto, and a portion of the one of the sacrificial layers 120 at the twenty-fifth level therebetween and to expose a portion of the second staircase structure S2 distal from the first staircase structure S1. The second staircase structure S2 and the sacrificial layers 120 thereunder may be etched using the seventh photoresist pattern 162 as an etching mask.

The etching process may be performed to etch ones of the sacrificial layers 120 at a plurality of levels, respectively. In an exemplary embodiment of the present inventive concept, the etching process may be performed to etch sacrificial layers 120 at the number of levels, respectively, which is the same as the number of levels at which the fifth sacrificial patterns 130 are stacked. Thus, FIG. 15 shows sacrificial layers 120 at twenty levels, e.g., from the twenty-fifth to forty-fourth levels, respectively, etched.

As the etching process is performed, the sacrificial patterns at the exposed portion (e.g., portions not covered by the seventh photoresist pattern 162) of the second staircase structure S2 may be moved to lower levels to form a third staircase structure S3. For example, the fifth sacrificial patterns 130 from the fifth to twenty-fourth levels may be moved to the twenty-fifth through forty-fourth levels, respectively, to be transformed into tenth sacrificial patterns 129 disposed in the second direction in a staircase shape. The ninth sacrificial patterns 138 from the sixth to eighth, from the tenth to twelfth, from the fourteenth to sixteenth, and from the eighteenth to the twentieth levels may be moved to the twenty-sixth to twenty-eighth, the thirtieth to thirty-second, the thirty-fourth to thirty-sixth, and the thirty-eighth to fortieth levels, respectively, and the third sacrificial patterns 126 stacked from the twenty-second to twenty-fourth may be moved to the forty-second to forty-fourth levels, respectively.

The covered portion of the second staircase structure S2 adjacent the first staircase structure S1 may remain at the same levels; however, the symmetry of the second staircase structure S2, with respect to a vertical plane extending in the first direction before the etching process, may be broken. Thus, in the second staircase structure S2, the covered portion of the fifth sacrificial patterns 130 adjacent the first staircase structure S1 may keep the original staircase shape in the second direction, while the exposed portion of the second staircase structure S2 distal from the first staircase structure S1 might not have the staircase shape but may have a vertical sidewall extending in the first direction. The third sacrificial patterns 126 and the ninth sacrificial patterns 138 may be connected to the portions of the fifth sacrificial patterns 130 stacked in a staircase shape to be stacked in a staircase shape in the third direction.

Figure 16:
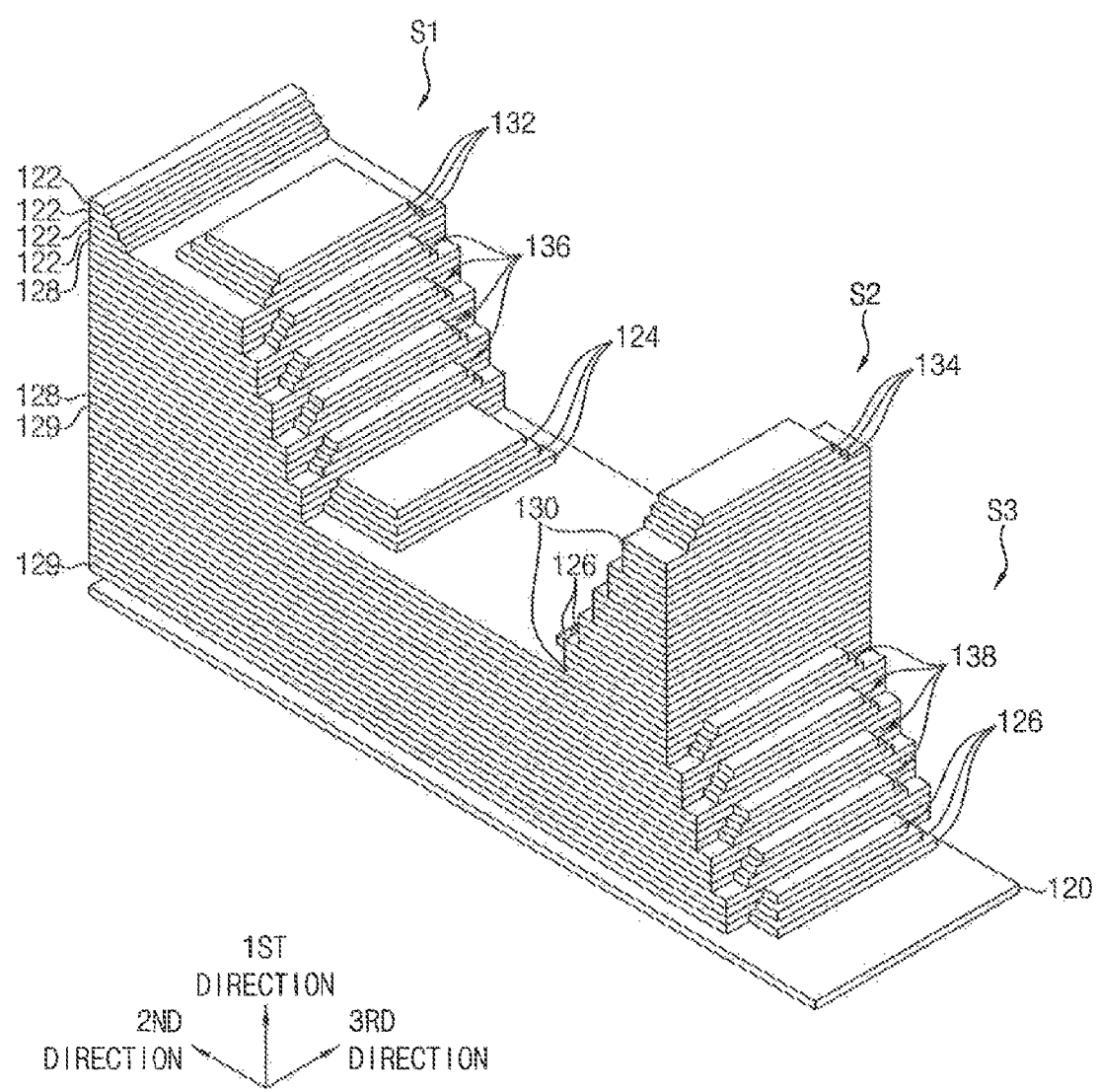
Figure 17:
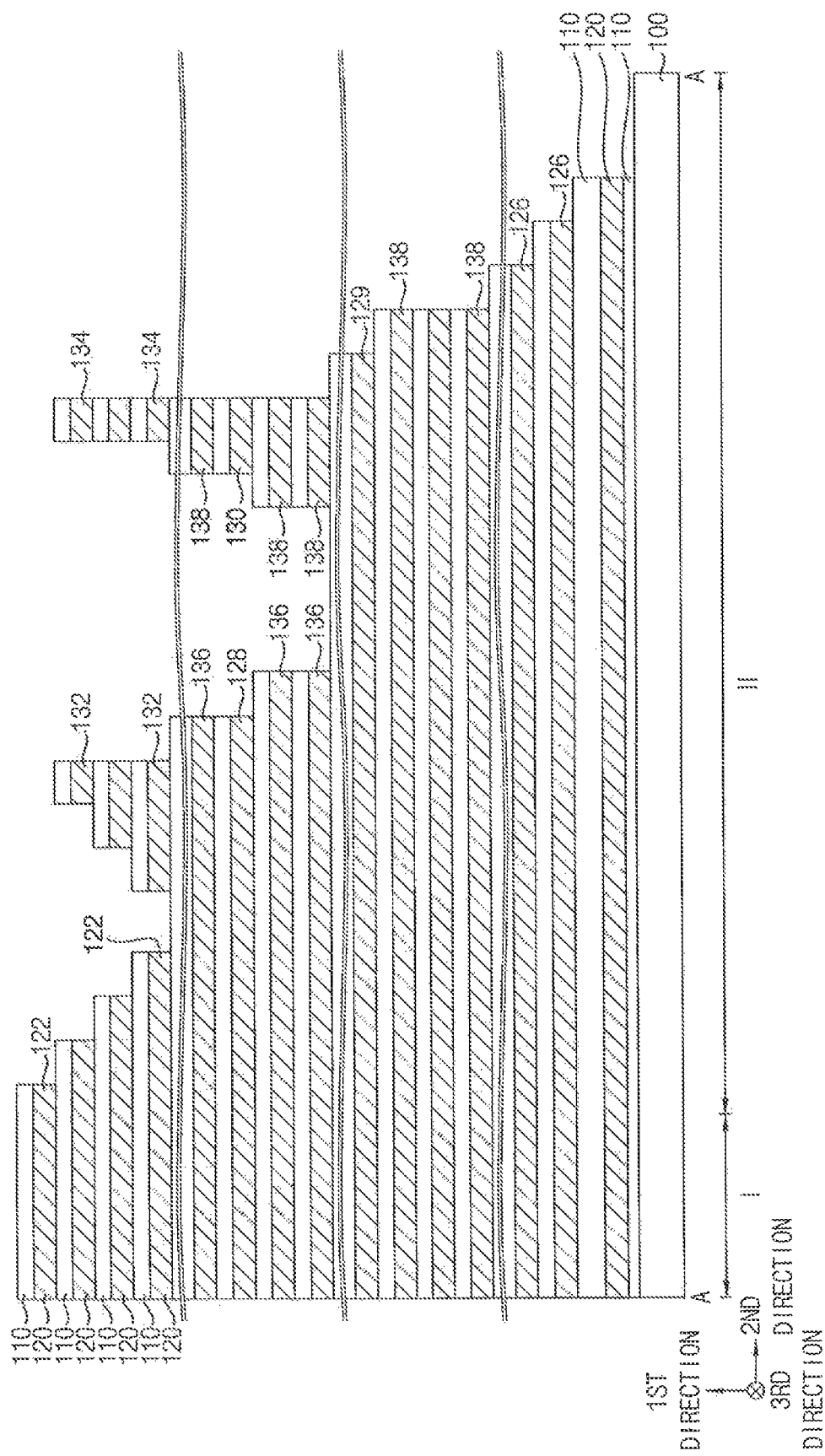

Referring to FIGS. 16 and 17, the seventh photoresist pattern 162 may be removed to form the first to third staircase structures S1, S2 and 53 on the second region II of the substrate 600, which may form a first mold together with the sacrificial layers 120 remaining on the first region I of the substrate 600.

FIG. 18 shows vertical profiles of the first to third staircase structures S1, S2 and S3 included in the first mold in accordance with an exemplary embodiment of the present inventive concept.

Referring to FIG. 18, the third sacrificial patterns 126 and the ninth sacrificial patterns 138 may be stacked in a staircase shape at one sidewall of the second staircase structure S2, but might not exist at the other sidewall of the second staircase structure S2. As the fifth sacrificial patterns 130 may have a vertical sidewall at the other sidewall of the second staircase structure S2, the other sidewall of the second staircase structure S2 may have a vertical sidewall entirely. For example, the second staircase structure S2 may have a side with a staircase shape, and the opposite side may be a sidewall that is entirely vertical. Accordingly, the second staircase structure S2 may have a relatively small width in the second direction.

The third staircase structure S3 may include steps disposed in the second direction at lower levels than those of the second staircase structure S2.

In an exemplary embodiment of the present inventive concept, the first sacrificial patterns 122, the eighth sacrificial patterns 136, the fourth sacrificial patterns 128 and the second sacrificial patterns 124 of the first staircase structure S1 and the ninth sacrificial patterns 138, the fifth sacrificial patterns 130 and the third sacrificial patterns 126 of the third staircase structure S3 may be replaced with gate electrodes by a replacement process illustrated later with reference to FIGS. 28 to 31, and signals may be applied thereto by being connected to contact plugs. For example, sacrificial patterns in the first to third staircase structures S1, S2 and S3 directly contacting the sacrificial layers 120 on the first region I of the substrate 600 at the respective same levels may be replaced with gate electrodes, and signals may be applied thereto by the contact plugs.

The sacrificial patterns in the first to third staircase structures S1, S2 and S3 not directly contacting the sacrificial layers 120 on the first region I of the substrate 600 at the respective same levels may be replaced with gate electrodes; however, no contact plugs may be connected thereto so that no signals may be applied thereto. For example, even if the sixth sacrificial patterns 132 of the first staircase structure S1 and the seventh sacrificial patterns 134, the ninth sacrificial patterns 138, the third sacrificial patterns 126 and the fifth sacrificial patterns 130 of the second staircase structure S2 are replaced with gate electrodes by a replacement process, the gate electrodes may be dummy gate electrodes to which no signals may be applied. Accordingly, the second staircase structure S2 serving as the dummy gate electrodes may have a relatively small width in the second direction, so that the integration degree of the vertical memory device may be increased.

FIGS. 19 to 23 show vertical profiles of the first to third staircase structures S1, S2 and S3 included in the first mold in accordance with an exemplary embodiment of the present inventive concept.

Figure 19:
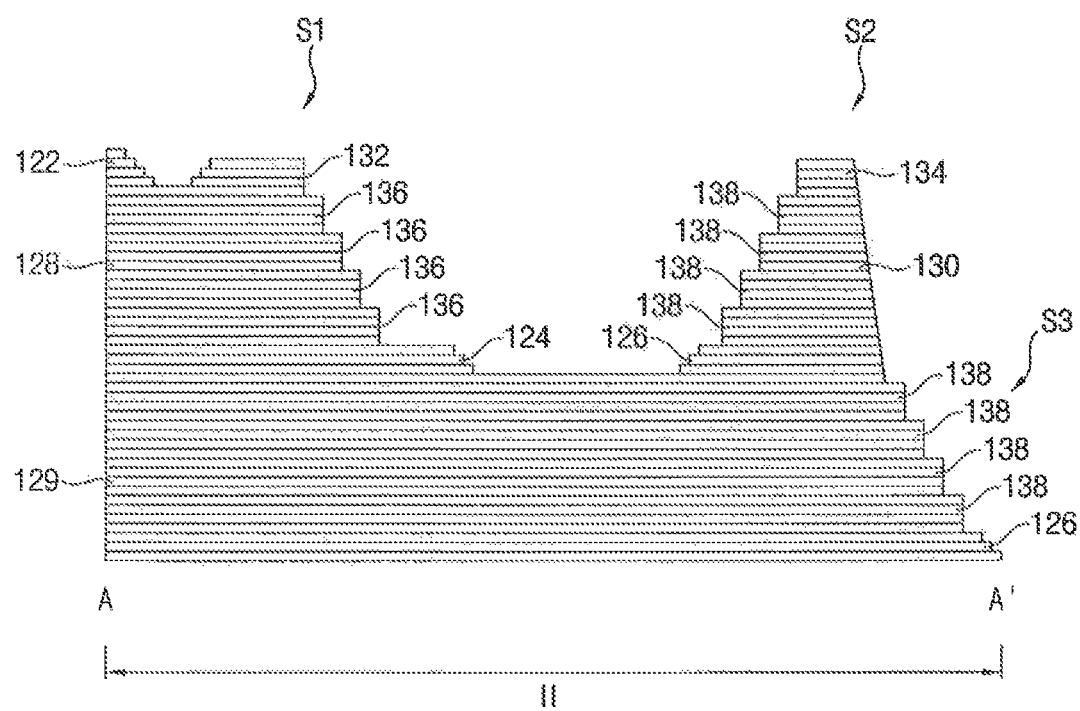

Referring to FIG. 19, the sidewall of the second staircase structure S2 nearest the third staircase structure S3 might not be vertical but may be slanted, which may be formed due to the process conditions of the etching process. However, unlike the sidewall of the second staircase structure S2 adjacent the first staircase structure S1 having a staircase shape, the sidewall of the second staircase structure S2 distant from the first staircase structure S1 (e.g., nearest the third staircase structure S3) might not have a staircase shape.

Figure 20:
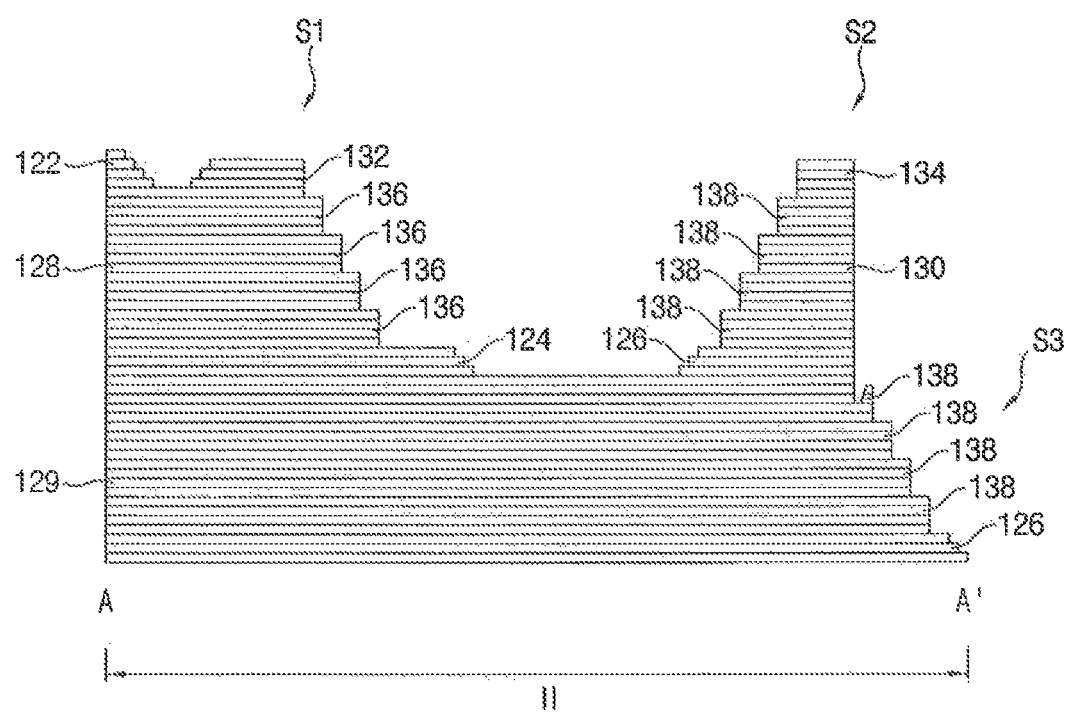

Referring to FIG. 20, an upper surface of the third staircase structure S3 at a boundary between the second and third staircase structures S2 and S3 might not be flat but concave due to a recess formed therein, which may be formed due to the process conditions of the etching process. For example, the uppermost step of the third staircase structure S3 may have a portion that is concave.

In this case, no contact plugs may be connected to gate electrodes substituted for the sacrificial patterns at upper levels of the third staircase structure S3 (e.g., in the figure, at the twenty-sixth and twenty-seventh levels), and the gate electrodes may only serve as dummy gate electrodes.

Figure 21:
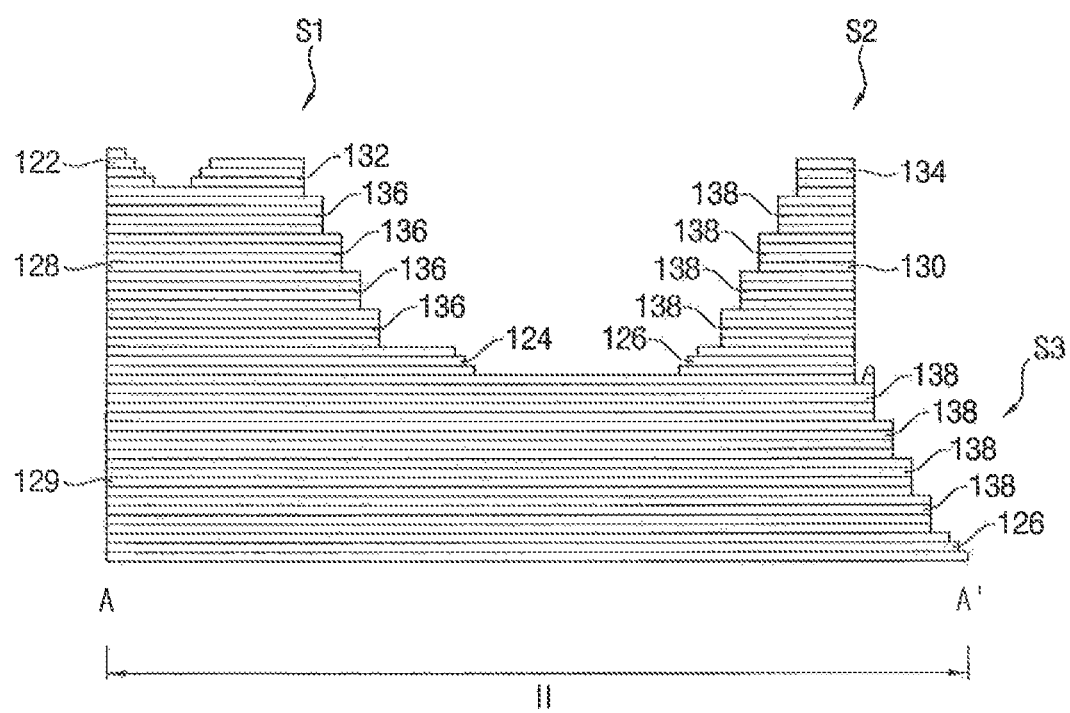

Referring to :FIG. 21, in consideration of the formation of the recess on the third staircase structure S3, the number of levels of the sacrificial layers 120 etched using the seventh photoresist pattern 162 as an etching mask may be reduced.

Thus, even if the recess may be formed on the third staircase structure S3, contact plugs may be connected to gate electrodes substituted for the sacrificial patterns at upper levels of the third staircase structures S3 under the first staircase structure S1 (e.g., in the figure, at the twenty-sixth and twenty-seventh levels).

Figure 22:
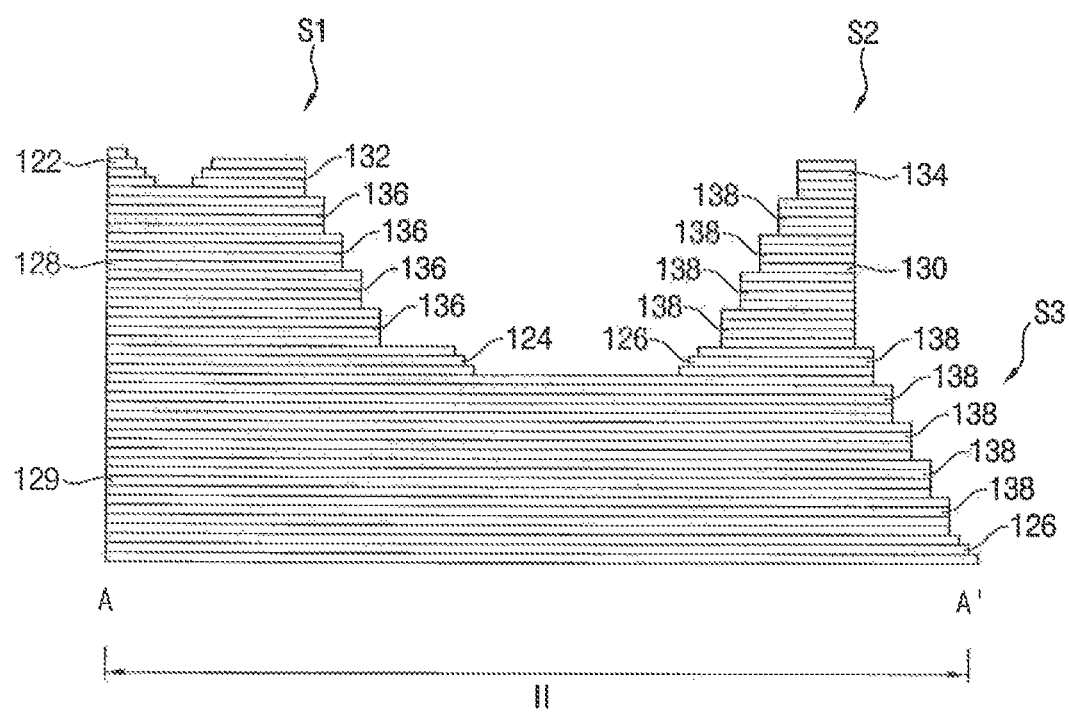

Referring to FIG. 22, upper levels of the third staircase structure S3 may overlap lower levels of the second staircase structure S2. No contact plugs may be connected to gate electrodes substituted for ones of the sacrificial patterns at the overlapping upper levels of the third staircase structure S3.

Figure 23:
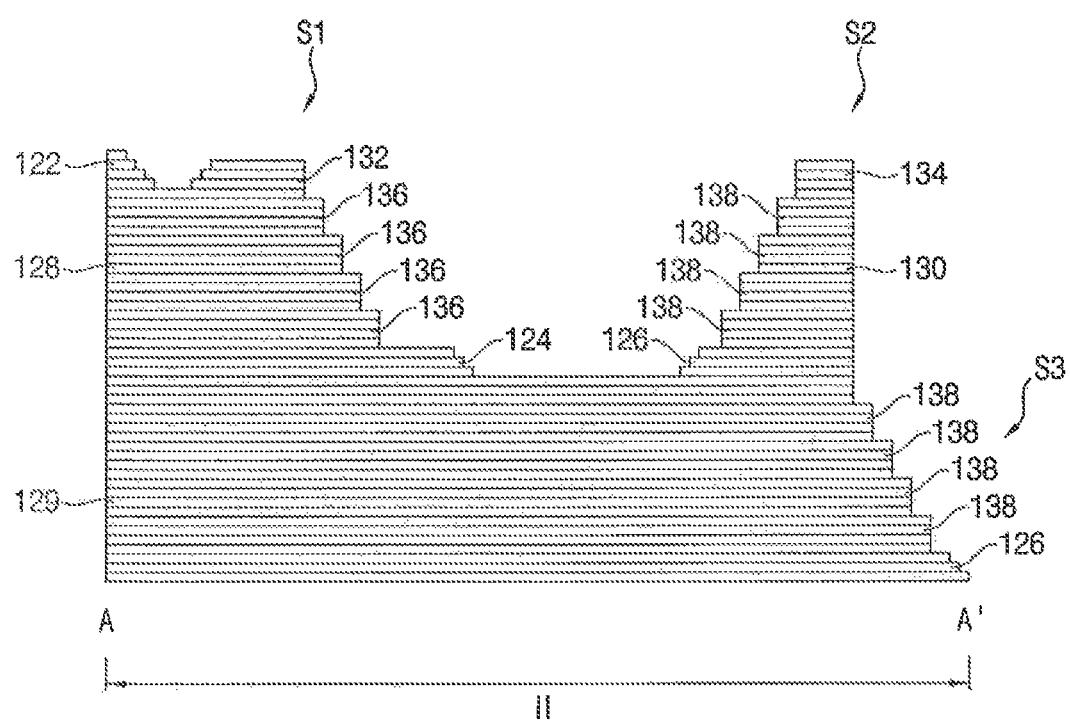

Referring to FIG. 23, the third staircase structure S3 might not be stacked at several levels directly under a lowermost level of the second staircase structure S2, but may be stacked from a level lower than the several levels. Gate electrodes substituted for the sacrificial patterns at the several levels between the second and third staircase structures S2 and S3 may serve as dummy gate electrodes.

Figure 24:
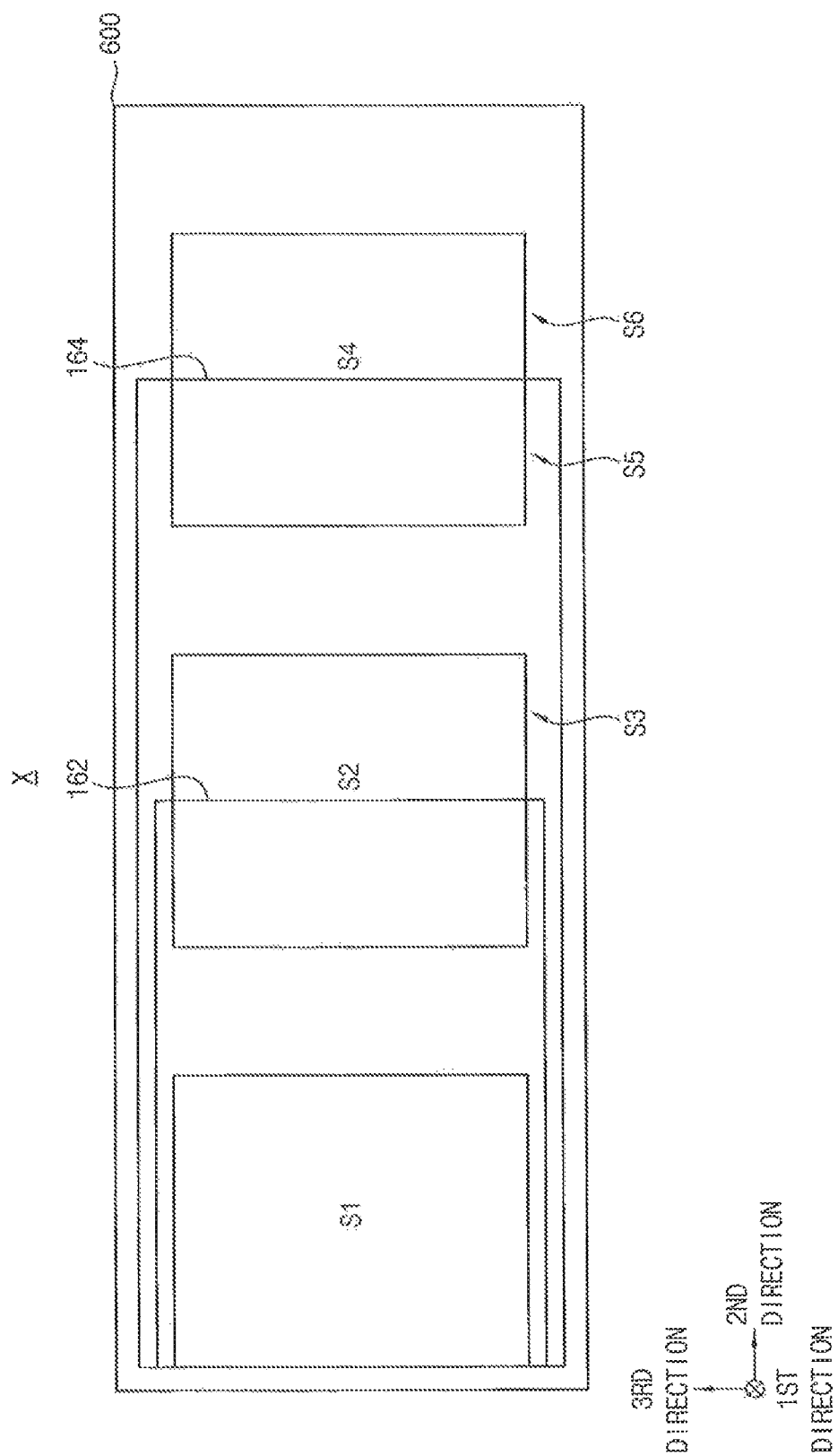

Referring to FIG. 24, a fourth staircase structure S4 may be formed in addition to the first and second staircase structures S1 and S2 by performing the processes illustrated with reference to FIGS. 1 to 14.

For example, an eighth photoresist pattern covering a portion of the sacrificial layer 120 in the region X and having a rectangular shape in a plan view, which may be spaced apart from the fourth photoresist pattern 146 in the second direction may be formed on one of the sacrificial layers 120 at a second level in addition to the second to fourth photoresist patterns 142, 144 and 146, and the one of the sacrificial layers 120 at the second level may be etched using the second to fourth photoresist patterns 142, 144 and 146 and the eighth photoresist pattern as an etching mask.

Processes substantially the same as or similar to those illustrated with reference to FIG. 15 may be performed. For example, the seventh photoresist pattern 162 may be formed on one of the sacrificial layers 120 at the twenty-fifth level to cover the first staircase shape S1 a portion of the second staircase structure S2 adjacent thereto, and a portion of the one of the sacrificial layers 120 at the twenty-fifth level therebetween, and the second and fourth staircase structures S2 and S4 and the sacrificial layers 120 thereunder may be etched using the seventh photoresist pattern 162 as an etching mask. Thus, a portion of the second staircase structure S2 may be transformed into the third staircase structure S3, and the fourth staircase structure S4 may be transformed into a fifth staircase structure S5. The third and fifth staircase structures S3 and S5 may be formed at substantially the same levels.

A ninth photoresist pattern 164 may be formed to cover the first to third staircase structures S1, S2 and S3, portions of the sacrificial layers 120 therebetween, a portion of the fifth staircase structure S5, and a portion of the sacrificial layers 120 between the third and fifth staircase structures S3 and S5. The fifth staircase structure S5 and the sacrificial layers 120 thereunder may be etched using the ninth photoresist pattern 164 as an etching mask. Thus, a portion of the fifth staircase structure S5 may be transformed into a sixth staircase structure S6. The sixth staircase structure S6 may be formed at lower levels than those of the fifth staircase structure S5.

By the above processes, staircase structures stacked at more levels than those of FIG. 16 may be formed. Even if FIG. 24 shows the first mold is formed based on the first, second and fourth staircase structures S1, S2 and S4, the present inventive concept is not be limited thereto, and the first mold may be formed based on more staircase structures so that staircase structures may include a lot of steps stacked at more than the above levels.

Figure 25:
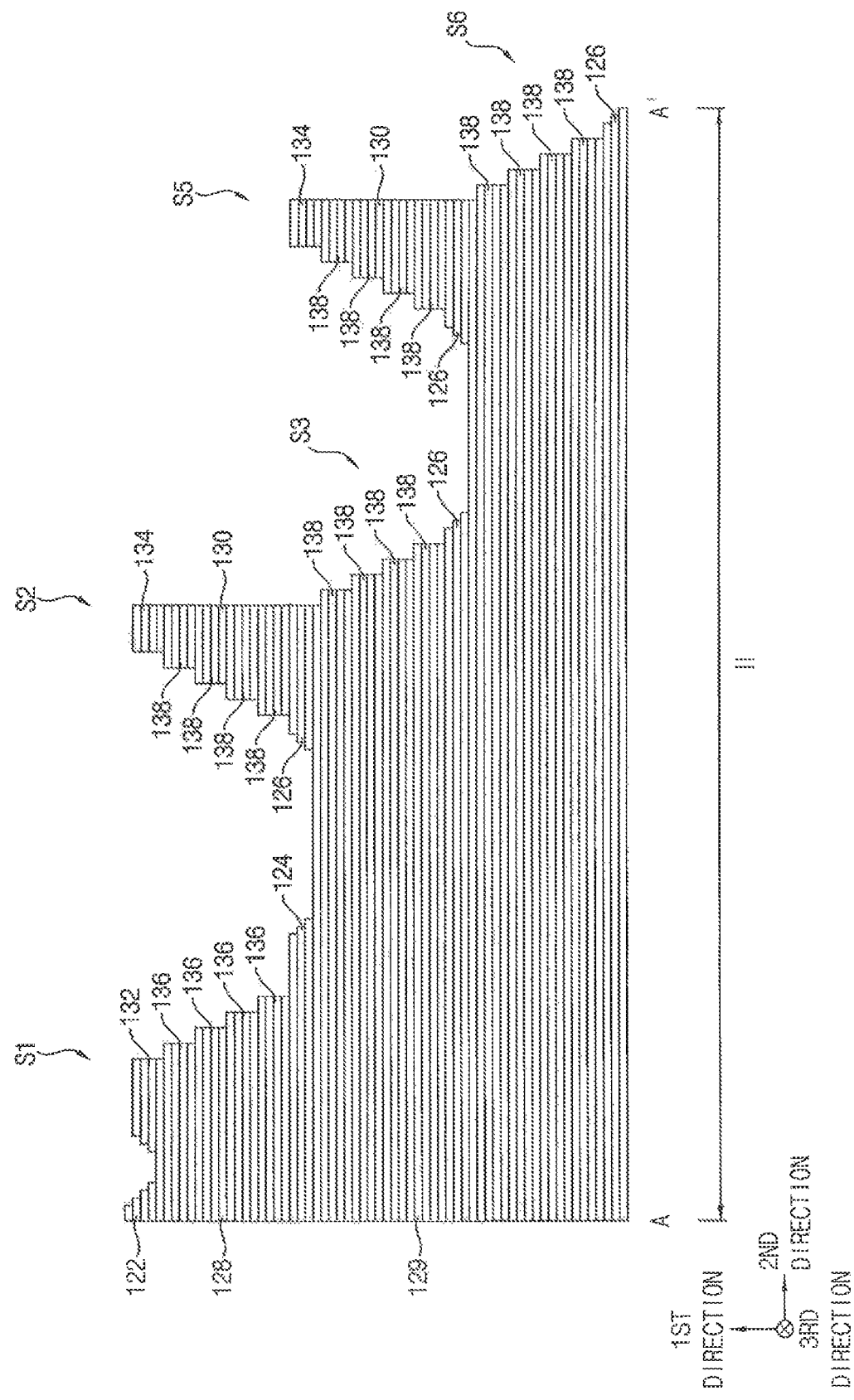

FIG. 25 shows vertical profiles of the first to third and the fifth to sixth staircase structures S1, S2, S3, S5 and S6 included in the first mold in accordance with an exemplary embodiment of the present inventive concept.

Referring to FIG. 25, the first mold may have vertical profiles of the second and third staircase structures S2 and S3 substantially the same as or similar to those of FIG. 18, and further include the fifth and sixth staircase structures S5 and S6. Thus, the first mold may include staircase structures stacked at more levels than those of FIG. 18.

In an exemplary embodiment of the present inventive concept, the fifth staircase structure S5 except for the seventh sacrificial patterns 134 may be stacked at substantially the same levels as those of the third staircase structure S3.

Figure 26:
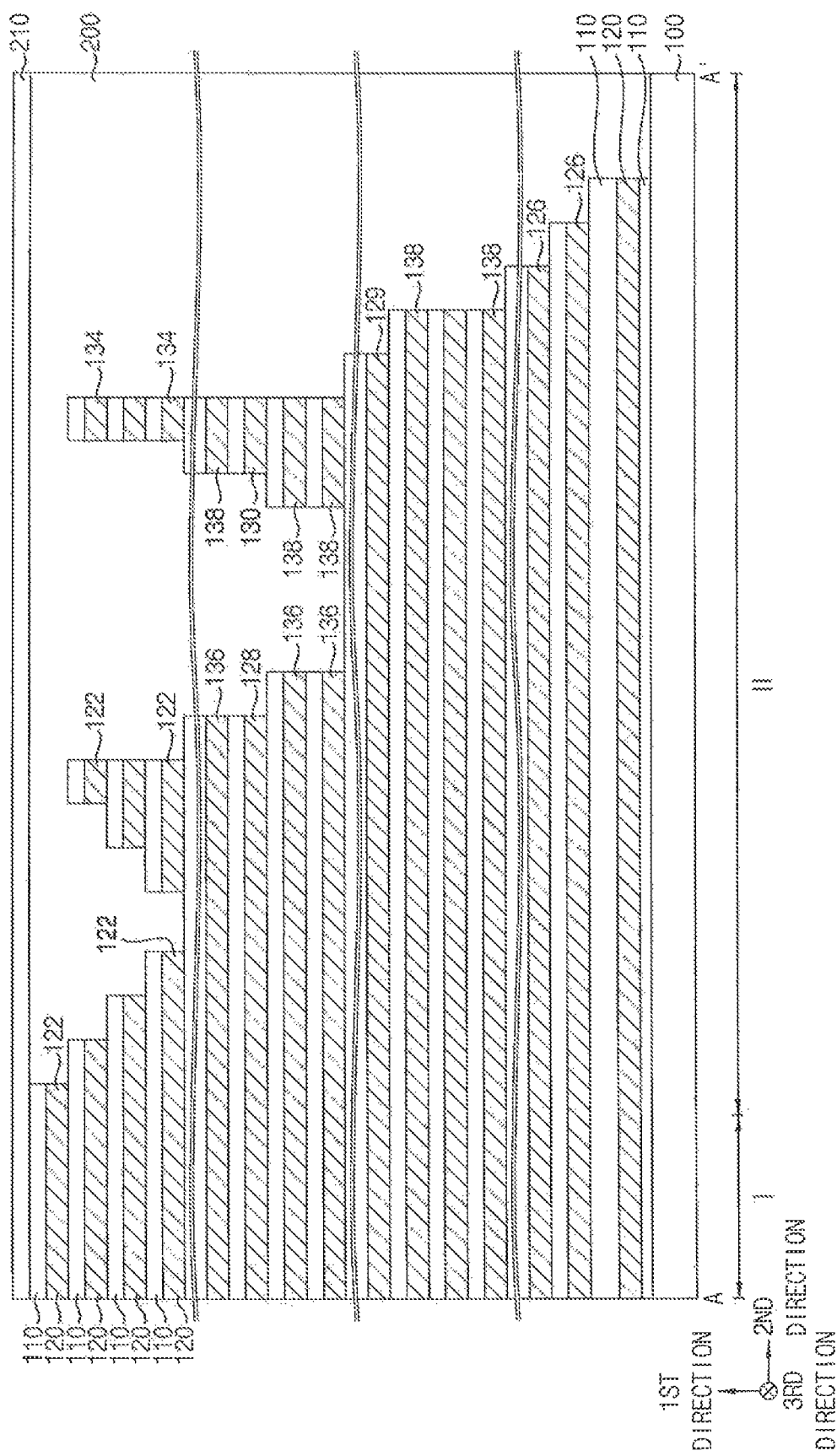

Referring to FIG. 26, a first insulating interlayer 200 may be formed on the base pattern 100 to cover the first mold, and the first insulating interlayer 200 may be planarized until an upper surface of an uppermost insulation layer 110 may be exposed. Thus, the first insulating interlayer 200 may cover a sidewall of the first mold.

For example, the planarization process may be performed by a chemical mechanical polishing (CMP) process and/or an etch back process.

A second insulating interlayer 210 may be formed on the first mold and the first insulating interlayer 200. The first and second insulating interlayers 200 and 210 may include an oxide, e.g., silicon oxide, and may be merged with each other or with the insulation layer 110.

Figure 27:
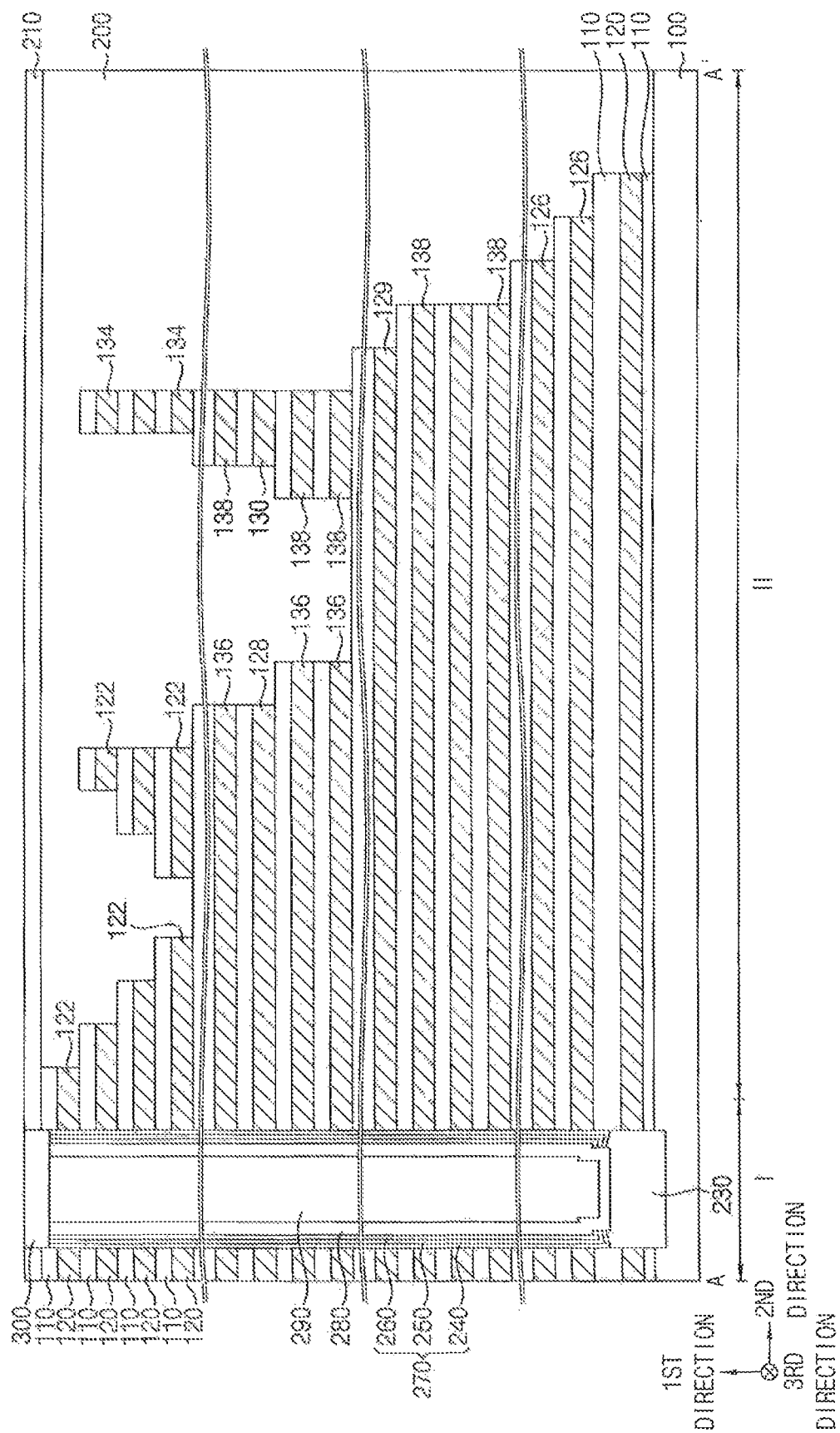

Referring to FIG. 27, a first mask may be formed on the second insulating interlayer 210, and the second insulating interlayer 210, the insulation layers 110 and the sacrificial layers 120 may be etched using the first mask as an etching mask to form a channel hole therethrough exposing an upper surface of the base pattern 100. A second structure filling the channel hole may be formed as follows.

After removing the first mask, a semiconductor pattern 230 may be formed to partially fill the channel hole.

For example, a selective epitaxial growth (SEG) process may be formed using the exposed upper portion of the base pattern 100 as a seed to form the semiconductor pattern 230 filling a lower portion of the channel hole. The semiconductor pattern 230 may have an upper surface having a height between those of lower and upper surfaces of one of the insulation layers 110 at a second level upwardly from the upper surface of the base pattern 100.

A first blocking layer, a charge storage layer, a tunnel insulation layer and a first spacer layer may be sequentially formed on a sidewall of the channel hole, the upper surface of the semiconductor pattern 230 and an upper surface of the second insulating interlayer 210, the first space layer may be anisotropically etched to form a first spacer on the sidewall of the channel hole, and the tunnel insulation layer, the charge storage layer and the first blocking layer may be etched using the first spacer as an etching mask to form a tunnel insulation pattern 260, a charge storage pattern 250 and a first blocking pattern 240, respectively, having a cup shape or a cylindrical shape of which a bottom is opened on the semiconductor pattern 230 and the sidewall of the channel hole. During the etching process, an upper portion of the semiconductor pattern 230 may be also partially removed. The tunnel insulation pattern 260, the charge storage pattern 250 and the first blocking pattern 240 may form a charge storage structure 270.

For example, the first spacer and the charge storage pattern 250 may include a nitride, e.g., silicon nitride. For example, the tunnel insulation pattern 260 and the first blocking pattern 240 may include an oxide, e.g., silicon oxide.

After removing the first spacer, a channel layer may be formed on the exposed semiconductor pattern 230, the tunnel insulation pattern 260 and the second insulating interlayer 210, and a filling layer may be formed on the channel layer to fill a remaining portion of the channel hole. The filling layer and the channel layer may be planarized until the upper surface of the second insulating interlayer 210 may be exposed to form a filling pattern 290, and the channel layer may be transformed into a channel 280.

In an exemplary embodiment of the present inventive concept, a plurality of channels 280 may be formed in each of the second and third directions, which may form a channel block and further a channel array.

An upper portion of a first structure including the filling pattern 290, the channel 280 and the charge storage structure 270 may be removed to form a trench, and a capping pattern 300 may be formed to fill the trench.

The channel 280 and the capping pattern 300 may include polysilicon or single crystalline silicon that is not doped or doped with impurities.

Figure 28:
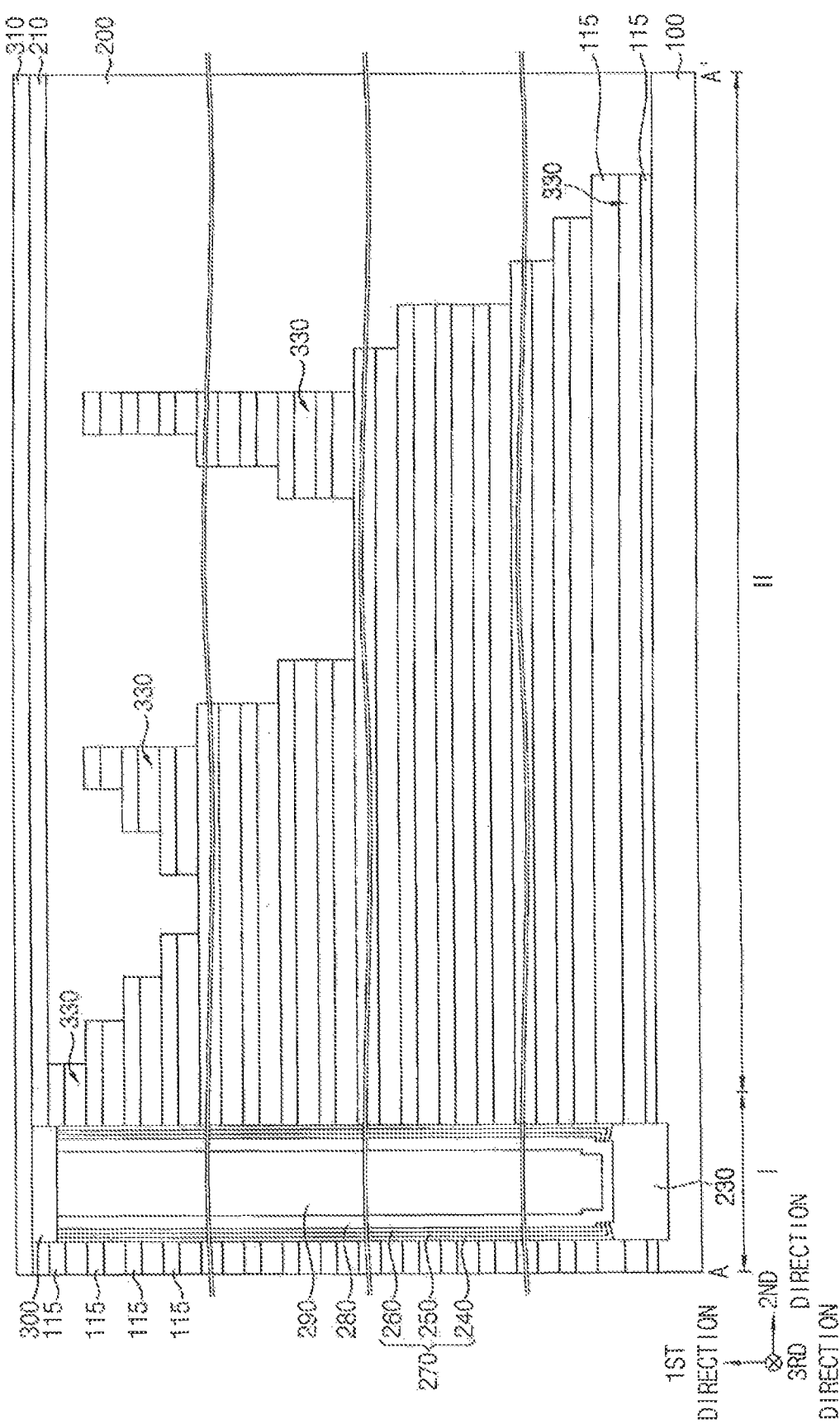
Figure 29:
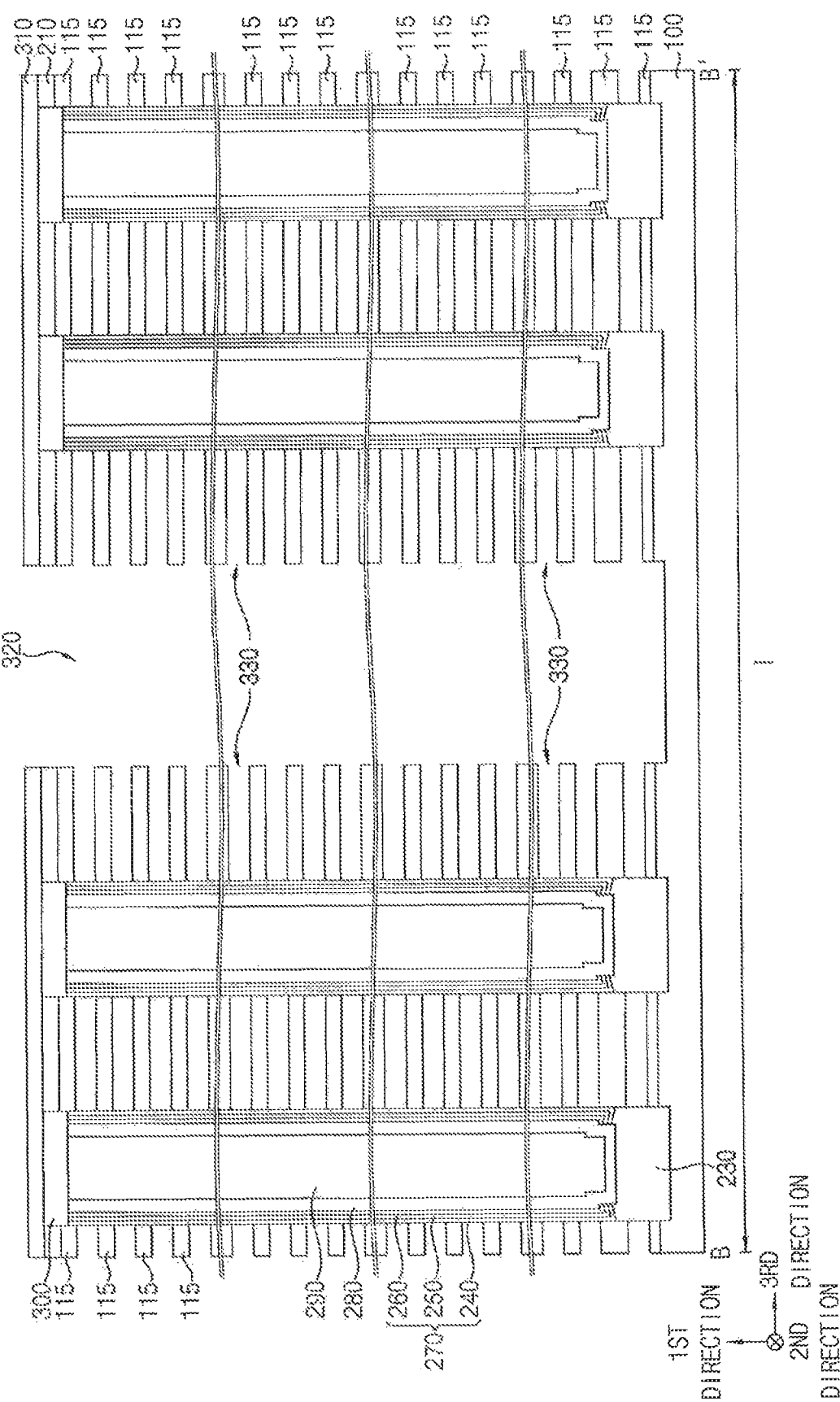

Referring to FIGS. 28 and 29, a third insulating interlayer 310 may be formed on the second insulating interlayer 210 and the capping pattern 300, a second mask may be formed on the third insulating interlayer 310, and the second and third insulating interlayers 210 and 310, the insulation layers 110, the sacrificial layers 120, and the first to tenth sacrificial patterns 122, 124, 126, 128, 130, 132, 134, 136, 138 and 129 may be etched using the second mask as an etching mask to form an opening 320 therethrough exposing an upper surface of the base pattern 100.

In an exemplary embodiment of the present inventive concept, the opening 320 may extend in the first direction in the first region I of the substrate 600. For example, the opening 320 may extend in the second direction on the first and second regions I and II of the substrate 600. A plurality of openings 320 may be formed in the third direction. As the opening 320 is formed, the insulation layer 110 may be transformed into insulation patterns 115 each of which may extend in the second direction.

After removing the second mask, the sacrificial layers 120 and the first to tenth sacrificial patterns 122 124, 126, 128, 1.30 132, 134, 136, 138 and 129 exposed by the opening 320 may be removed to form a gap 330 between neighboring ones of the insulation patterns 11.5 in the first direction, and a portion of an outer sidewall of the first blocking pattern 240 and a portion of a sidewall of the semiconductor pattern 230 may be exposed.

Figure 30:
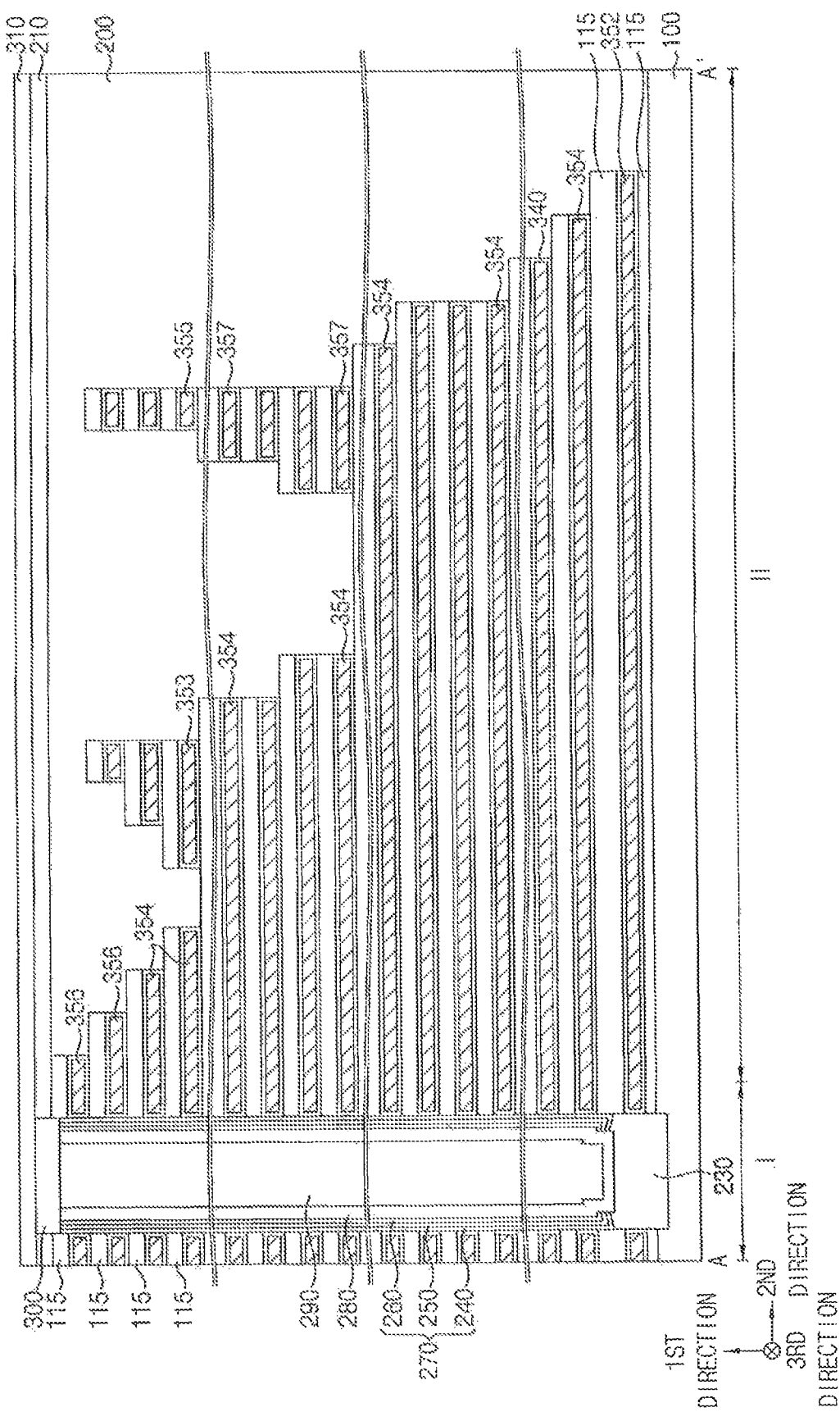
Figure 31:
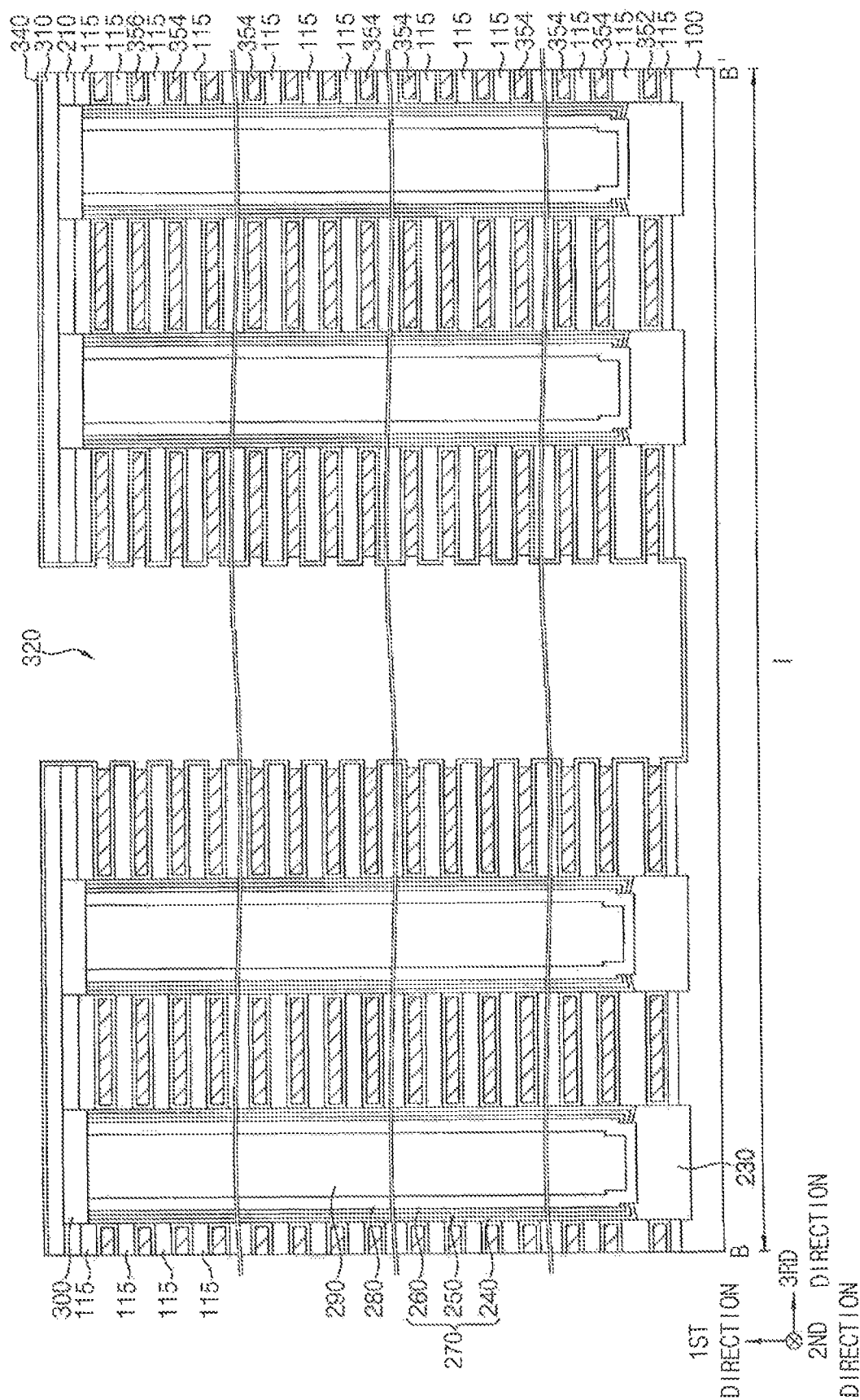

Referring to FIGS. 30 and 31, a second blocking layer 340 may be formed on the exposed portion of the outer sidewall of the first blocking pattern 240, the exposed portion of the sidewall of the semiconductor pattern 230, an inner wall of the gap 330, surfaces of the insulation patterns 115, an upper surface of the base pattern 100, and an upper surface of the third insulating interlayer 310. A gate conductive layer may be formed on the second blocking layer 340 to fill a remaining portion of the gap 330. A gate barrier layer may be further formed between the second blocking layer 340 and the gate conductive layer.

For example, the second blocking layer 340 may include a metal oxide, e.g., aluminum oxide. For example, the gate conductive layer may include a metal having a low resistance, e.g., tungsten, aluminum, etc. For example, the gate harrier layer may include a metal nitride, e.g., titanium nitride, tantalum nitride, etc.

The gate conductive layer may be partially removed to form a gate conductive pattern in the gap 330, and when the gate harrier layer is formed, the gate harrier layer may be partially removed to form a gate barrier pattern. The gate conductive pattern and the gate barrier pattern may form a gate electrode.

In an exemplary embodiment of the present inventive concept, the gate electrode may extend in the second direction, and a plurality of gate electrodes may be formed in the first direction. For example, the gate electrodes may be spaced apart from each other in the third direction by the opening 320.

A plurality of gate electrodes may be formed to be spaced apart from each other in the first direction, and each of the gate electrodes may extend in the second direction on the first and second regions I and II of the substrate 600.

The gate electrodes may be formed by replacing the sacrificial layers 120 on the first region I of the substrate 600 and the first to tenth sacrificial patterns 122, 124, 126, 128, 130, 132, 134, 136, 138 and 129 on the second region II of the substrate 600. For example, the sacrificial layers 120 on the first region I of the substrate 600 and the first to tenth sacrificial patterns 122, 124, 126, 128, 130, 132, 134, 136, 138 and 129 on the second region II of the substrate 600 may form the gate electrodes. An end portion of each of the gate electrodes in the second direction may be referred to as a pad. As illustrated above, the first to tenth sacrificial patterns 122, 124, 126, 128, 130, 132, 134, 136, 138 and 129 may form the staircase structures, and thus the pads may also form staircase structures. Hereinafter, the staircase structures formed by the pads of the gate electrodes may have the same names as the staircase structures formed by the first to tenth sacrificial patterns 122, 124, 126, 128, 130, 132, 134, 136, 138 and 129.

The gate electrode may include first to third gate electrodes 352, 354 and 356 sequentially stacked in the first direction on the base pattern 100. In an exemplary embodiment of the present inventive concept, the first gate electrode 352 may be formed at a lowermost level, the third gate electrode 356 may be formed at upper two levels, that is, at the first and second levels, and the second gate electrode 354 may be formed at a plurality levels between the first and third gate electrodes 352 and 356; however, the present inventive concept might not be limited thereto.

Ones of the gate electrodes that may not extend to the first region I of the substrate 600 but may be formed only on the second region H of the substrate 600 may serve as dummy gate electrodes, and may include, for example, first, second and third dummy gate electrodes 353, 355 and 357. The first dummy gate electrode 353 may be substituted for the sixth sacrificial pattern 132 of the first staircase structure SI, the second dummy gate electrode 355 may be substituted for the seventh sacrificial pattern 134 of the second staircase structure S2, and the third dummy gate electrode 357 may be substituted for each of the third and fifth sacrificial patterns 126 and 130 of the second staircase structure S2.

Contact plugs subsequently formed may contact upper portions of pads of the gate electrodes except for the dummy gate electrodes. For example, the contact plugs might not contact pads of the first to third dummy gate electrodes 353, 355 and 357, and may contact pads of the first to third gate electrodes 352, 354 and 356 so that signals may be applied thereto through the contact plugs.

Figure 32:
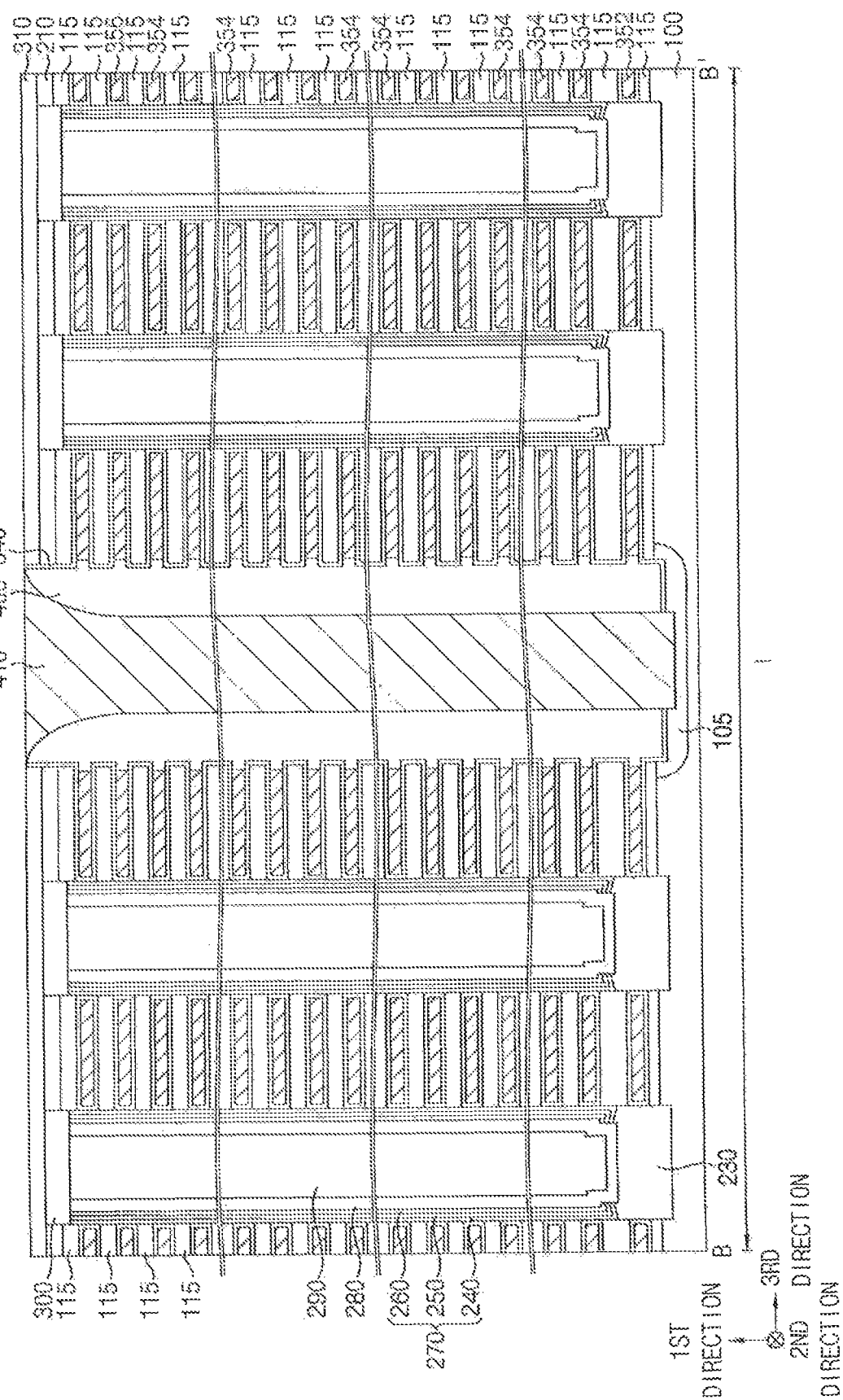

Referring to FIG. 32, impurities may be implanted into upper portions of the base pattern 100 exposed by the opening 320 to form a second impurity region 105.

A second spacer layer may be formed on the upper surface of the base pattern 100 exposed by the opening 320, a sidewall of the opening 320, and the upper surface of the third insulating interlayer 310, and may be anisotropically etched to form a second spacer 400 on the sidewall of the opening 320.

A common source line (CSL) 410 may be formed in the opening 320 on the second impurity region 105. For example, the CSL 410 may be in contact with the second spacer 400.

In an exemplary embodiment of the present inventive concept, a first conductive layer may be formed on the exposed upper surface of the second impurity region 105, the second spacer 400 and the third insulating interlayer 310 to fill the opening 320, and the first conductive layer may be planarized until the upper surface of the third insulating interlayer 310 may be exposed to form the CSL 410. During the planarization process, a portion of the second blocking layer 340 on the third insulating interlayer 310 may be also removed. The CSL 410 may be formed in the opening 320 to contact an upper surface of the second impurity region 105.

Each of the first to third gate electrodes 352, 354 and 356 at their respective levels may each be divided in the third direction by the CSL 410 and the second spacer 400, which are disposed in the opening 320, each extending in the second direction. For example, the CSL 410 and the second spacer 400 may penetrate the first to third gate electrodes 352, 354, and 356 in the first direction.

Figure 33:
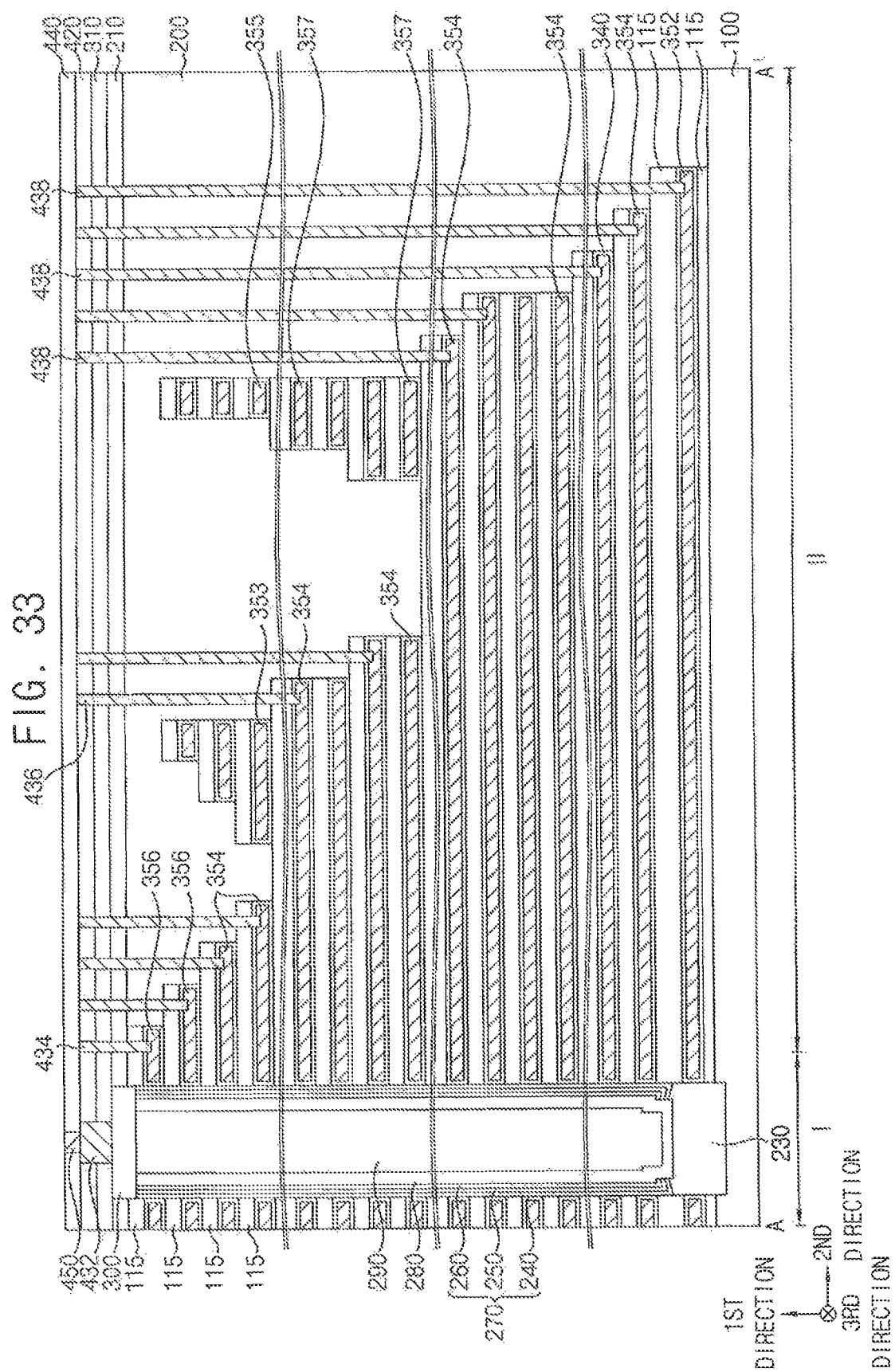
Figure 34:
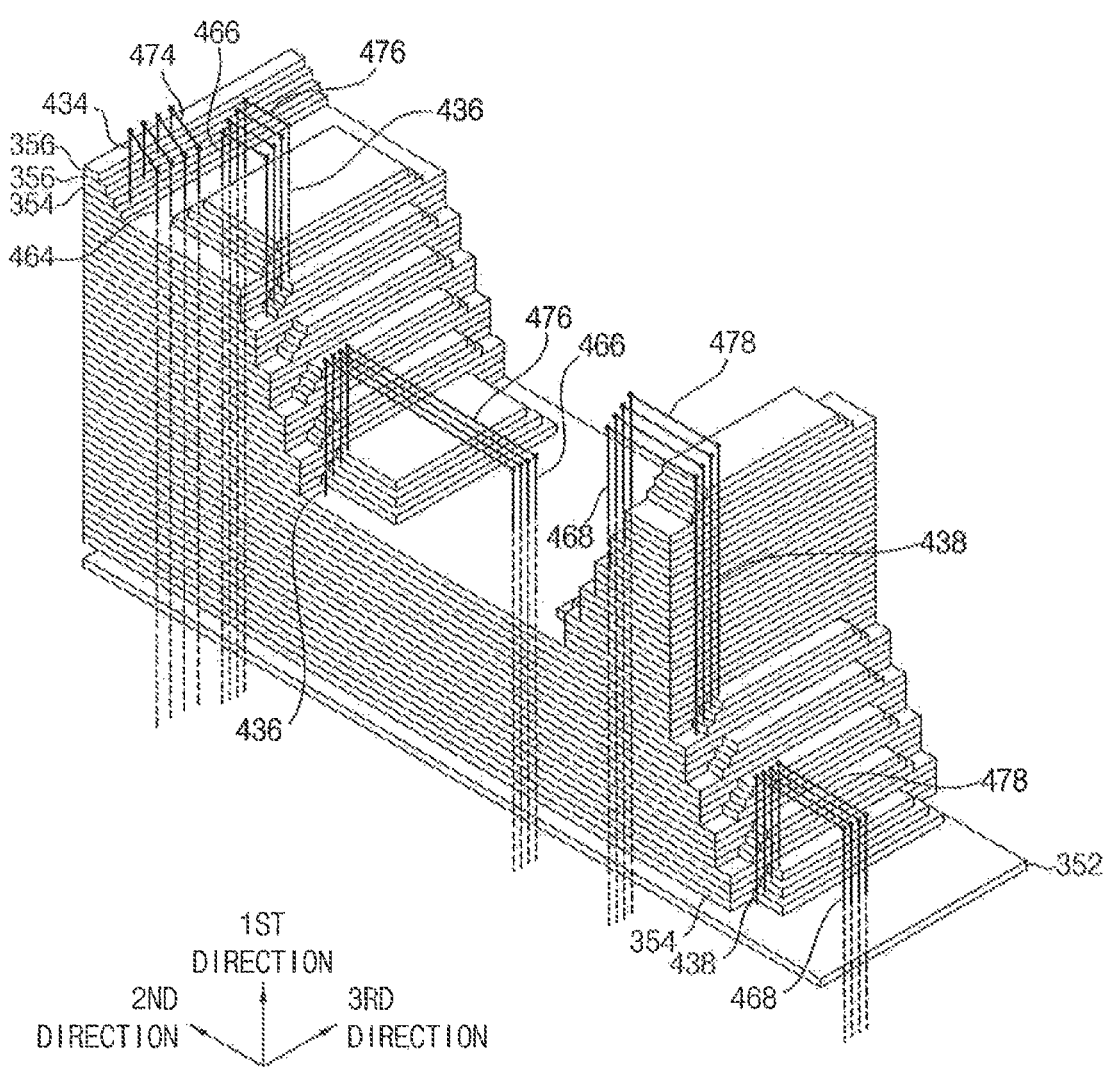

Referring to FIGS. 33 and 34, after forming a fourth insulating interlayer 420 on the third insulating interlayer 310, the CSL 410 (of, e.g., FIG. 32), the second spacer 400, the second blocking layer 340, a first contact plug 432 may be formed through the third and fourth insulating interlayers 310 and 420. For example, the first contact plug 432 may contact an upper surface of the capping pattern 300, and second to fourth contact plugs 434, 436 and 438 may be formed through the first to fourth insulating interlayers 200, 2.10, 310 and 420, the insulation pattern 115 and the second blocking layer 340 to contact upper surfaces of pads of the first to third gate electrodes 352, 354 and 356, respectively.

The second contact plug 434 may contact an upper portion of a pad of the gate electrode substituted for the first sacrificial pattern 122, the third contact plug 436 may contact an upper portion of a pad of each of the gate electrodes substituted for the second, fourth and eighth sacrificial patterns 124, 128 and 136, respectively, and the fourth contact plug 438 may contact an upper portion of a pad of each of the gate electrodes substituted for the third, ninth and tenth sacrificial patterns 126, 138 and 129, respectively.

However, in the interest of providing clarity to the drawings, FIG. 34 shows some of the second to fourth contact plugs 434, 436 and 438.

First, second and third through vias 464, 466 and 468 may be formed through the first to fourth insulating interlayers 200, 210, 310 and 420, the base pattern 100 and the second lower insulating interlayer 730 to contact upper surfaces of the third lower wirings 720 (See, e.g., FIG. 2).

In an exemplary embodiment of the present inventive concept, the first to third through vias 564, 466 and 468 may extend through portions of the first to tenth sacrificial patterns 122, 124, 126, 128, 130, 132, 134, 136, 138 and 129 that have not been replaced with the gate electrodes to contact upper surfaces of the third lower wirings 720, and thus may be electrically insulated from the gate electrodes.

A fifth insulating interlayer 440 may be formed on the fourth insulating interlayer 420 and the first to fourth contact plugs 432, 434, 436 and 438, and a bit line 450 may be formed through the filth insulating interlayer 440 to contact the first contact plug 432. Additionally, first to third upper wirings 474, 476 and 478 may be formed through the fifth insulating interlayer 440.

In an exemplary embodiment of the present inventive concept, the bit line 450 may extend in the third direction, and a plurality of bit lines 450 may be formed in the second direction.

The first to third upper wirings 474, 476 and 478 may contact the second to fourth contact plugs 434, 436 and 438, respectively, and the first to third through vias 464, 466 and 468, respectively, to be electrically connected therewith. However, the first to third upper wirings 474, 476 and 478 might not be formed at the same level as that of the bit line 450.

According to an exemplary embodiment of the present inventive concept, the vertical memory device may be manufactured by the above processes.

As illustrated above, after forming the first and second staircase structures S1 and S2 spaced apart from each other in the second direction on the second region II of the substrate 600, performing an etching process using the seventh photoresist pattern 162 as an etching mask covering the entire first staircase structure S1 and a portion of the second staircase structure S2 adjacent the first staircase structure S1, so that the other portion of the second staircase structure 52 may be etched to be transformed into the third staircase structure S3 that may be formed at lower levels. Thus, many steps may be formed. A sidewall of the second staircase structure S2 may be vertical with respect to the upper surface of the substrate 600, and thus the second staircase structure S2 having no contact plugs thereon may have a relatively small width in the second direction.

In addition, the first, second and fourth staircase structures S1, S2 and S4 may be formed to be spaced apart from each other in the second direction on the second region II of the substrate 600, and in this case, an etching process may be performed using the seventh photoresist pattern 162 as an etching mask covering the entire first staircase structure S1 and the portion of the second staircase structure S2 adjacent the first staircase structure S1, so that the other portion of the second staircase structure S2 may be etched to be transformed into the third staircase structure S3 that may be formed at lower levels. For example, the third staircase structure S3 may be formed below the second staircase structure S2. Additionally, the fourth staircase structure S4 may be entirely etched to be transformed into the fifth staircase structure S5, and may be formed at substantially the same levels as those of the third staircase structure S3. Thereafter, an etching process may be performed using the ninth photoresist pattern 164 as an etching mask covering the entire first to third staircase structures S1, S2 and S3 and a portion of the fifth staircase structure S5 adjacent the third staircase structure S3, so that the other portion of the fifth staircase structure S5 may be etched to be transformed into the sixth staircase structure S6 that may be formed at lower levels. For example, the sixth staircase structure S6 may be formed below the fifth staircase structure S5. Likewise, many steps in the staircase structures (e.g., S1, S2, S3, S4, S5 and S6) may be effectively formed. A sidewall of the second staircase structure S2 and a sidewall of the fifth staircase structure S5 may be vertical with respect to the upper surface of the substrate 600, and thus each of the second and fifth staircase structures S2 and 55 having no contact plugs thereon may have a relatively small width in the second direction.

As illustrated above, many staircase structures may be initially formed to be spaced apart from each other in the second direction on the second region II of the substrate 600, and an etching process using an etching mask partially covering the staircase structures may be performed several times, so that many desired numbers of steps may be effectively performed. However, when the number of the initial staircase structures is relatively high, a length of the second region II of the substrate 600 in the second direction may be also be relatively high. However, the vertical memory device may have a COP structure so that peripheral circuit patterns around the cell array region and the extension region do not need relatively large areas, and thus the increase of the length of the second region II of the substrate 600 in the second direction may not matter. Additionally, as illustrated above, the dummy gate electrodes having no contact plug thereon may have a vertical sidewall, so that the increase of the length of the second region II of the substrate 600 in the second direction may be suppressed.

The vertical memory device may have following structural features.

The vertical memory device may include the gate electrodes 352, 354 and 356 and the dummy gate electrodes 353, 355 and 357.

The gate electrodes 352, 354 and 356 may be stacked at a plurality of levels disposed in the first direction, and each of the gate electrodes 352, 354 and 356 may extend in the second direction on the first and second regions I and II of the substrate 600. Pads of the gate electrodes 352, 354 and 356 at the end portions in the second direction thereof may be stacked in the first direction to form a staircase shape arid may extend in the second direction on the second region II of the substrate 600.

The channel 280 may extend in the first direction on the first region I of the substrate 600 through at least ones of the gate electrodes 352, 354 and 356.

The dummy gate electrodes 353, 355 and 357 may be formed on the second region II of the substrate 600, and may be spaced apart from the gate electrodes 352, 354 and 356 at the respective same levels in the second direction.

The dummy gate electrodes 353, 355 and 357 may be included in a plurality of dummy gate electrode groups, which may be spaced apart from each other in the second direction. For example, the dummy gate electrode groups may include a first dummy gate electrode group consisting of the first dummy gate electrodes 353 included in the first staircase structure S1, and a second dummy gate electrode group consisting of the second and third dummy gate electrodes 355 and 357 included in the second staircase structure S2. The dummy gate electrode groups may further include a third dummy gate electrode group consisting of the dummy gate electrodes included in the fifth staircase structure S5.

In an exemplary embodiment of the present inventive concept, each of the first to third dummy gate electrode groups may have a sidewall relatively distal from the first region I of the substrate 600 in the second direction that may be vertical with respect to the upper surface of the substrate 600, and a sidewall relatively close (and, e.g., facing) to the first region I of the substrate 600 in the second direction that may have a staircase shape. For example, the sidewall relatively distal from the first region I of the substrate 600 in the second direction of each of the first to third dummy gate electrode groups may be slanted with respect to the upper surface of the substrate 600.

In an exemplary embodiment of the present inventive concept, the sidewall facing the first region I of the substrate 600 in the second direction of each of the first to third dummy gate electrode groups having a staircase shape may be symmetric with a staircase shape of pads of corresponding ones among the gate electrodes 352, 354 and 356. For example, a staircase structure nearest the first region and including second gate electrodes 354 and third gate electrodes 356 may be symmetric with a staircase structure including the first dummy gate electrode group with respect to a line extending therebetween in the third direction. As an additional example, a staircase structure including second gate electrodes 354 may be symmetric with a staircase structure including the second dummy gate electrode group with respect to a line extending therebetween in the third direction.

In an exemplary embodiment of the present inventive concept, fifth gate electrodes having pads stacked in a staircase shape substantially the same as that of pads of fourth gate electrodes among the gate electrodes 352, 354 and 356 corresponding to ones of the dummy gate electrodes included in the second dummy gate electrode group may be formed at lower levels than those of the fourth gate electrodes, and the fifth gate electrodes may be disposed farther from the first region I of the substrate 600 than the second dummy gate electrode group.

In an exemplary embodiment of the present inventive concept, the first to third dummy gate electrode groups may be sequentially disposed in the second direction from the first region I of the substrate 600, and ones of the dummy gate electrodes included in the first dummy gate electrode group may be disposed at levels the same as or upper (e.g., higher) than those of ones of the dummy gate electrodes included in the second dummy gate electrode group, and the ones of the dummy gate electrodes included in the second dummy gate electrode group may be disposed at levels the same as or upper than those of ones of the dummy gate electrodes included in the third dummy gate electrode group.

In an exemplary embodiment of the present inventive concept, each of the second to fourth contact plugs 434, 436 and 438 may contact and transfer signals to one of the gate electrodes 352, 354 and 356, and no contact plugs may contact the dummy gate electrodes 353, 355 and 357.

Up to now, the gate electrodes extending in the second direction are spaced apart from each other in the first direction, and the bit lines 450 extend in the third direction over the gate electrodes to be spaced apart from each other in the second direction; however, the present inventive concept is not be limited thereto. For example, the gate electrodes extending in the third direction are spaced apart from each other in the second direction, and the bit lines 450 extend in the third direction under the gate electrodes to be spaced apart from each other in the second direction.

Figure 41:
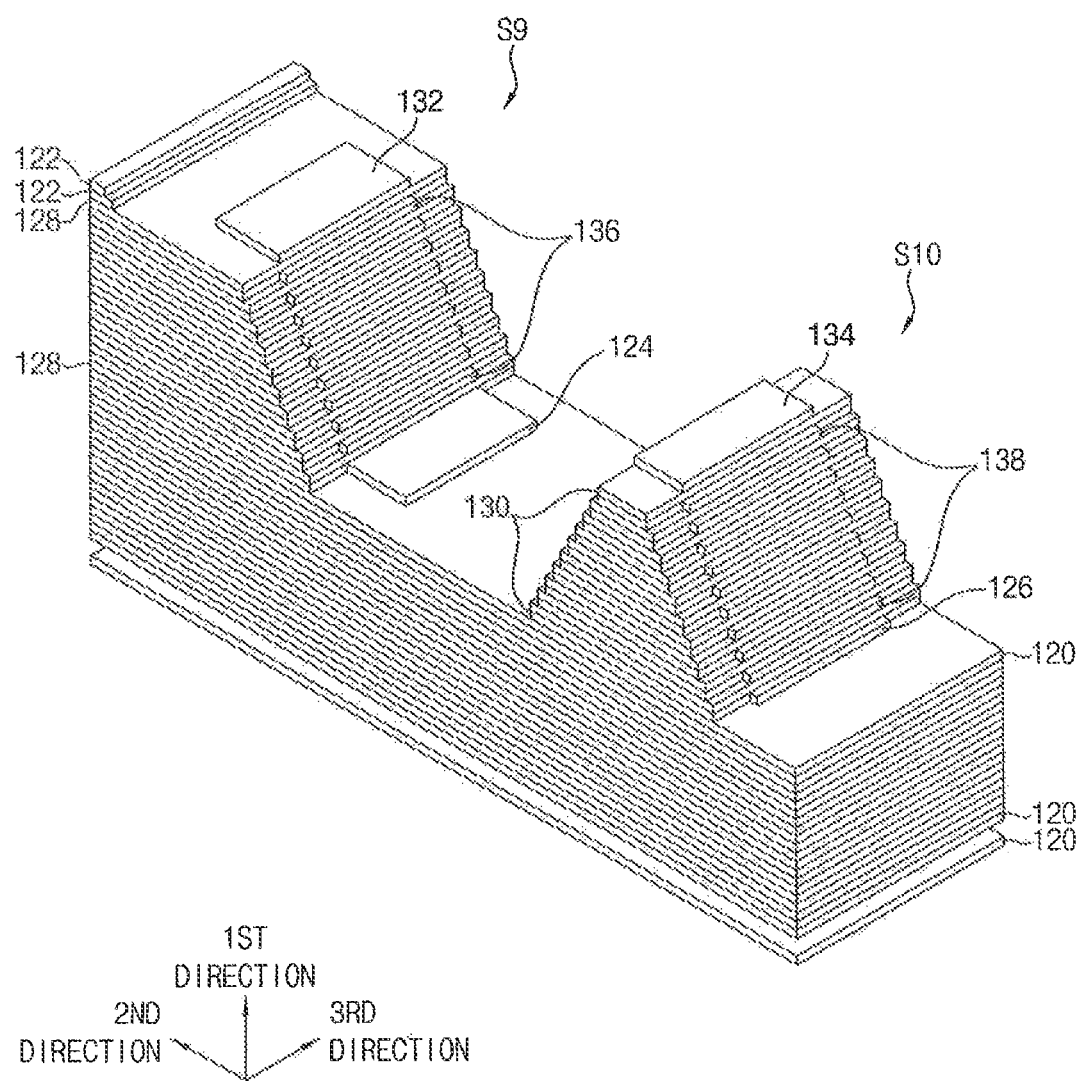
Figure 42:
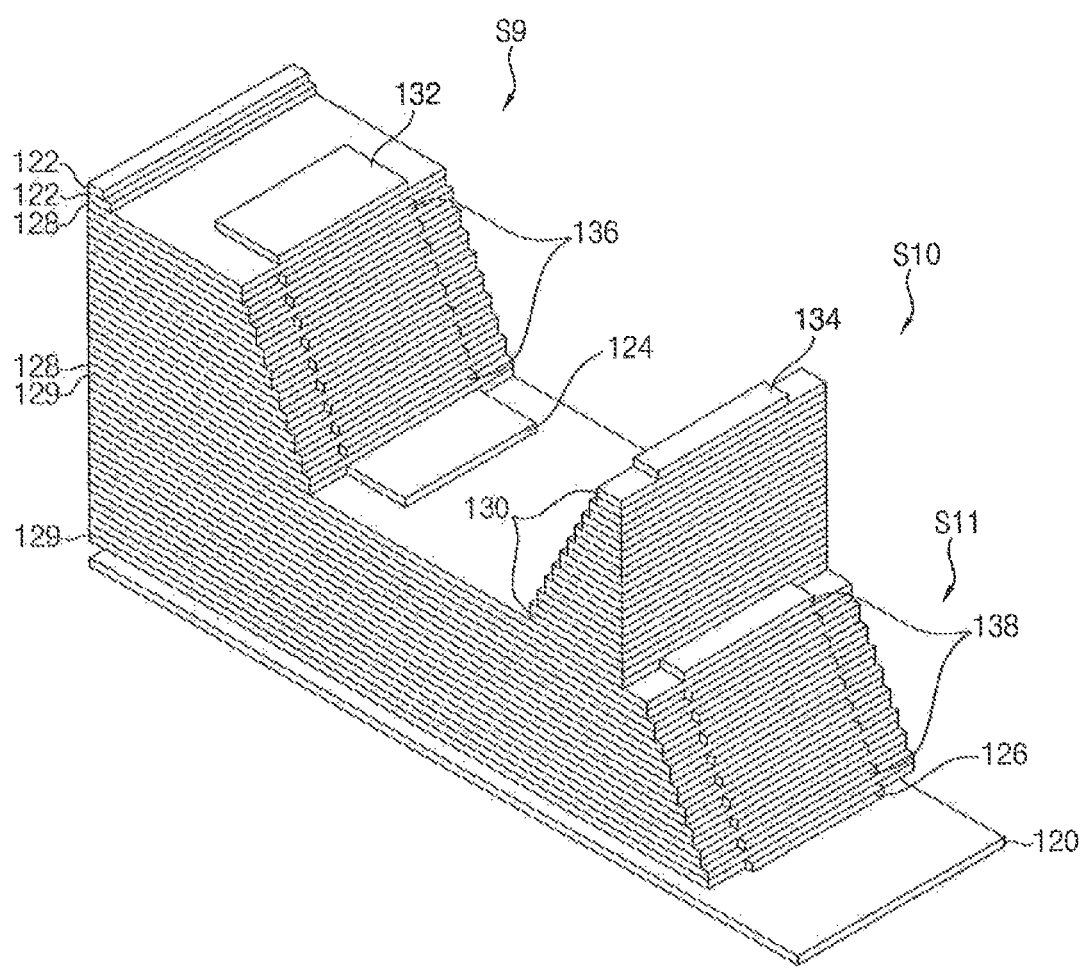
Figure 43:
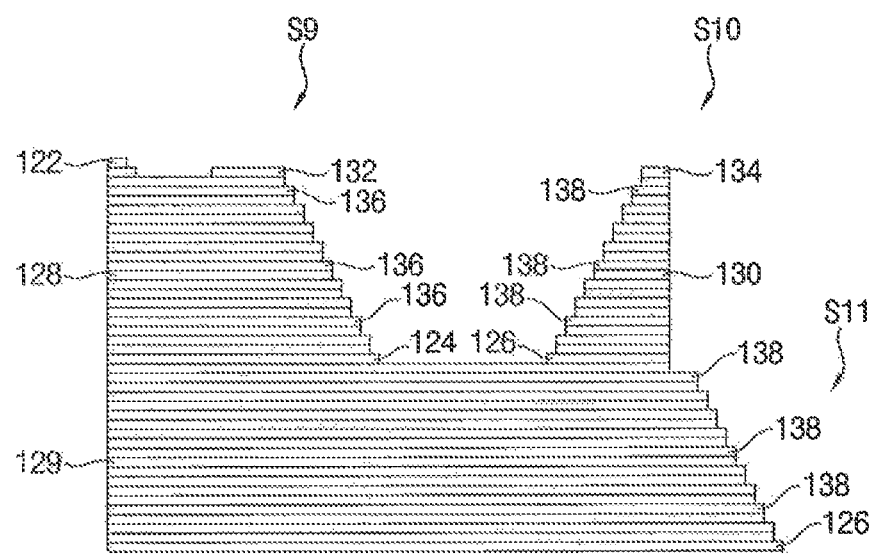
Figure 44:
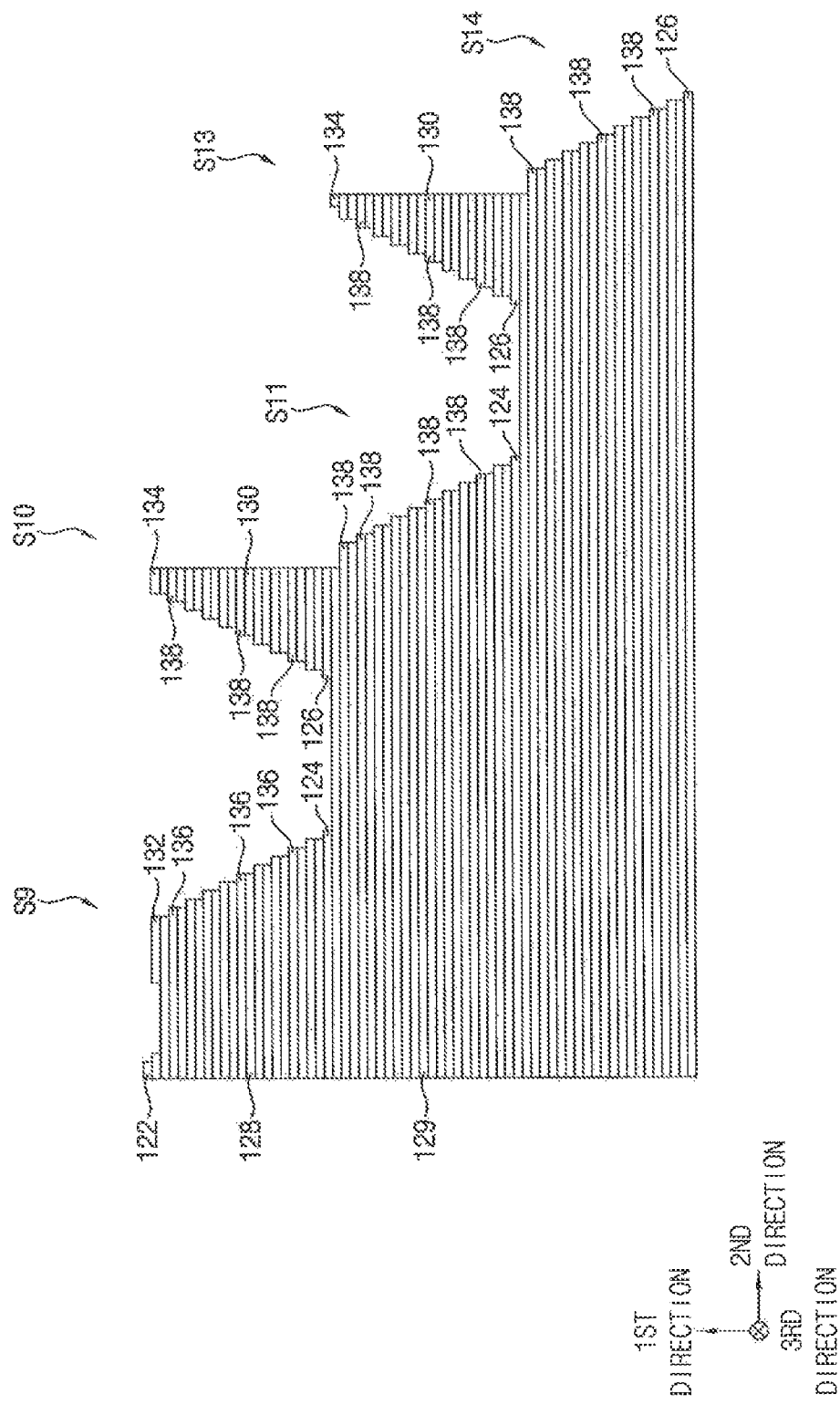

FIGS. 35 to 44 are cross-sectional views illustrating a method of manufacturing a vertical memory device in accordance with an exemplary embodiment of the present inventive concept. FIGS. 43 and 44 are cross-sectional views, and FIGS. 35 to 42 are perspective views. For example, FIGS. 43 and 44 are cross-sectional views illustrating vertical profiles of staircase structures in the region X of FIG. 1, and FIGS. 35 to 42 are perspective views of the region X of FIG. 1.

This method may include processes substantially the same as or similar to those illustrated with reference to FIGS. 1 to 34, and thus detailed descriptions thereon may be omitted herein.

Figure 35:
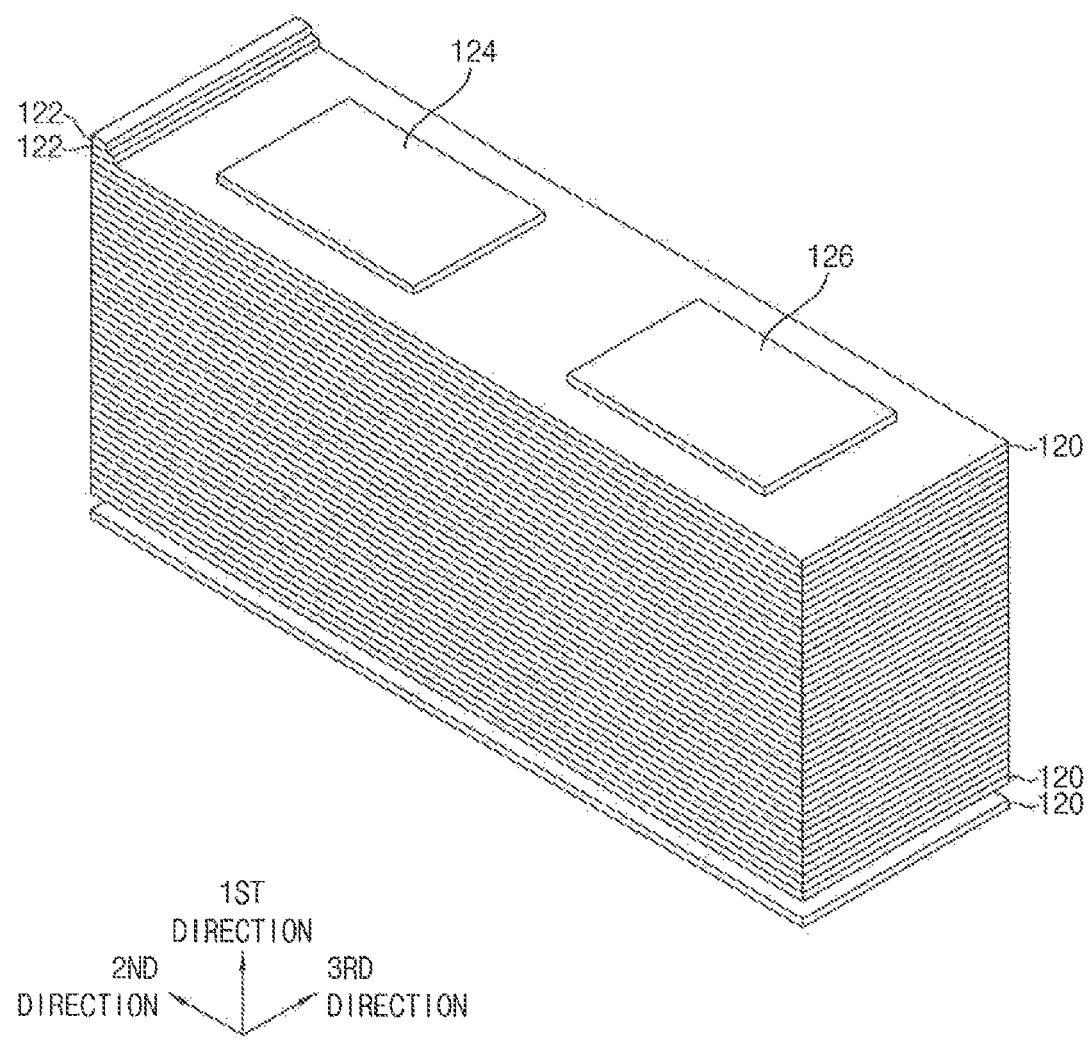
FIGS. 35 to 44 are cross-sectional views and perspective views illustrating a method of manufacturing a vertical memory device in accordance with an exemplary embodiment of the present inventive concept.

Referring to FIG. 35, processes substantially the same as or similar to those illustrated with reference to FIGS. 1 to 6 may be performed, and the second to fourth photoresist patterns 142, 144 and 146 may be removed. Thus, the first sacrificial patterns 122 may be formed at two levels, and each of the second and third sacrificial patterns 124 and 126 may be formed at one level.

Figure 36:
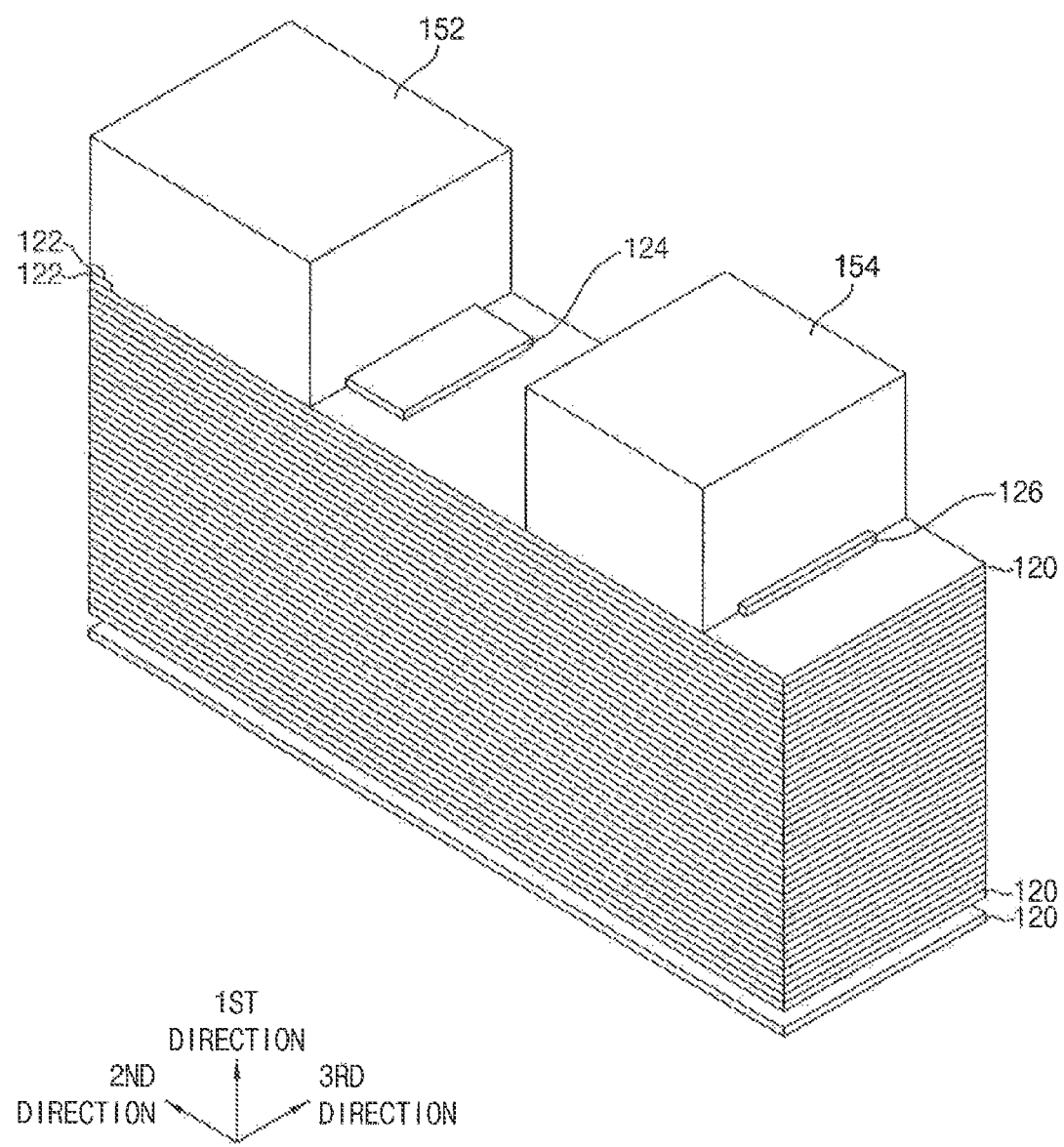

Referring to FIG. 36, processes substantially the same as or similar to those illustrated with reference to FIGS. 6 to 9 may be performed. For example, the first and second trimming processes might not be performed, and the fifth and sixth photoresist patterns 152 and 154 may be used.

Figure 37:
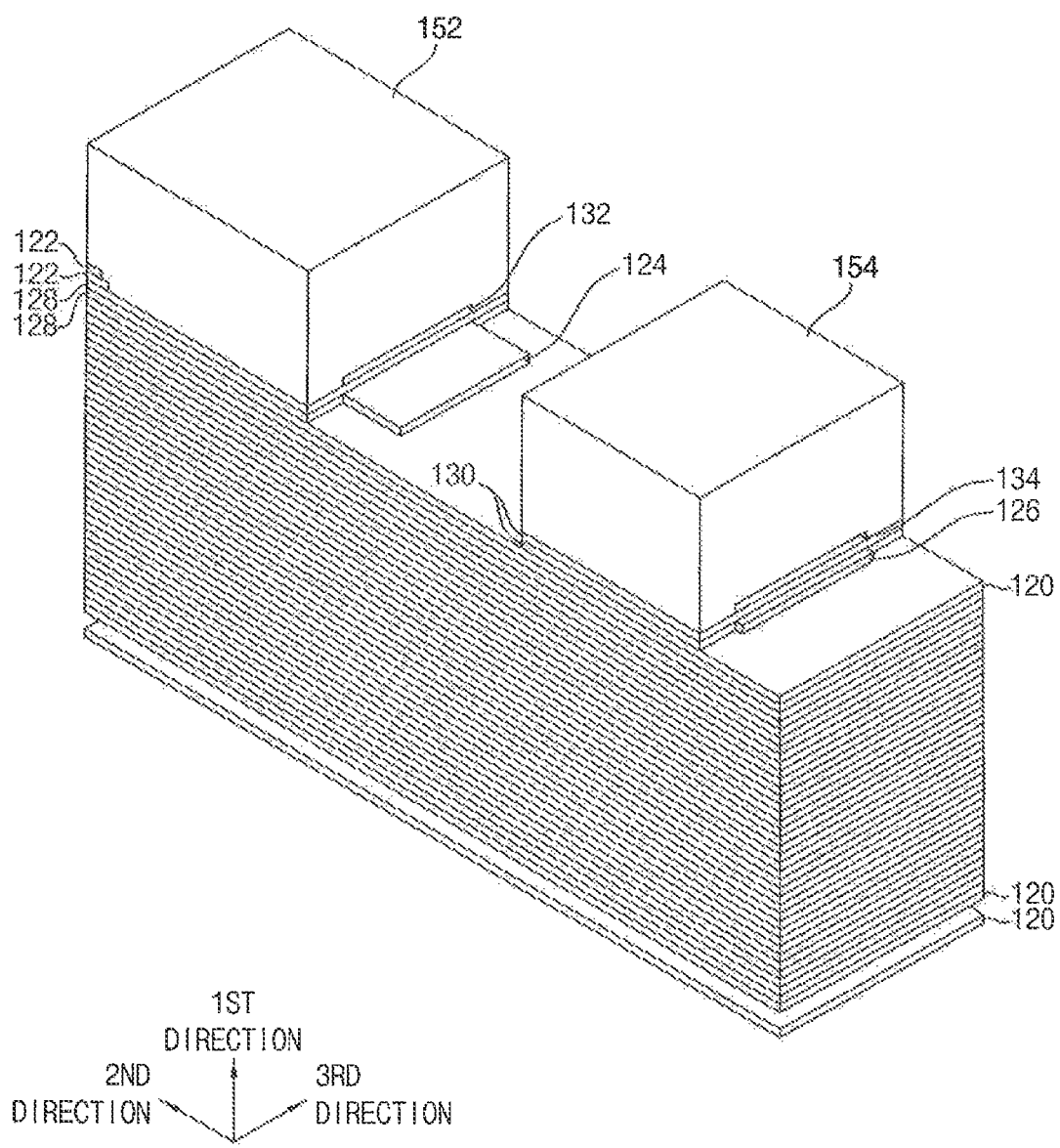

Referring to FIG. 37, processes substantially the same as or similar to those illustrated with reference to FIG. 10 may be performed.

In an exemplary embodiment of the present inventive concept, the etching process may be performed using the fifth and sixth photoresist patterns 152 and 154 as an etching mask, so that ones of the sacrificial layers 120 at levels of more than the number of the levels by one at which each of the second and third sacrificial patterns 124 and 126 is formed.

Thus, by the etching process, ones of the sacrificial layers 120 at two levels may be etched, and each of the second and third sacrificial patterns 124 and 126 is formed at one level. Additionally, each of the fourth and fifth sacrificial patterns 128 and 130 may be formed at two levels, and each of the sixth and seventh sacrificial patterns 132 and 134 may be formed at one level.

Figure 38:
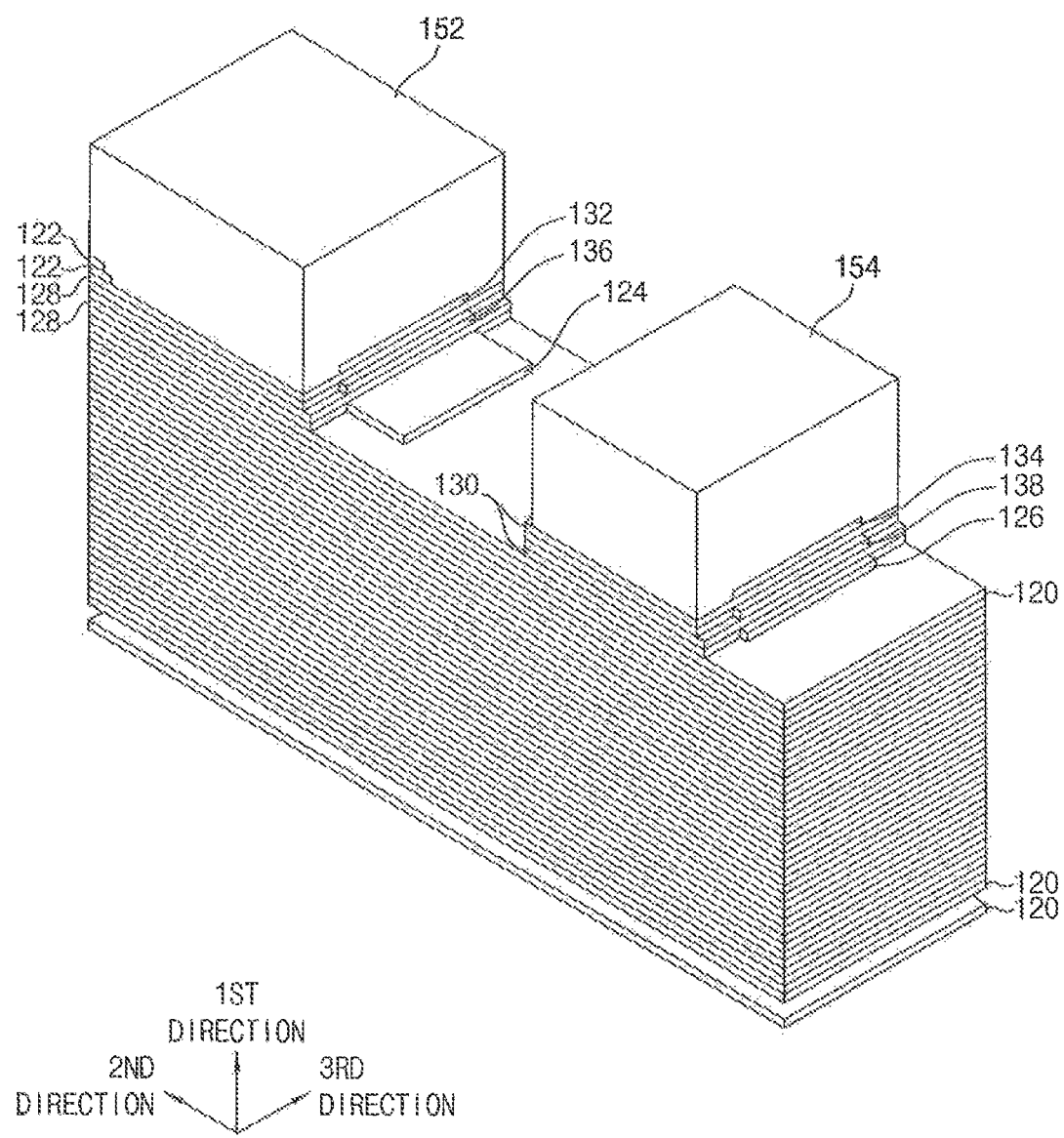

Referring to FIG. 38, processes substantially the same as or similar to those illustrated with reference to FIG. 11 may be performed. Each of the eighth and ninth sacrificial patterns 136 and 138 may be formed at one level.

Figure 39:
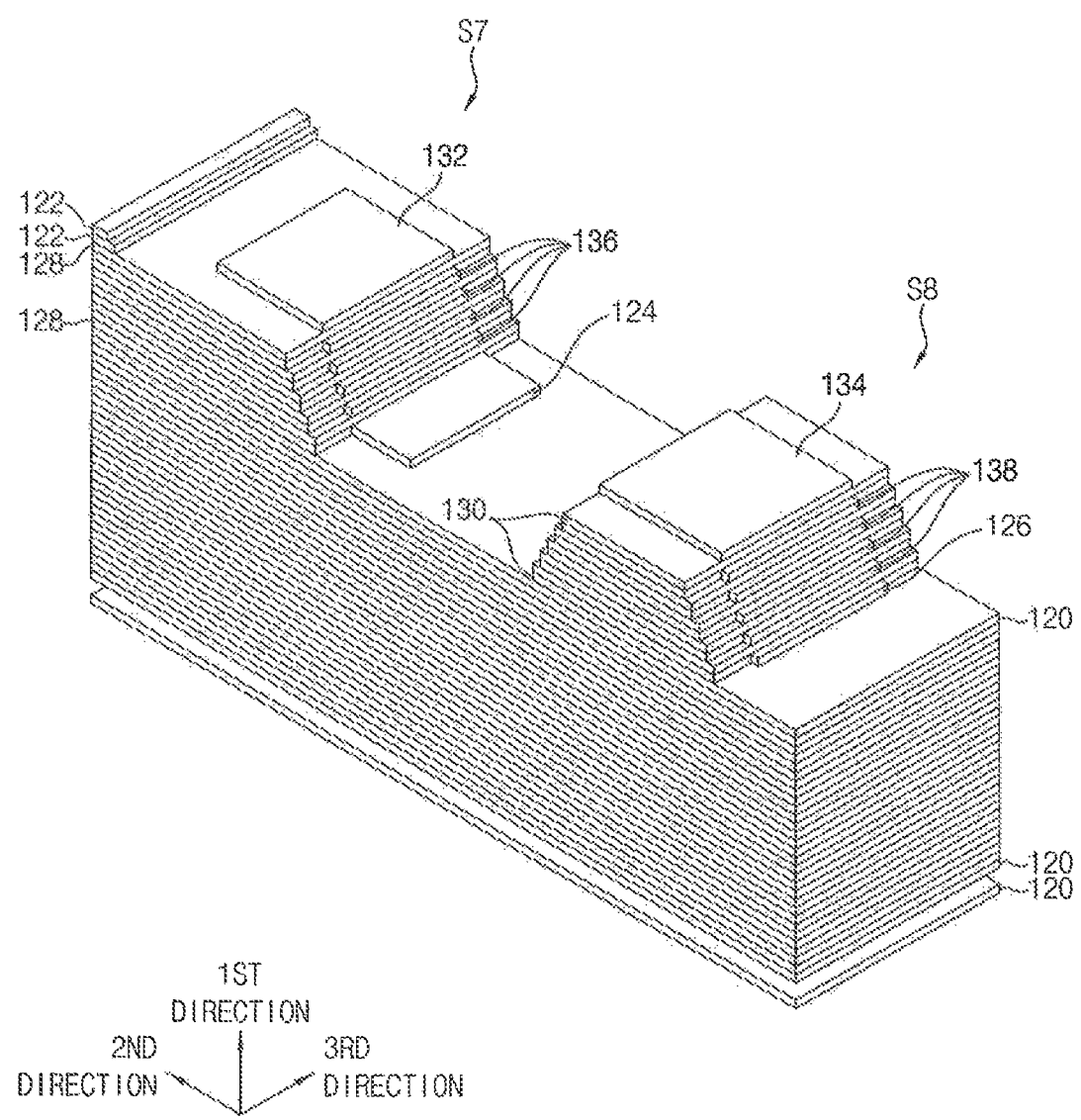

Referring to FIG. 39, processes substantially the same as or similar to those illustrated with reference to FIGS. 12 to 14 may be performed.

Thus, the first sacrificial patterns 122 may be stacked at the first and second levels, respectively, in a staircase shape in the second direction, the sixth sacrificial pattern 132 may be formed at the second level to be spaced apart from the first sacrificial patterns 122, the fourth sacrificial patterns 128 may be stacked from the third to twelfth levels, respectively in a staircase shape in the second direction, the eighth sacrificial patterns 136 may be stacked at the fourth, sixth, eighth and tenth levels, respectively, in a staircase shape, and the second sacrificial pattern 124 may be formed at the twelfth level. Hereinafter, the above stacked structures altogether may be referred to as a seventh staircase structure S7.

An eighth staircase structure S8 may be formed to be spaced apart from the seventh staircase structure S7 in the second direction. For example, in the eighth staircase structure S8, the seventh sacrificial pattern 134 may be formed at the second level, the fifth sacrificial patterns 130 may be stacked from the third to twelfth levels, respectively, in a staircase shape in the second direction, the ninth sacrificial patterns 138 may be stacked at the fourth, sixth, eighth and tenth levels, respectively, in a staircase shape, and the third sacrificial pattern 126 may be stacked at the twelfth level.

Figure 40:
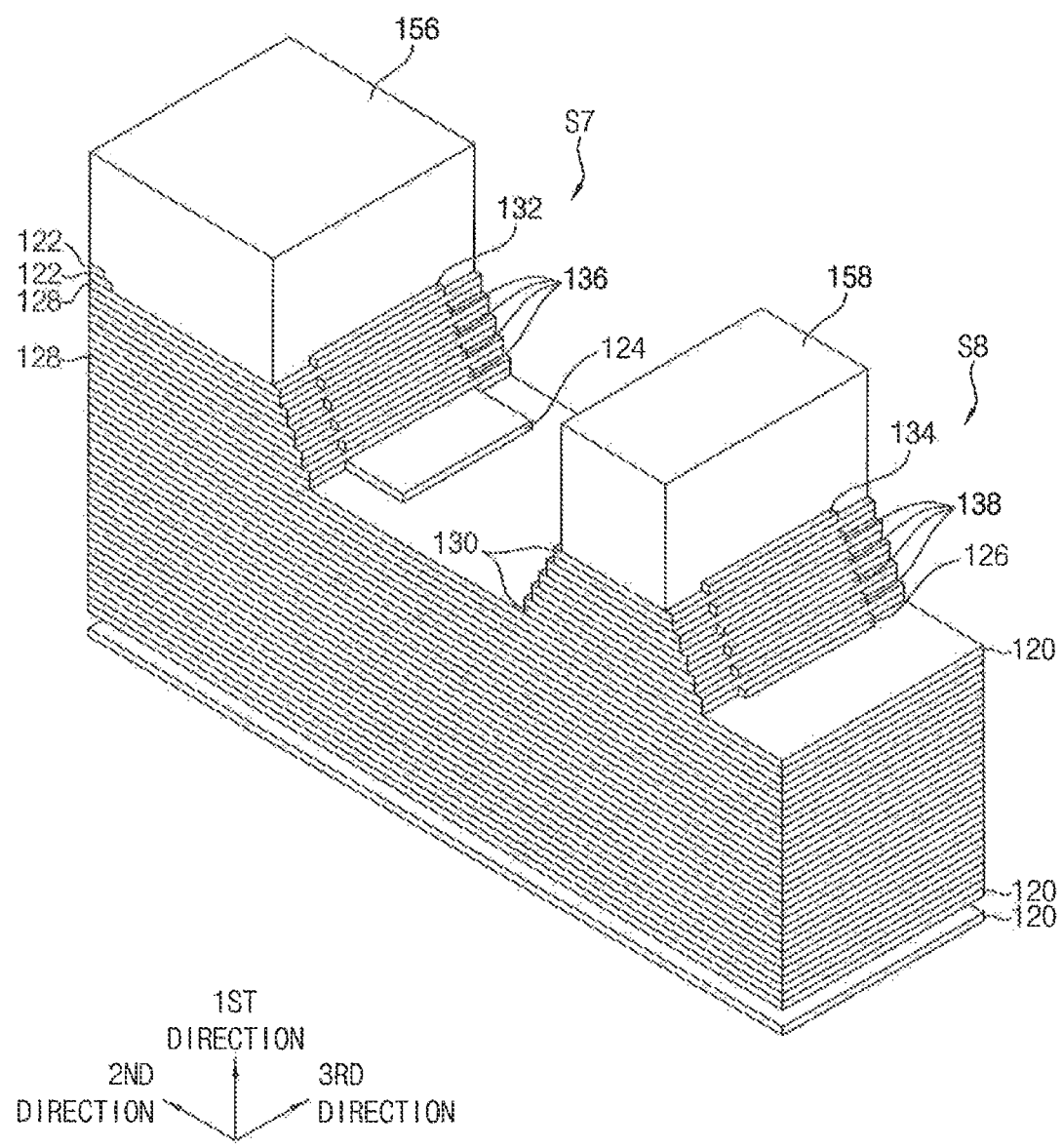

Referring to FIG. 40, processes substantially the same as or similar to those illustrated with reference to FIG. 36 may be performed.

Thus, a tenth photoresist pattern 156 covering a portion of the seventh staircase structure S7 adjacent the first region I of the substrate 600 and exposing a portion thereof distal from the first region I of the substrate 600, and an eleventh photoresist pattern 158 covering a central portion of the eighth staircase structure S8 in the second direction and exposing end portions thereof may be formed.

Referring to FIG. 41, processes substantially the same as or similar to those illustrated with reference to FIGS. 37 to 39 may be performed.

Thus, the first sacrificial patterns 122 may be formed at the first and second levels, respectively, in a staircase shape in the second direction, the sixth sacrificial pattern 132 may be formed at the second level to be spaced apart from the first sacrificial patterns 122, the fourth sacrificial patterns 128 may be stacked from the third to twenty-second levels, respectively, in a staircase shape in the second direction, the eighth sacrificial patterns 136 may be stacked at the fourth, sixth, eighth, tenth, twelfth, fourteenth, sixteenth, eighteenth and twentieth levels, respectively, in a staircase shape, and the second sacrificial pattern 124 may be formed at the twenty-second level. The above stacked structures altogether may be referred to as a ninth staircase structure S9.

Additionally, a tenth staircase structure S10 may be formed to be spaced apart from the ninth staircase structure S9 in the second direction. For example, in the tenth staircase structure S10, the seventh sacrificial pattern 134 may be formed at the second level, the fifth sacrificial patterns 130 may be stacked from the third to twenty-second levels, respectively, in the second direction, the ninth sacrificial patterns 138 may be formed at the fourth, sixth, eighth, tenth, twelfth, fourteenth, sixteenth, eighteenth and twentieth levels, respectively, in a staircase shape, and the third sacrificial pattern 126 may be formed at the twenty-second level.

Referring to FIG. 42, processes substantially the same as or similar to those illustrated with reference to FIGS. 15 to 17 may be performed, so that the ninth and tenth staircase structures S9 and S10 and an eleventh staircase structure S11 may be formed on the second region H of the substrate 600, which may form a second mold together with the sacrificial layers 120 remaining on the first region I of the substrate 600.

Thus, the sacrificial patterns in a portion of the tenth staircase structure S10 distant from the ninth staircase structure S9 may be moved to lower levels, respectively, to form the eleventh staircase structure S11. For example, the fifth sacrificial patterns 130 stacked from the third to twenty-second levels may be moved to from the twenty-third to forty-second levels, respectively, to be transformed into the tenth sacrificial patterns 129 stacked in a staircase shape in the second direction, the ninth sacrificial patterns 138 stacked at the fourth, sixth, eighth, tenth, twelfth, fourteenth, sixteenth, eighteenth and twentieth levels, respectively, may be moved to the twenty-fourth, twenty-sixth, twenty-eighth, thirtieth, thirty-second, thirty-fourth, thirty-sixth, thirty-eighth and fortieth levels, respectively, and the third sacrificial pattern 126 stacked at the twenty-second level may be moved to the forty-second level.

A portion of the tenth staircase structure S10 adjacent the ninth staircase structure S9 may remain at substantially the same levels, and a sidewall of the tenth staircase structure 10 distal from the ninth staircase structure S9 may not have a staircase shape but may be vertical instead.

FIG. 43 shows vertical profiles of the ninth to eleventh staircase structures S9, S10 and S11 included in the second mold in accordance with an exemplary embodiment of the present inventive concept.

Referring to FIG. 43, the third sacrificial patterns 126 and the ninth sacrificial patterns 138 may be stacked in a staircase shape at one sidewall of the tenth staircase structure S10, but may not exist at the other sidewall of the tenth staircase structure S10. As the fifth sacrificial patterns 130 has a vertical sidewall at the other sidewall of the second staircase structure S10, the other sidewall of the tenth staircase structure S10 may have a sidewall that is entirely vertical (e.g., not slanted). Accordingly, the tenth staircase structure S1.0 may have a relatively small width in the second direction.

The eleventh staircase structure S11 may include steps disposed in the second direction at lower levels than those of the tenth staircase structure S10.

In an exemplary embodiment of the present inventive concept, the sacrificial patterns in the ninth to eleventh staircase structures S9, S10 and S11 extending in the second direction from the first region I of the substrate 600, that is, the first, eighth, fourth and second sacrificial patterns 122, 136, 128 and 124 in the ninth staircase structure S9, and the ninth, fifth and third sacrificial patterns 138, 130 and 126 in the eleventh staircase structure S11 may be replaced with gate electrodes, and signals may be applied thereto by being connected to contact plugs.

The sacrificial patterns in the ninth to eleventh staircase structures S9, S10 and S11 not extending from the first region I of the substrate 600 in the second direction but being formed only on the second region II of the substrate 600, that is, the sixth sacrificial pattern 132 in the ninth staircase structure S9, and the seventh, ninth, third and fifth sacrificial patterns 134, 138, 126 and 130 in the tenth staircase structure S10 may be replaced with gate electrodes, but no signals may be applied thereto because no contact plugs may be connected thereto, which may serve as dummy gate electrodes.

FIG. 44 shows vertical profiles of the ninth, tenth, eleventh, thirteenth and fourteenth staircase structures S9, S10, S11, S13 and S14 included in the second mold in accordance with an exemplary embodiment of the present inventive concept.

The second mold may be formed by forming the ninth, tenth and twelfth staircase structures S9, S10 and S12 spaced apart from each other in the second direction as shown in FIG. 24, performing an etching process using a photoresist pattern as an etching mask covering the ninth staircase structure S9 and a portion of the tenth staircase structure S10 so as to transform a portion of the tenth staircase structure S10 into the eleventh staircase structure S11 and the twelfth staircase structure S12 into a thirteenth staircase structure S13, and performing an etching process using a photoresist pattern as an etching mask covering the ninth to eleventh staircase structures S9, S10 and S11 and a portion of the thirteenth staircase structure S13 so as to transform a portion of the thirteenth staircase structure S13 into a fourteenth staircase structure S14.

Thus, the thirteenth and fourteenth staircase structures S13 and S14 having vertical profiles substantially the same as or similar to those of the tenth and eleventh staircase structures S10 and S11, respectively, may be formed at lower levels. In addition, staircase structures staked at more levels than those of the staircase structures shown in FIG. 42 may be formed.

As illustrated above, each of the second and third sacrificial patterns 124 and 126 initially formed may be formed at less levels than those illustrated with reference to FIGS. 1 to 34, and in this case, the number of levels at which the sacrificial layers 120 are etched during the etching process using the fifth and sixth photoresist patterns 152 and 154 may be relatively small. However, the etching process using the eleventh and twelfth photoresist patterns 156 and 158 as an etching mask may be further performed so that staircase structures may be formed at levels of which the number may be similar to those of the staircase structures shown in FIG. 14, and finally, staircase structures may be formed at levels of which the number may be similar to those of the staircase structures shown in FIG. 16.

Figure 45:
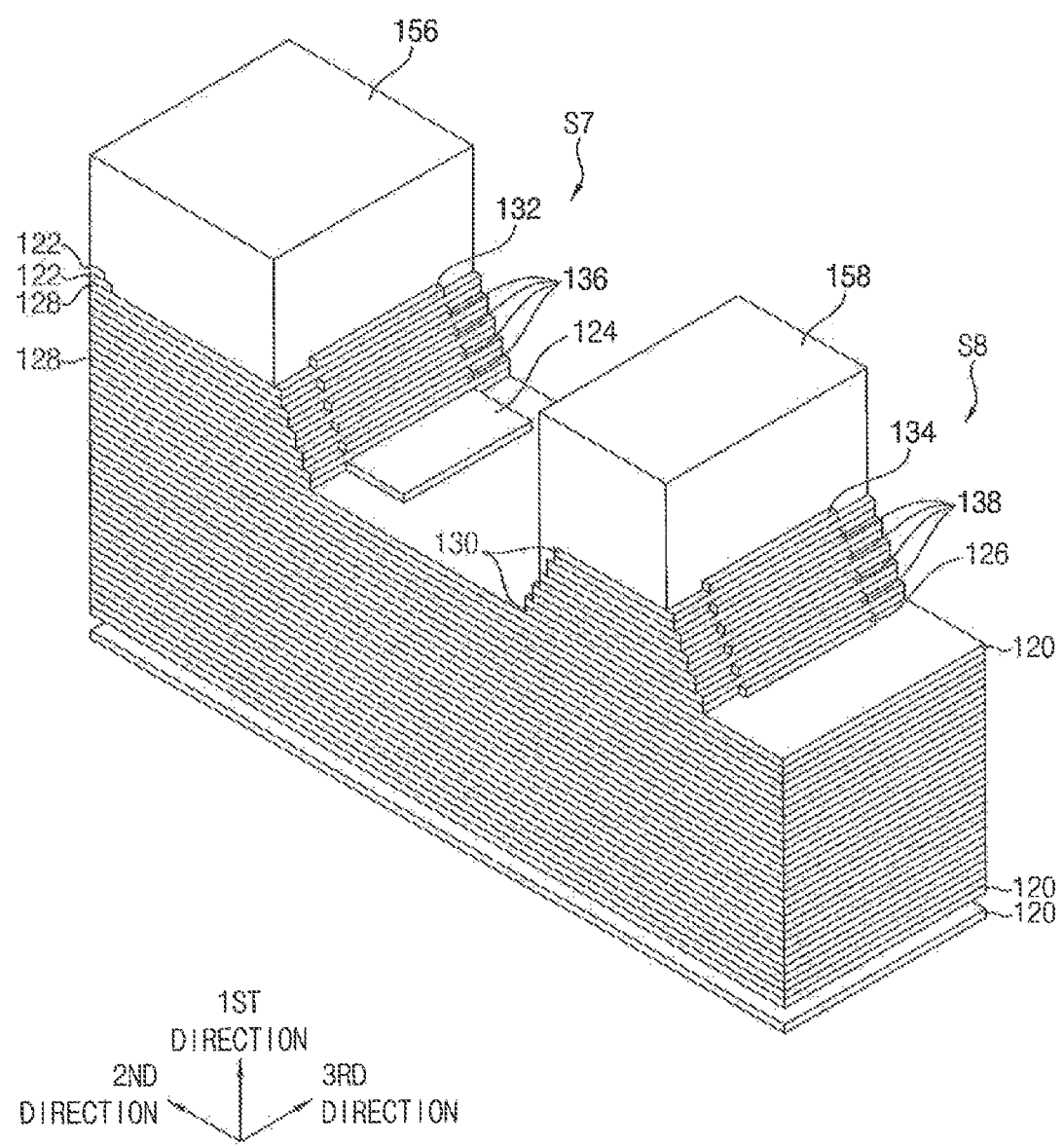
FIGS. 45 to 47 are perspective views illustrating a method of manufacturing a vertical memory device in accordance with an exemplary embodiment of the present inventive concept.
Figure 46:
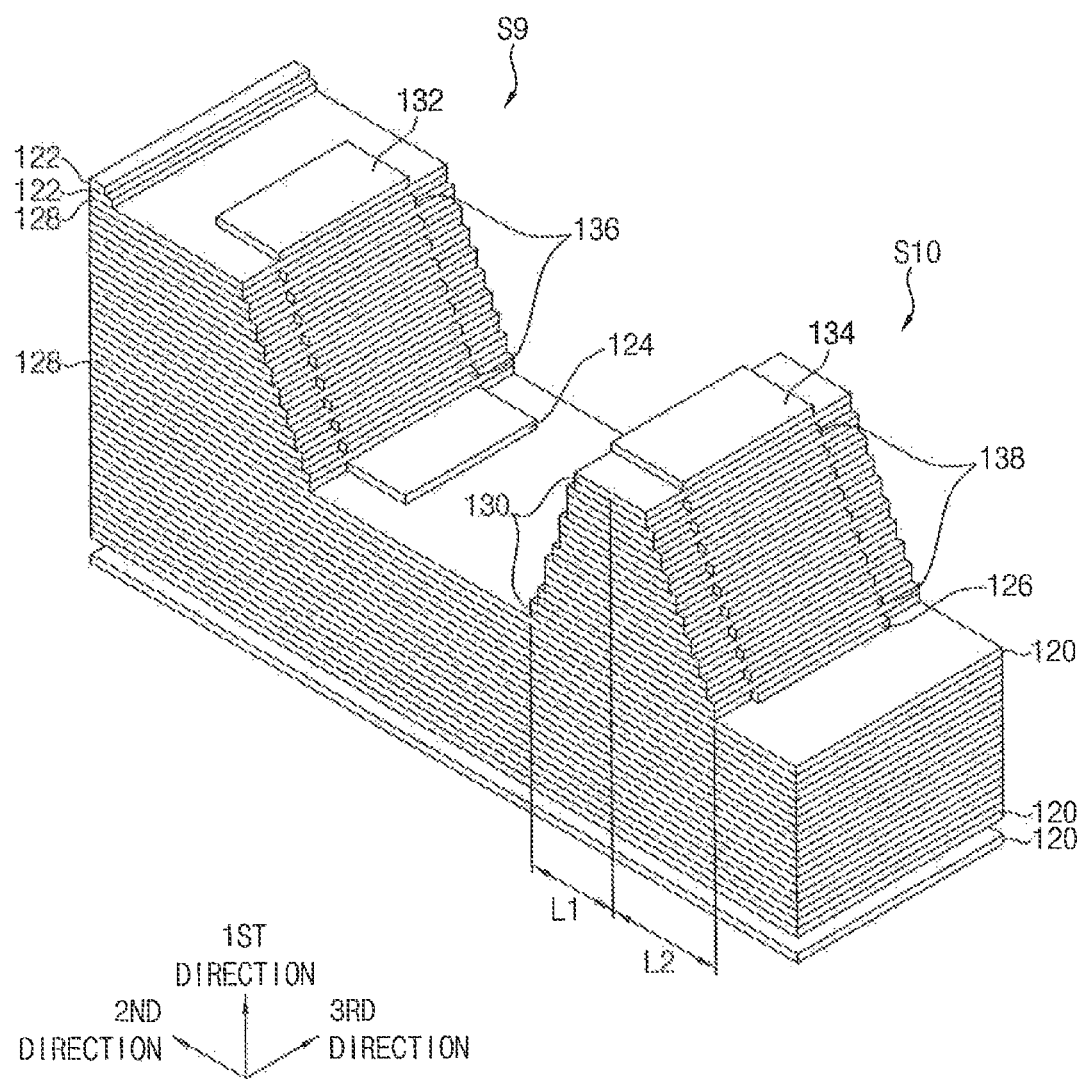
Figure 47:
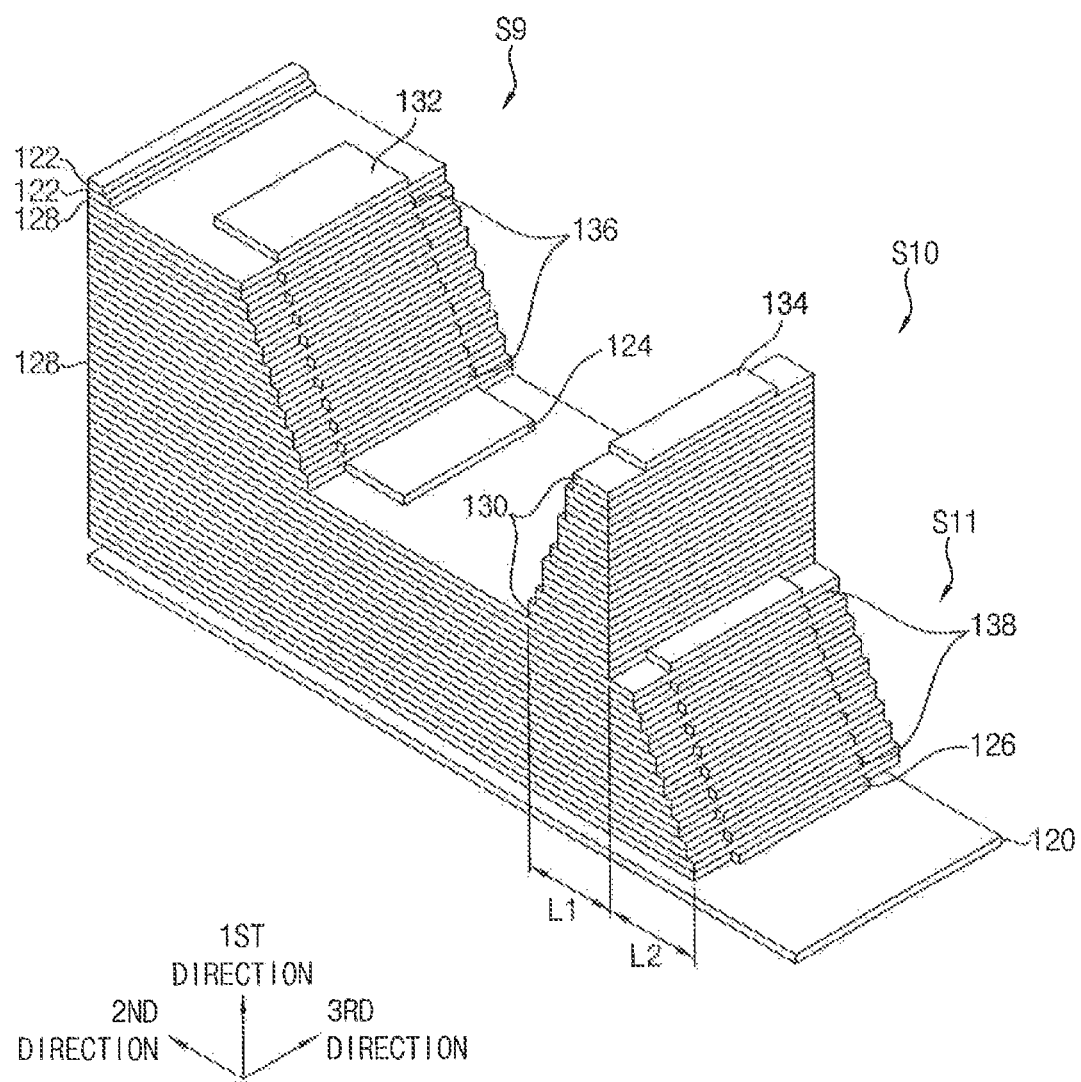

FIGS. 45 to 47 are perspective views illustrating a method of manufacturing a vertical memory device in accordance with an exemplary embodiment of the present inventive concept. This method may include processes substantially the same as or similar to those illustrated with reference to FIGS. 35 to 44, and thus detailed descriptions thereon may be omitted herein.

Referring to FIG. 45, processes substantially the same as or similar to those illustrated with reference to FIGS. 35 to 40 may be performed.

However, the eleventh photoresist pattern 158 might not expose opposite end portions of the eighth staircase structure S8 in the second direction. The eleventh photoresist pattern 158 may entirely expose an end portion of the eighth staircase structure S8 distal from the first region I of the substrate 600, but partially cover another end portion of the eighth staircase structure S8 adjacent the first region I of the substrate 600. Thus, some steps of the eighth staircase structure 88 may be covered by the eleventh photoresist pattern 158.

Referring to FIG. 45, processes substantially the same as or similar to those illustrated with reference to FIG. 41 may be performed.

The tenth staircase structure S10 might not be symmetrical with reference to a vertical plane between opposite end portions thereof in the second direction. For example, a portion of the fifth sacrificial patterns 130 close to the first region I of the substrate 600 stacked from the third to twenty-second levels may have a different staircase shape front that of a portion of the fifth sacrificial patterns 130 distal from the first region I of the substrate 600 stacked from the third to twenty-second levels. For example, a first maximum length L1 from a central portion to a sidewall adjacent to the first region I of the substrate 600 in the second direction (e.g., facing the first region I of the substrate 600) may be less than a second maximum length L2 from the central portion to a sidewall distal from the first region I of the substrate 600 (e.g., facing away from the first region I of the substrate 600).

Referring to FIG. 47, processes substantially the same as or similar to those illustrated with reference to FIG. 42 may be performed to complete the fabrication of the vertical memory device.

In the vertical memory device, the first maximum length L1 in the second direction of the tenth staircase structure S10 having no contact plug thereon may be less than the second maximum length L2 in the second direction of the eleventh staircase structure S11 having contact plugs thereon, and thus the vertical memory device may have an increased integration degree.

For example, to avoid the increase of the staircase structures serving as dummy gate electrodes, the sizes and locations of the photoresist patterns covering the staircase structures may be adjusted, and these features may be also applied to the method of manufacturing a vertical memory device illustrated with reference to FIGS. 1 to 34.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A vertical memory device, comprising:
a substrate including a cell array region and an extension region at least partially surrounding the cell array region;
a plurality of gate electrodes stacked on each other with a plurality of levels, wherein the levels are disposed in a first direction substantially perpendicular to an upper surface of the substrate, wherein each of the gate electrodes extend in a second direction substantially parallel to the upper surface of the substrate on the cell array region and the extension region of the substrate, wherein each of the plurality of gate electrodes includes a pad disposed at an end portion thereof in the second direction, wherein the pads of the gate electrodes form at least one staircase structure including steps disposed in the second direction on the extension region of the substrate, and wherein ones of the pads of the gate electrodes in the at least one staircase structure form a staircase structure including steps disposed in a third direction substantially parallel to the upper surface of the substrate and substantially perpendicular to the second direction;
a channel extending in the first direction on the cell array region of the substrate through at least one of the gate electrodes; and
dummy gate electrode groups disposed on the extension region of the substrate, wherein the dummy gate electrode groups include dummy gate electrodes, Wherein each of the dummy gate electrodes are spaced apart from a corresponding gate electrode among the plurality of gate electrodes stacked at a same level,
wherein the dummy gate electrode groups are spaced apart from each other in the second direction, and
wherein an uppermost surface of a first dummy gate electrode group among the dummy gate electrode groups is at a same height as that of an uppermost surface of a second dummy gate electrode group among the dummy gate electrode groups,
wherein a plurality of third gate electrodes of the plurality of gate electrodes form a third staircase structure, wherein an upper surface of the third staircase structure is concave.

2. The vertical memory device of claim 1, wherein each of the dummy gate electrode groups includes a plurality of dummy gate electrodes stacked in a plurality of levels in the first direction.

3. The vertical memory device of claim 2, wherein each of the dummy gate electrode groups has a first sidewall extending in the first direction substantially perpendicular to the upper surface of the substrate.

4. The vertical memory device of claim 3, wherein at least one of the dummy gate electrode groups has a second sidewall in the second direction having a staircase shape.

5. The vertical memory device of claim. 4, wherein the staircase shape of the second sidewall in the second direction of the at least one of the dummy gate electrode groups is symmetrical with a staircase shape of a first staircase structure formed by the pads of first gate electrodes of the plurality of gate electrodes with respect to a line extending between the staircase shape of the second sidewall and the first staircase structure in the third direction.

6. The vertical memory device of claim 5, wherein the pads of second gate electrodes are more distant from the cell array region of the substrate than at least one of the dummy gate electrode groups is distant therefrom, and a staircase shape of a second staircase structure formed by the pads of the second gate electrodes is substantially the same as the staircase shape of the first staircase structure formed by the pads of first the gate electrodes.

7. The vertical memory device of claim 2, wherein each of the dummy gate electrode groups has a sidewall extending in the first direction, wherein the sidewall is slanted with respect to the upper surface of the substrate.

8. The vertical memory device of claim 1, wherein ones of the dummy gate electrodes included in the first dummy gate electrode group among the dummy gate electrode groups are stacked at levels at the same as or higher than levels at which ones of the dummy gate electrodes included in the second dummy gate electrode group among the dummy gate electrode groups are stacked, wherein the second dummy gate electrode group is farther from the cell array region of the substrate than the first dummy gate electrode group.

9. The vertical memory device of claim 8, wherein the ones of the dummy gate electrodes included in the second dummy gate electrode group among the dummy gate electrode groups are stacked at levels at the same as or higher than levels at which ones of the dummy gate electrodes included in a third dummy gate electrode group among the dummy gate electrode groups are stacked, wherein the third dummy gate electrode group are farther from the cell array region of the substrate than the second dummy gate electrode group.

10. The vertical memory device of claim 1, wherein ones of the dummy gate electrodes are stacked in a staircase shape in the third direction.

11. The vertical memory device of claim 1, wherein ones of the dummy gate electrodes are stacked in a staircase shape in the second direction.

12. The vertical memory device of claim 1, further comprising contact plugs each extending in the first direction, wherein the contact plugs contact the pads of corresponding gate electrodes and apply signals thereto.

13. The vertical memory device of claim 12, wherein no contact plug is connected to the dummy gate electrodes.

14. A vertical memory device, comprising:
a substrate including a cell array region and an extension region at least partially surrounding the cell array region;
a plurality of gate electrodes stacked on each other with a plurality of levels, Wherein the levels are disposed in a first direction substantially perpendicular to an upper surface of the substrate, wherein each of the gate electrodes extend in a second direction substantially parallel to the upper surface of the substrate on the cell array region and the extension region of the substrate, wherein each of the plurality of gate electrodes includes a pad disposed at an end portion thereof in the second direction, the pads of the gate electrodes form at least one staircase shape in which steps are disposed in the second direction on the extension region of the substrate, and wherein ones of the pads of the gate electrodes in the at least one staircase shape form a staircase shape in which steps are disposed in a third direction substantially parallel to the upper surface of the substrate and substantially perpendicular to the second direction;
a channel extending in the first direction on the cell array region of the substrate through at least one of the gate electrodes; and
a plurality of dummy gate electrodes disposed on the extension region of the substrate, wherein the dummy gate electrodes are spaced apart from corresponding first gate electrodes of the plurality of gate electrodes, respectively, stacked at the same level, and wherein the dummy gate electrodes are stacked to form a staircase shape symmetrical with a staircase shape formed by the pads of the first gate electrodes corresponding to the dummy gate electrodes with respect to a line extending between both staircase shapes and in the third direction; and
a dummy gate electrode group including first dummy gate electrodes of the plurality of dummy gate electrodes, wherein the dummy gate electrode group has first and second sidewalls, wherein the first sidewall has a staircase shape, and the second sidewall is slanted at a predetermined angle with respect to the upper surface of the substrate.

15. The vertical memory device of claim 14,
wherein the second sidewall is more distant from the cell array region of the substrate than the first sidewall.

16. The vertical memory device of claim 15, wherein second gate electrodes of the plurality of gate electrodes are more distant from the cell array region of the substrate than the dummy gate electrode group, and have the pads having a staircase shape substantially the same as the staircase shape formed by the pads of the first gate electrodes.

17. The vertical memory device of claim 15, wherein the dummy gate electrode group is a first dummy gate electrode group, and wherein the vertical memory device further includes a second dummy gate electrode group spaced apart from the first dummy gate electrode group, wherein sidewalls of the second dummy gate electrode group have shapes substantially the same as those of the sidewalls of the first dummy gate electrode group.

18. The vertical memory device of claim 17, wherein the second dummy gate electrode group is farther from the cell array region of the substrate than the first dummy gate electrode group, and
wherein the first dummy electrodes included in the first dummy gate electrode group are stacked at levels at the same as or higher than levels at which second dummy gate electrodes, of the plurality of dummy gate electrodes, included in the second dummy gate electrode group are stacked.

19. The vertical memory device of claim 18, further comprising a third dummy gate electrode group farther from the cell array region of the substrate than the second dummy gate electrode group,
wherein third dummy gate electrodes, of the plurality of dummy gate electrodes, included in the third dummy gate electrode group are stacked at levels at the same as or lower than levels at which the second dummy gate electrodes included in the second dummy gate electrode group are stacked.

20. A vertical memory device, comprising:
a substrate including a first region and a second region at least partially surrounding the first region;
a plurality of gate electrodes stacked on each other with a plurality of levels, wherein the levels are disposed in a first direction substantially perpendicular to an upper surface of the substrate, wherein each of the plurality of gate electrodes extend in a second direction substantially parallel to the upper surface of the substrate on the first region and the second region of the substrate, wherein each of the plurality of gate electrodes includes a pad disposed at an end portion thereof in the second direction, the pads of the plurality of gate electrodes form at least one staircase shape in which steps are disposed in the second direction on the second region of the substrate, and wherein ones of the pads of the plurality of the gate electrodes in the at least one staircase structure form a staircase shape in which steps are disposed in a third direction substantially parallel to the upper surface of the substrate and substantially perpendicular to the second direction;
a channel extending in the first direction on the first region of the substrate through at least one of the gate electrodes;
a plurality of dummy gate electrode groups disposed on the second region of the substrate, wherein the dummy gate electrode groups include dummy gate electrodes, wherein each dummy gate electrode is spaced apart from a corresponding gate electrode, among the plurality of gate electrodes, stacked at the same level, wherein an uppermost surface of a first dummy gate electrode group among the dummy gate electrode groups is at a same height as that of an uppermost surface of a second dummy gate electrode group among the dummy gate electrode groups; and
contact plugs contacting upper portions of the plurality of gate electrodes, respectively,
wherein no contact plug contacts an upper portion of any of the dummy gate electrodes,
wherein a plurality of first gate electrodes of the plurality of gate electrodes form a first staircase structure, wherein an upper surface of the first staircase structure is concave.

* * * * *